United States Patent
Inoue et al.

(10) Patent No.: US 9,756,761 B2
(45) Date of Patent: Sep. 5, 2017

(54) ELECTRONIC APPARATUS

(75) Inventors: Yukito Inoue, Tokyo (JP); Kensuke Ikeda, Tokyo (JP); Daisuke Kanda, Tokyo (JP); Yasuhiro Ootori, Kanagawa (JP)

(73) Assignees: SONY CORPORATION, Tokyo (JP); SONY INTERACTIVE ENTERTAINMENT INC., Tokyo (JP)

( * ) Notice: Subject to any disclaimer, the term of this patent is extended or adjusted under 35 U.S.C. 154(b) by 555 days.

(21) Appl. No.: 14/111,264

(22) PCT Filed: Apr. 18, 2012

(86) PCT No.: PCT/JP2012/060511
§ 371 (c)(1),
(2), (4) Date: Oct. 11, 2013

(87) PCT Pub. No.: WO2012/144538
PCT Pub. Date: Oct. 26, 2012

(65) Prior Publication Data
US 2014/0036440 A1    Feb. 6, 2014

(30) Foreign Application Priority Data

Apr. 18, 2011 (JP) .................... 2011-092541
May 19, 2011 (JP) .................... 2011-112905
Apr. 13, 2012 (JP) .................... 2012-092508

(51) Int. Cl.
*H05K 7/20* (2006.01)
*H01L 23/467* (2006.01)
*H01L 23/367* (2006.01)

(52) U.S. Cl.
CPC ..... *H05K 7/20172* (2013.01); *H01L 23/3672* (2013.01); *H01L 23/467* (2013.01); *H05K 7/20154* (2013.01); *H01L 2924/0002* (2013.01)

(58) Field of Classification Search
CPC ............ H05K 7/20172; H05K 7/20154; H02L 23/3672; H01L 23/467; H01L 2924/0002
(Continued)

(56) References Cited

U.S. PATENT DOCUMENTS 6,125,924 A   10/2000 Lin
6,466,441 B1  10/2002 Suzuki
(Continued)

FOREIGN PATENT DOCUMENTS

CN    2735727    10/2005
CN    1735330    2/2006
(Continued)

OTHER PUBLICATIONS

Japanese Notification for Reasons for Refusal dated Feb. 3, 2015 from corresponding Application No. 2011-112905.
(Continued)

*Primary Examiner* — Jayprakash N Gandhi
*Assistant Examiner* — Stephen Sul
(74) *Attorney, Agent, or Firm* — Katten Muchin Rosenman LLP

(57) ABSTRACT

Provided is an electronic apparatus including a cooling fan and a cover configuring an outer wall of an air flow path and having a heat sink arranged therein, and effectively utilizing a frame as a member for heat radiation.
A cooling fan 40 is arranged on the opposite side of a circuit board across an upper frame 20 and attached to the upper frame 20. The electronic apparatus includes a cover having a shape for covering the air flow path and defining a wall of the air flow path together with the upper frame 20. Heat sinks 61 and 62 are arranged on the inner side of the cover 50.

17 Claims, 23 Drawing Sheets

(58) Field of Classification Search
USPC .......................................... 361/649.46, 697
See application file for complete search history.

(56) References Cited

U.S. PATENT DOCUMENTS

| | | | | |
|---|---|---|---|---|
| 6,702,000 | B2* | 3/2004 | Miyahara | G06F 1/20 165/121 |
| 7,864,525 | B2* | 1/2011 | Chen | G06F 1/203 361/695 |
| 2001/0036416 | A1* | 11/2001 | Obara | F04D 25/08 417/423.1 |
| 2008/0074839 | A1* | 3/2008 | Tamaki | G06F 1/20 361/679.46 |
| 2008/0226446 | A1* | 9/2008 | Fujieda | F04D 25/0613 415/203 |
| 2009/0086430 | A1* | 4/2009 | Kang | G02F 1/133385 361/695 |
| 2009/0290307 | A1* | 11/2009 | Hwang | F04D 17/16 361/695 |
| 2010/0254085 | A1* | 10/2010 | Hasegawa | H05K 7/20136 361/695 |
| 2010/0254086 | A1* | 10/2010 | Ikeda | H05K 7/20145 361/697 |
| 2010/0271774 | A1* | 10/2010 | Peng | H01L 23/427 361/679.52 |
| 2011/0063802 | A1 | 3/2011 | Chen et al. | |
| 2012/0014781 | A1* | 1/2012 | Sun | H05K 7/20172 415/121.3 |

FOREIGN PATENT DOCUMENTS

| | | |
|---|---|---|
| CN | 201138495 | 10/2008 |
| CN | 201418229 | 3/2010 |
| CN | 101861084 | 10/2010 |
| JP | 60-68655 | 5/1985 |
| JP | 02-047895 | 2/1990 |
| JP | 2-101550 | 8/1990 |
| JP | 7-27159 | 5/1995 |
| JP | 2001-057489 | 2/2001 |
| JP | 2001-110958 | 4/2001 |
| JP | 2001-274299 | 10/2001 |
| JP | 2002-054599 | 2/2002 |
| JP | 2003-249611 | 9/2003 |
| JP | 2004-47835 A | 2/2004 |
| JP | 2004-111727 | 4/2004 |
| JP | 2005-337076 | 12/2005 |
| JP | 2005-337118 | 12/2005 |
| JP | 2007-077436 | 3/2007 |
| JP | 2007-113399 | 5/2007 |
| JP | 2008-077434 | 4/2008 |
| JP | 2008-077435 | 4/2008 |
| JP | 2008-077436 | 4/2008 |
| JP | 2008-118077 | 5/2008 |
| JP | 2008-187120 | 8/2008 |
| JP | 2009-021284 | 1/2009 |
| JP | 2009-123770 | 6/2009 |
| JP | 2010-91715 A | 4/2010 |
| JP | 2010-216294 | 9/2010 |
| JP | 2010-245201 | 10/2010 |
| JP | 2011-155056 | 8/2011 |

OTHER PUBLICATIONS

International Search Report dated Jun. 12, 2012 from the corresponding PCT/JP2012/060511.
Office Action dated Jan. 8, 2013 from corresponding Japanese Application No. 2011-092540 and partial English translation.
Office Action dated Dec. 11, 2012 from corresponding Japanese Application No. 2011-092542 and partial English translation.
Office Action dated Dec. 11, 2012 from corresponding Japanese Application No. 2011-092543 and partial English translation.
Chinese First Office Action dated May 26, 2015 from corresponding Application No. 201280026361.2.
European Search Report dated Jul. 10, 2015 from corresponding Application No. 12774149.4.
Japanese Office Action dated Jan. 26, 2016, from from the corresponding Japanese Application No. 2012-092508.
Japanese Notification of Reasons for Refusal dated Jan. 6, 2015 from corresponding Application No. 2011-092541.
International Preliminary Report on Patentability and Written Opinion of the International Searching Authority dated Oct. 31, 2013, from corresponding International Application No. PCT/JP2012/060511.
Communication pursuant to Article 94(3) EPC, dated Nov. 15, 2016, from the corresponding EP Application No. 12 774 149.4-1803.

* cited by examiner

ELECTRONIC APPARATUS

TECHNICAL FIELD

The present invention relates to a cooling structure for an electronic apparatus.

BACKGROUND ART

Conventionally, electronic apparatuses including a cooling fan for cooling electronic parts on a circuit board is used. In the electronic apparatus described in US Patent Application Publication No. 2010/0254086, a cooling fan is arranged such that the rotation axis thereof is perpendicular to a circuit board. The electronic apparatus described in the patent document includes a cover covering an air flow path formed in the outer circumference of the cooling fan. A heat sink thermally connected to electronic parts is arranged inside the cover.

SUMMARY OF INVENTION

The electronic apparatus described in the patent document includes a plate-like frame to which the circuit board is attached and an plate besides the frame. The cover and the cooling fan are arranged on the plate and fixed on the plate. The plate is attached to the frame, whereby the positions of the cooling fan and the cover are fixed in the electronic apparatus. In such structure, it often occurs that heat transfer is not sufficiently performed between the frame and the plate. In that case, since heat transferred from the heat sink to the plate less easily diffuses through the frame, the frame is not effectively used as a member for heat radiation.

The frame has various devices (e.g., a hard disk drive) fixed thereon provided to the electronic apparatus. When the cooling fan rotates, it is undesirable that vibration of the cooling fan is transmitted to the devices such as the hard disk drive through the frame.

An electronic apparatus according to the present invention includes a circuit board, a frame, a cooling fan, a cover, and a heat sink. The frame is formed by a plate having a size corresponding to the circuit board or a size larger than the size corresponding the circuit board. The frame covers the circuit board. The circuit board is fixed to the frame. The cooling fan is located on the opposite side of the circuit board across the frame and attached to the frame. The electronic apparatus includes an air flow path on the frame through which the air discharged from the cooling fan passes. The cover has a shape for covering the air flow path and defines a wall of the air flow path together with the frame. The heat sink is arranged inside the cover. With such an electronic apparatus, heat transferred from the heat sink to the frame is transferred to the outer side of the cover as well through the frame. Therefore, it is possible to effectively use the frame as a member for heat radiation.

An electronic apparatus according to the present invention includes a circuit board, a frame covering the circuit board and attached to the circuit board, a cooling fan arranged on the frame, including a bottom portion attached to the frame and having a rotation axis along the thickness direction of the circuit board, and a projection projecting from one of the bottom portion of the cooling fan and the frame toward the other to secure a clearance between the bottom portion of the cooling fan and the frame. With such an electronic apparatus, it is possible to reduce a contact area between the cooling fan and the frame. Therefore, it is possible to suppress the vibration of the cooling fan from being transmitted to other devices or parts on the frame.

DESCRIPTION OF EMBODIMENTS

Figure 1:
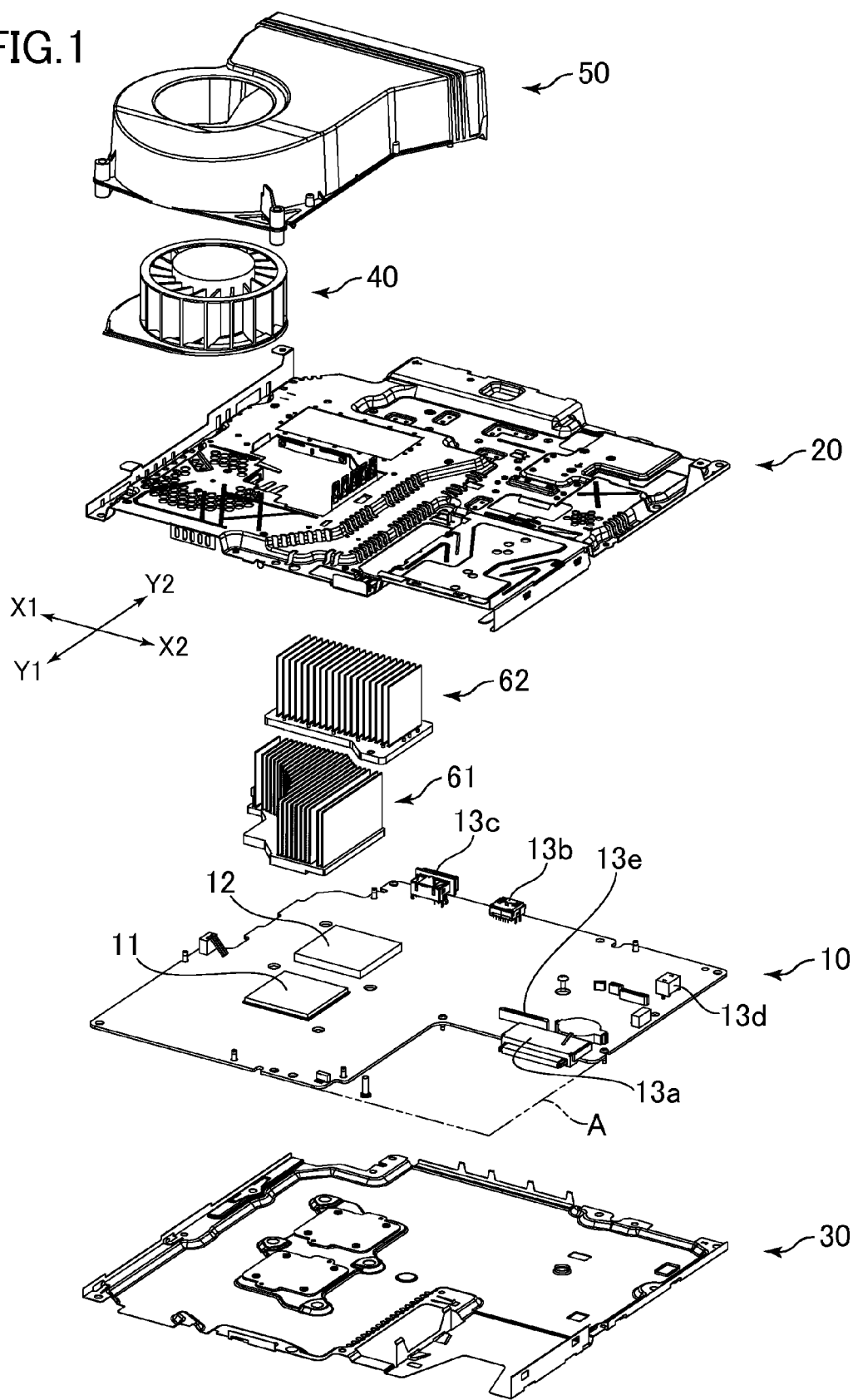
FIG. 1 an exploded perspective view of parts incorporated in an electronic apparatus according to an embodiment of the invention.
Figure 2:
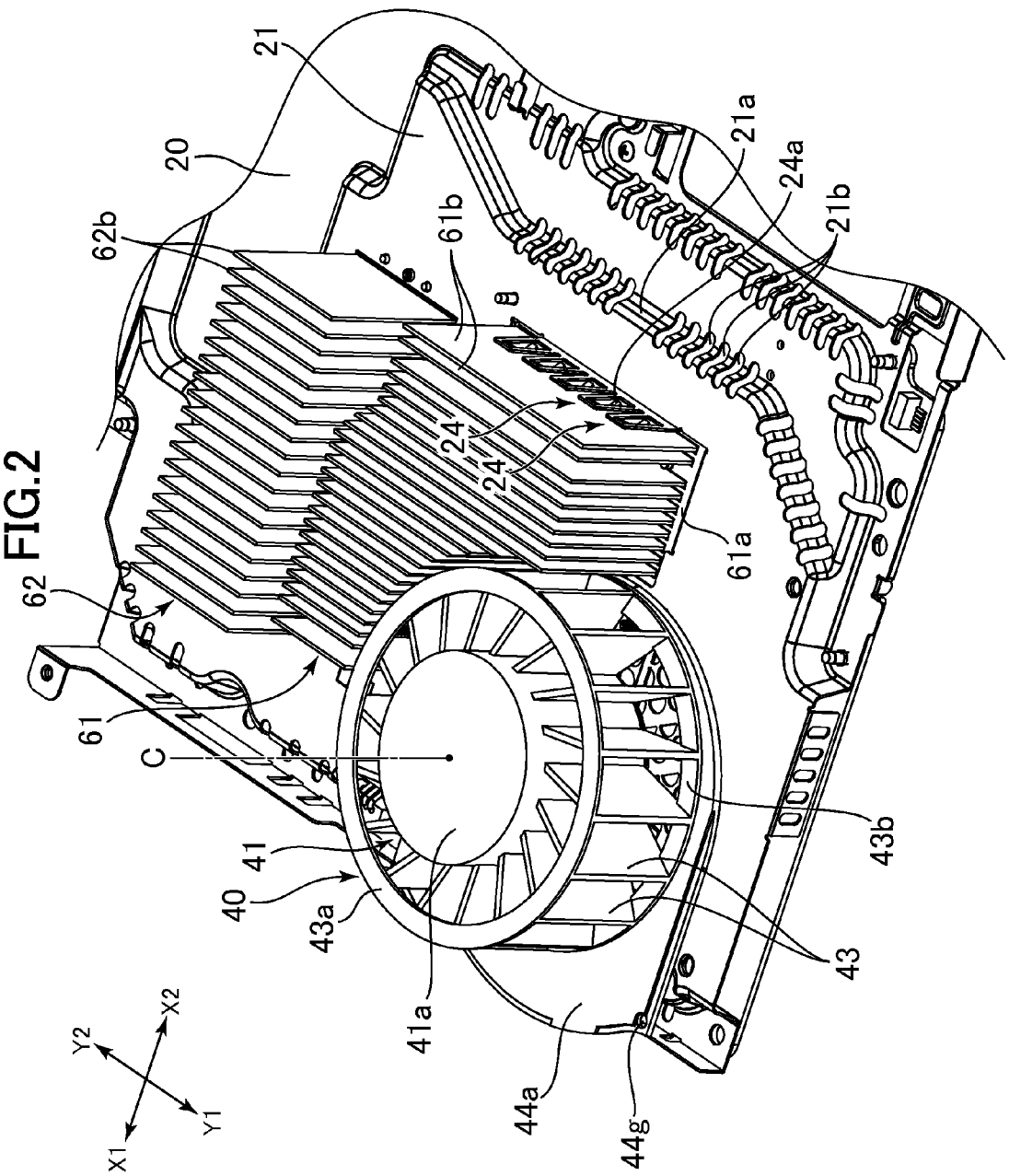
FIG. 2 a perspective view illustrating a state in which the parts illustrated in FIG. 1 other than a cover are combined with one another.
Figure 3:
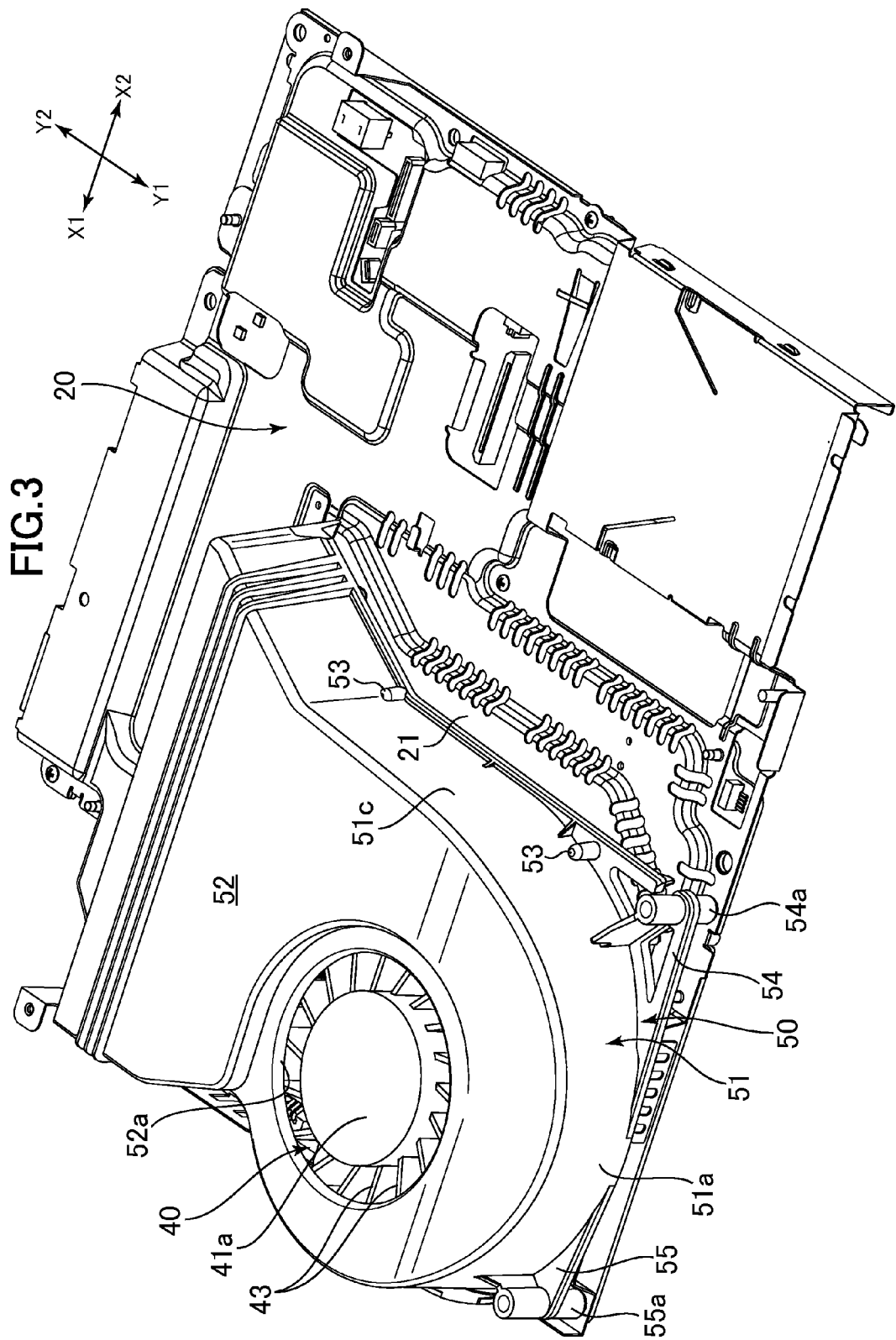
FIG. 3 a perspective view illustrating a state in which the parts illustrated in FIG. 1 are combined with one another.
Figure 4:
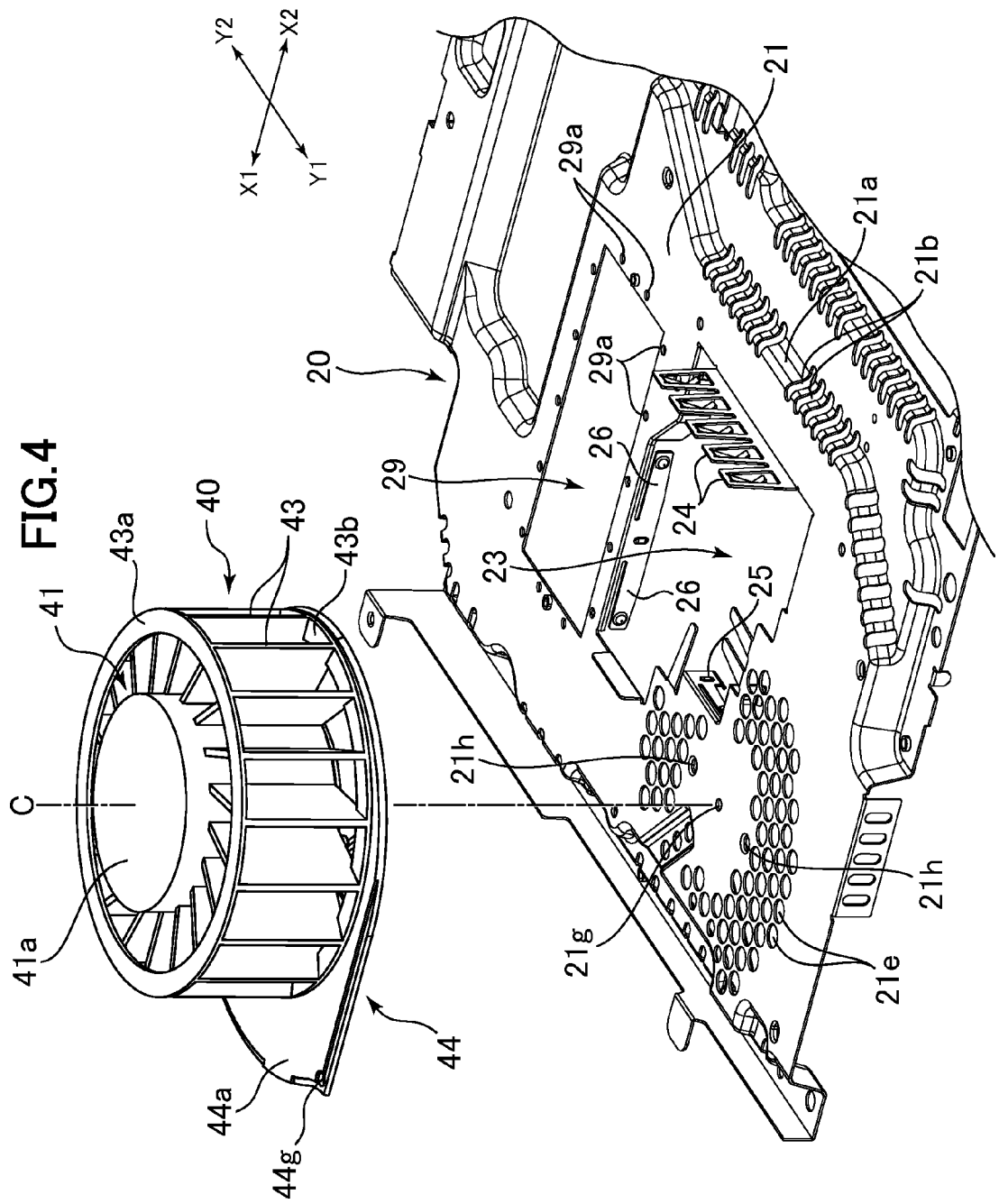
FIG. 4 a perspective view of an upper frame and a cooling fan included in the electronic apparatus.
Figure 5:
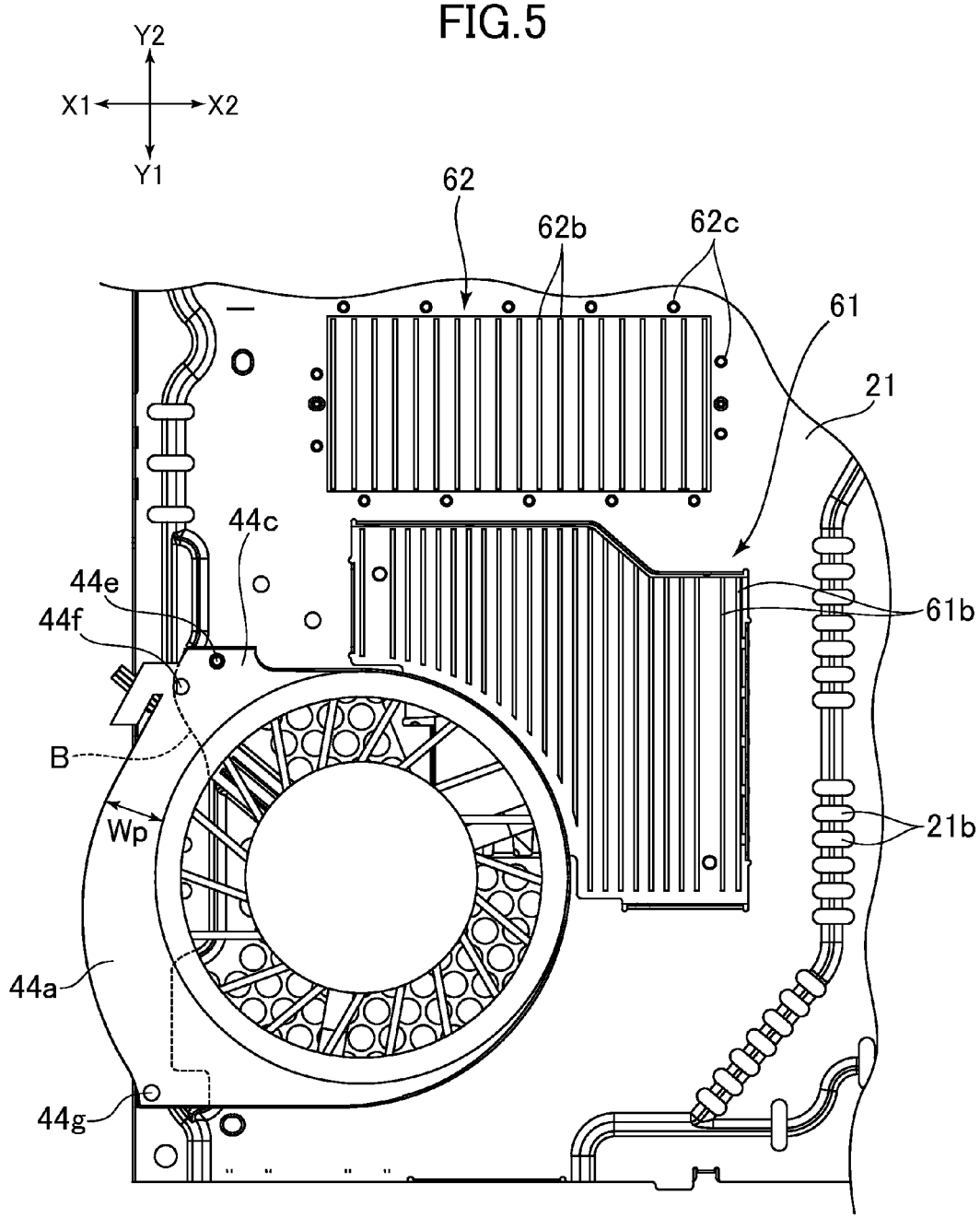
FIG. 5 a plan view of the upper frame, the cooling fan, and heat sinks of the electronic apparatus.
Figure 6:
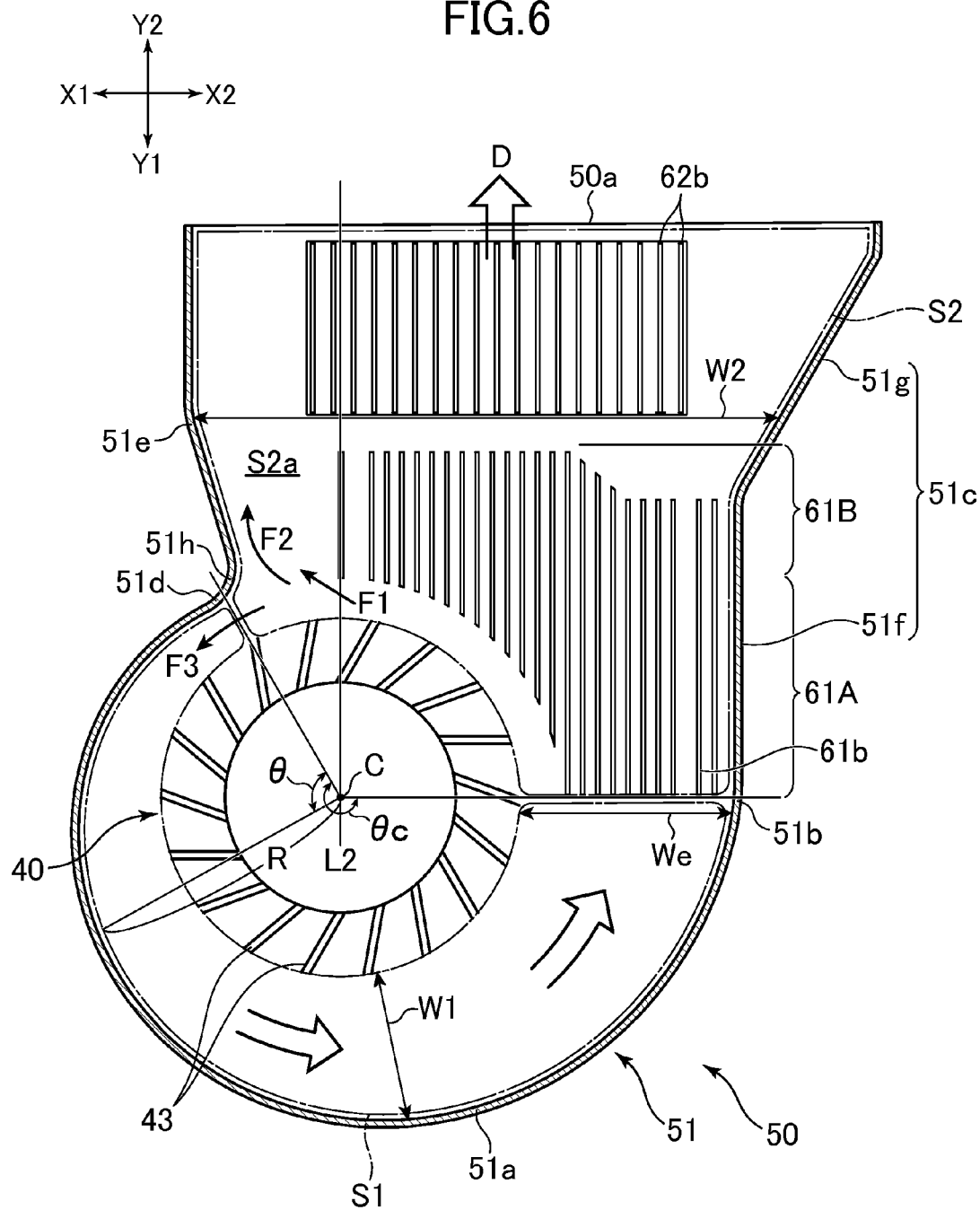
FIG. 6 a diagram for explaining air flow paths formed inside the cover included in the electronic apparatus, wherein a horizontal cross section of the cover is illustrated.

An embodiment of the invention will be described below with reference to the drawings. FIG. 1 is an exploded perspective diagram of the parts that are built into the electronic apparatus according to the embodiments of the invention. FIG. 2 is a perspective diagram that illustrates a state in which the parts illustrated in FIG. 1 excluding the cover are combined with one another. FIG. 3 is a perspective diagram that illustrates a state in which the parts illustrated in FIG. 1 are combined with one another. FIG. 4 is a perspective diagram of an upper frame 20 and a cooling fan 40 that the electronic apparatus includes. FIG. 5 is a plane diagram of the upper frame 20, the cooling fan 40, and heat sinks 61 and 62 of the electronic apparatus. FIG. 6 is a diagram for describing air flow paths S1 and S2 that are formed inside a cover 50 that the electronic apparatus includes, and illustrates a horizontal cross-section of the cover 50. In the description below, X1-X2 illustrated in FIG. 1 is the left and right direction and Y1-Y2 is the fore and rear direction.

As illustrated in FIG. 1, the electronic apparatus includes a circuit board 10. A plurality of electronic parts are mounted on the circuit board 10. The circuit board 10 has a plurality of (in this example, two) IC chips 11 and 12 mounted thereon. The electronic apparatus is an entertainment device such as, for example, a game device or an audio-visual device. The IC chips 11 and 12 are microprocessors for controlling the entirety of the electronic apparatus or image processing processors that generate moving image data based on information output from microprocessors.

The circuit board 10 in this example has a plurality of connectors 13a to 13e mounted thereon. The connectors 13a to 13e are used for electrically connecting the circuit board 10 to other component that are built into the electronic apparatus, or used for being connected with cables connected to peripheral apparatuses.

As illustrated in FIG. 1, the electronic apparatus includes a plate-like upper frame 20 that covers the circuit board 10. In this description, the upper frame 20 covers the upper face of the circuit board 10. The upper frame 20 has a size that corresponds to the circuit board 10. That is, the width of the upper frame 20 in the fore and rear direction and the width of the upper frame 20 in the left and right direction respectively correspond to the width of the circuit board 10 in the fore and rear direction and the width in the left and right direction of the circuit board 10. In this example, the upper frame 20 is approximately rectangular. On the other hand, the circuit board 10 has a shape in which a area of the rectangle (portion indicated by A in FIG. 1) is missing. Other device such as hard disk drive is arranged in the missing area A.

The size of the upper frame 20 is not necessarily limited to the description above, and may be a larger size than the circuit board 10. That is, one or both of the width of the upper frame 20 in the fore and rear direction and the width of the upper frame 20 in the left and right direction may be larger than the circuit board 10. Further, the shapes of the upper frame 20 and the circuit board 10 are not limited to the description above. For example, the circuit board 10 may also be a rectangle.

The upper frame 20 is a member formed by a pressing process or a bending process from one metallic plate. That circuit board 10 is fixed to the upper frame 20 by a fastening member such as bolts and screws (not shown). Therefore, the upper frame 20 functions as a member that secures the rigidity of the circuit board 10. Further, the upper frame 20 functions as a heat-releasing member to the parts mounted on the circuit board 10. The circuit board 10 and the upper frame 20 have, at positions corresponding to each other, holes formed thereon into which the fastening members are inserted. Further, the upper frame 20 is also fixed to a housing (not shown) that contains the devices that are built into the electronic apparatus. Therefore, the upper frame 20 also functions as a member for securing the rigidity of the housing. Further, as will be described in detail later, the upper frame 20 also functions as a member that blocks unnecessary electromagnetic radiation from the IC chips 11 and 12 and the like. Here, the upper frame 20 and the cooling fan 40, the cover 50, and the like illustrated in FIG. 1 are arranged within the housing of the electronic apparatus.

As illustrated in FIG. 1, the electronic apparatus in this example includes a lower frame 30 positioned to the opposite side of the upper frame 20 with the circuit board 10 therebetween. That is, the lower frame 30 covers the lower face of the circuit board 10. The upper frame 20, the circuit board 10, and the lower frame 30 are fixed to the housing by shared (that is, common) fastening members. The upper frame 20, the circuit board 10, the lower frame 30 and the housing have, at positions corresponding to one another, holes into which the fastening members are inserted. Here, the fixing structure of the circuit board 10 and the upper frame 20 is not limited to such an example, and shared fastening members may not be used.

As illustrated in FIGS. 1 and 2, the electronic apparatus includes the cooling fan 40 arranged on the upper frame 20. That is, the cooling fan 40 is arranged on the opposite side to the circuit board 10 with the upper frame 20 therebetween. Further, the electronic apparatus has the air flow paths S1 and S2 (refer to FIG. 6) through which air discharged from the cooling fan 40 passes on the upper frame 20. As illustrated in FIGS. 1 and 3, the electronic apparatus includes a cover 50 with a shape to cover the air flow paths S1 and S2. The cover 50 is disposed on the upper frame 20 and defines the air flow paths S1 and S2 together with the upper frame 20. That is, the air flow paths S1 and S2 are formed inside the cover 50, and the upper frame 20 and the cover 50 function as outer walls defining the air flow paths S1 and S2. Further, heat sinks 61 and 62 described later are arranged inside the cover 50. According to such a structure, since the heat which the upper frame 20 receives from the heat sinks 61 and 62 and the IC chips 11 and 12 which spreads to the outside of the cover 50 through the upper frame 20, the upper frame 20 can be used effectively as a heat-releasing member.

In this example, as illustrated in FIG. 2, the cooling fan 40 is arranged such that its rotation axis C is perpendicular to the circuit board 10. This arrangement of the cooling fan 40 forms, on the upper frame 20, large air flow paths S1 and S2 surrounding the periphery of the cooling fan 40. As a result, it is possible to increase, on the upper frame 20, regions cooled by the air flowing in the air flow paths S1 and S2.

The cover 50 is a substantially box-shaped member which is open toward the upper frame 20. The cover 50 is attached to the upper frame 20 such that the upper frame 20 blocks the open bottom of the cover 50. The wall defining the air flow paths S1 and S2 is constituted with the cover 50 and the upper frame 20 to thereby have a closed cross-sectional shape. Here, the term "the cross-sectional shape" is determined as the shape of cross-section of the wall taken with section surface orthogonal to the air flow direction of the air flow paths S1 and S2.

As illustrated in FIG. 3, the cover 50 includes an upper wall 52 facing the upper frame 20 in the thickness direction of the circuit board 10. Further, the cover 50 includes a side wall 51 extending downward from the edge of the upper wall 52 to the upper frame 20. That is, the side wall 51 stands on the upper frame 20 and functions as the side wall of the air flow paths S1 and S2. The lower edge of the side wall 51 is in contact with the upper frame 20. Here, the downstream end of the cover 50, that is, the downstream end of the air flow path S2 is open in the air flow direction thereof (direction indicated by D in FIG. 6).

The side wall 51 of this example has a shape of surrounding the periphery of the cooling fan 40. Specifically, as illustrated in FIG. 6, the side wall 51 includes a curved wall 51a curved so as to surround the periphery of the cooling fan 40. Further, the side wall 51 includes a first side wall 51c extending in the air flow direction (direction indicated by D in FIG. 6, rearward direction in this example) from one end 51b of the curved wall 51a (hereinafter, the one end is referred as terminal portion). Furthermore, the side wall 51 includes a second side wall 51e extending in the air flow direction D from the other end 51d of the curved wall 51a (hereinafter, the other end is referred as start portion). The curved wall 51a, the first side wall 51c, and the second side wall 51e are extending downward from the edge of the upper wall 52 to the upper frame 20.

The cover 50 covers the air flow paths S1 and S2 around the cooling fan 40 while avoiding the upper side of the cooling fan 40. That is, as illustrated in FIG. 3, the upper wall 52 has, on the upper side of the cooling fan 40, an opening 52a formed therein and having a size corresponding to the diameter of the cooling fan 40. Air is introduced into the air flow paths S1 and S2 through the opening 52a by rotationally driving the cooling fan 40. The shape of the cover 50 will be described in detail later.

As described above, the cover 50 is attached to the upper frame 20. Therefore, the upper frame 20, the cooling fan 40, and the cover 50 are able to be treated integrally during the manufacturing process of the electronic apparatus, which improves work efficiency.

In this example, as illustrated in FIG. 3, the side wall 51 includes, on the bottom edge of the side wall 51, projecting portions 54 and 55 that project parallel to the upper frame 20. The projecting portions 54 and 55 include, on the ends of the projecting portions 54 and 55, fixed portions 54a and 55a extending to the upper frame 20, respectively. The fixed portions 54a and 55a are fixed to the upper frame 20 by fastening members such as screws and bolts. As illustrated in FIG. 2, the upper frame 20 includes a mounted plate portion 21 on which the cover 50 and the cooling fan 40 are mounted. The mounted plate portion 21 is surrounded by steps 21a, and is positioned higher than other portions of the upper frame 20. That is, the mounted plate portion 21 is spaced upward from the circuit board 10. Positioning the fixed portions 54a and 55a away from the lower edge of the side wall 51 allows to make the positioning of the steps 21a freer. A plurality of through holes 21b are formed on the steps 21a. Here, as illustrated in FIG. 3, a plurality of fixed portions 53 are formed on the lower edge of the side wall 51 in addition to the projecting portions 54 and 55. The fixed portions 53 are also fixed to the upper frame 20 by the fastening members.

In this example, the cooling fan 40 and the cover 50 are offset toward one side in the left and right direction on the upper frame 20. Further, the cooling fan 40 and the cover 50 are offset toward one side in the fore and rear direction on the upper frame 20. Other devices built into the electronic apparatus are fixed to the remaining regions of the upper frame 20. For example, a power source circuit or a reading device of a recording medium may be affixed.

As illustrated in FIG. 1, the electronic apparatus includes the heat sinks 61 and 62. The electronic apparatus in this example includes the two heat sinks 61 and 62. As described above, the heat sinks 61 and 62 are arranged inside the cover 50. The heat sinks 61 and 62 are positioned over the air flow path S2 that is formed inside the cover 50 (refer to FIG. 6).

Figure 7:
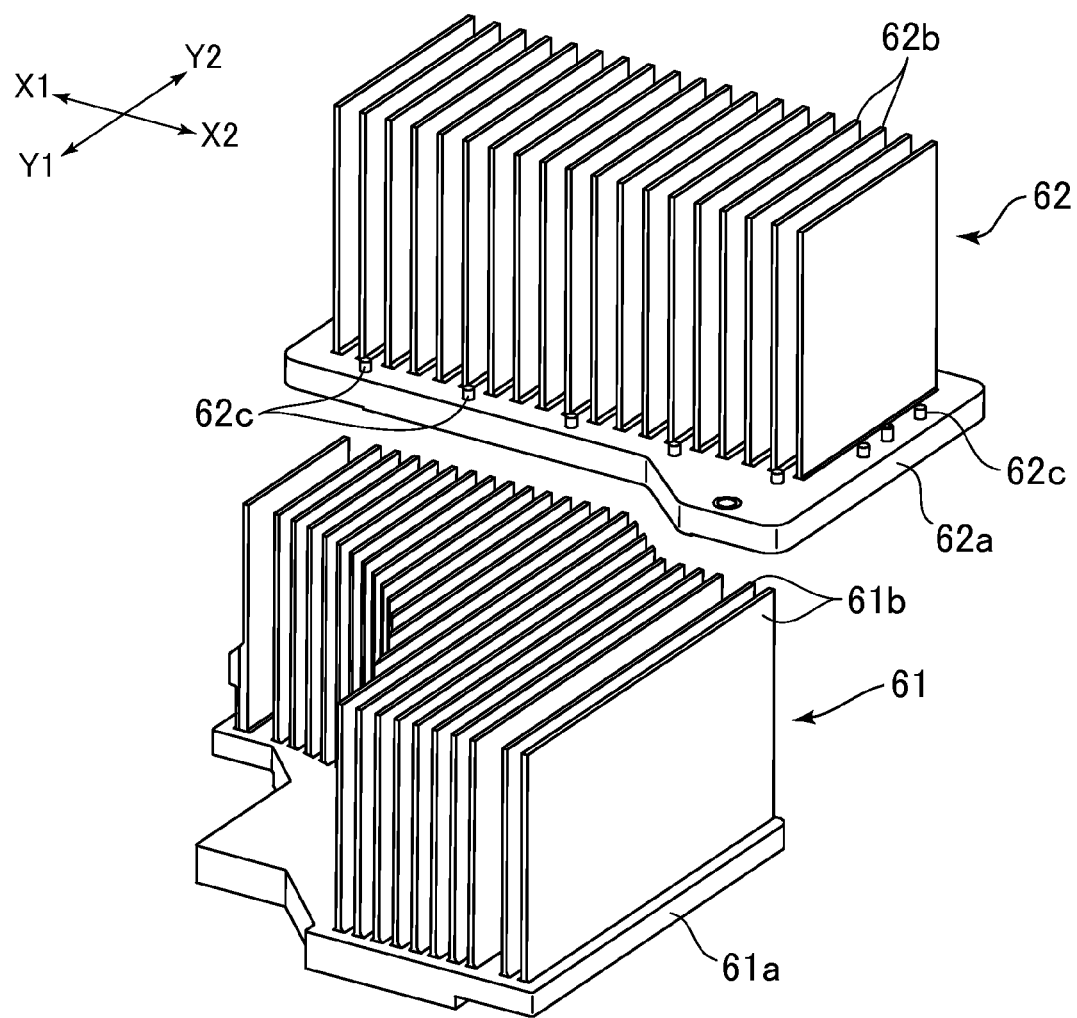
FIG. 7 a perspective view of the heat sinks.

FIG. 7 is a perspective diagram of the heat sinks 61 and 62. As illustrated in the drawing, the heat sinks 61 and 62 respectively have plate-shaped heat receiving blocks 61a and 62a on the lower portions thereof. The lower faces of the heat receiving blocks 61a and 62a respectively contact the IC chips 11 and 12 mounted on the circuit board 10. The heat receiving blocks 61a and 62a are positioned closer to the circuit board 10 than the upper frame 20 is. Further, the heat sinks 61 and 62 have a plurality of fins 61b and 62b formed on the upper portions thereof, each of the plurality of fins 61b and the plurality of fins 62b having intervals between each other. The fins 61b and 62b are positioned further upward than the upper frame 20 and are positioned on the air flow path S2 formed within the cover 50. In this example, each of the fins 61b and 62b are arranged along the fore and rear direction (air flow direction indicated by D in FIG. 6).

The heat receiving block 61a and the fins 61b are a member integrally manufactured, and the heat receiving block 62a and the fins 62b are also a member integrally manufactured. For example, the heat receiving block 61a and the fins 61b are manufactured by an extrusion process of extruding material in a direction parallel to the fins 61b. Similarly, the heat receiving block 62a and the fins 62b are manufactured by an extrusion process of extruding material in a direction parallel to the fins 62b. Here, the manufacturing method of the heat receiving blocks 61a and 62a and the fins 61b and 62b is not limited to such a method. For example, the fins 61b and 62b may be manufactured by swaging boards. Further, the heat receiving blocks 61a and 62a and the fins 61b and 62b may be manufactured by casting. The upper frame 20 has a shape that avoids the heat sinks 61 and 62. In this example, the mounted plate portion 21 of the upper frame 20 has holes 23 and 29 having shapes of correspond to the shapes of the heat sinks 61 and 62 respectively. Such a shape of the upper frame 20 allows to make the heat receiving block 61a and the fins 61b integral member and to make the heat receiving block 62a and the fins 62b integral member. According to such a configuration, the structure of the electronic apparatus can be simplified compared to a structure in which the heat receiving blocks 61a and the fins 61b are manufactured separately and the heat receiving blocks 62a and the fins 62b are manufactured separately and then the heat receiving blocks 61a and 62a are fixed to the lower face of the upper frame 20 with the fins 61b and 62b arranged further upward than the upper frame 20.

As illustrated in FIG. 4, the holes 23 and 29 corresponding to the shapes of the heat sinks 61 and 62 are formed on the mounted plate portion 21 of the upper frame 20. The heat sinks 61 and 62 are respectively arranged inside the holes 23 and 29. According to that configuration, the strength of the upper frame 20 can be secured compared to a structure in which a portion of the outer edge of the upper frame 20 is cut out and the heat sinks 61 and 62 are arranged on the cut portion.

Further, the heat sinks 61 and 62 are arranged inside the holes 23 and 29, and thus the positions thereof are determined by the upper frame 20. As described above, the circuit board 10 and the upper frame 20 are fixed to each other. It is therefore possible to suppress deviations in the relative position of the IC chips 11 and 12 and the heat sinks 61 and 62.

As illustrated in FIG. 7, the heat sink 62 includes, on the heat receiving block 62a, a plurality of protrusions 62c protruding upward. As illustrated in FIG. 4, holes 29a into which the protrusions 62c fit are formed on the edge of the hole 29 of the upper frame 20. The positioning of the heat sink 62 is determined by the protrusions 62c and the holes 29a. The position determining structure of the heat sink 61 will be described later in detail.

The heat sinks 61 and 62 are pressed against the chips 11 and 12. In this example, the heat receiving blocks 61a and 62a are pulled downward by a plate spring (not shown) that is arranged on the lower side of the lower frame 30 and pressed against the IC chips 11 and 12 by the plate spring.

As illustrated in FIG. 4, the steps 21a described above are formed on the upper frame 20. The steps 21a are positioned on the outside of the side wall 51 of the cover 50, and are formed along the lower edge of the side wall 51. A plurality of through holes 21b lined up in the extending direction of the steps 21a are formed on the steps 21a. Air flows through the through holes 21b into between the circuit board 10 and the mounted plate portion 21. Further, the mounted plate portion 21 has a plurality of through holes 21e formed thereon and positioned on the lower side of the cooling fan 40. When the cooling fan 40 is rotationally driven, air flows into between the circuit board 10 and the mounted plate portion 21 through the through holes 21b. And then, the air passes through the through holes 21e and the cooling fan 40, and then flows through the air flow paths S1 and S2 in the cover 50.

In a structure of the related art in which the cooling fan 40 and the cover 50 are fixed to a plate that is separate from the upper frame, since a boundary (gap) is caused between the plate and the upper frame, it is difficult to form the steps 21a near the lower edge of the side wall 51 of the cover 50. With the electronic apparatus described here, since the cover 50 and the cooling fan 40 are fixed to the upper frame 20 which is an integral member, it becomes easy to form the steps 21a near the lower edge of the side wall 51 of the cover 50 along the lower edge of the side wall 51.

Figure 8:
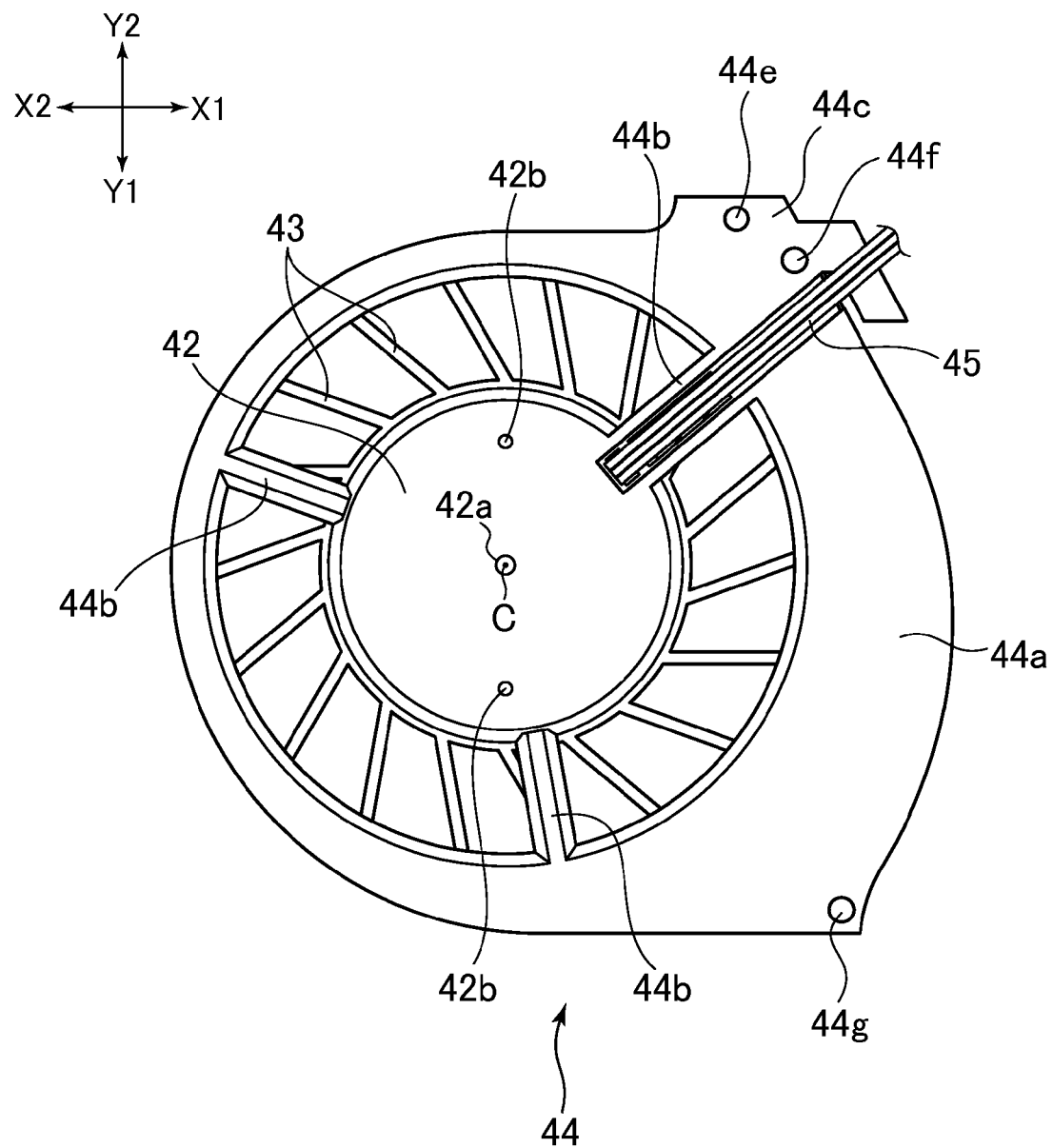
FIG. 8 a bottom view of the cooling fan.

The fixing structure of the cooling fan 40 will be described. FIG. 8 is a bottom view of the cooling fan 40.

As illustrated in FIG. 4, the cooling fan 40 includes a rotor 41 and a plurality of fins 43. The rotor 41 is cylindrical, and the plurality of fins 43 protrude in a radial direction from the outer circumference of the rotor 41. The plurality of fins 43 are arranged around the rotation axis C at even intervals in a circumferential direction. As illustrated in FIG. 8, the cooling fan 40 includes a fixed hole 42a. The fixed hole 42a is fixed to the upper frame 20 by a fastening member such as a screw. The fixed hole 42a is positioned closer to the rotation axis C than the plurality of fins 43 are. In a structure in which fixed holes are on the outsides of the plurality of fins 43, it is necessary to provide apart with the fixed holes to the outsides of the plurality of fins 43. That part inhibits direct contact of the air flow in the cover 50 with the upper frame 20, and causes a decrease in the heat releasing efficiency of the upper frame 20. With the electronic apparatus described here, the fixed hole 42a is positioned closer to the rotation axis C than the fins 43 is. It is therefore possible to reduce the number of fixed holes that are positioned on the outsides of the plurality of fins 43, and it is possible to reduce the number and size of parts positioned outside the plurality of fins 43. As a result, the surface of the upper frame 20 (specifically the mounted plate portion 21) has a larger area capable of directly contacting with the air flow, which can improve the heat releasing efficiency of the upper frame 20.

As illustrated in FIG. 8, in this example, the fixed hole 42a is positioned on the rotation axis C. It is therefore possible to stably fix the cooling fan 40 to the upper frame 20. As illustrated in FIG. 4, the upper frame 20 has, at a position corresponding to the fixed hole 42a, into which a fastening member is inserted. The cooling fan 40 has a column-like stator arranged inside the cylindrical rotor 41. As illustrated in FIG. 8, the stator has a disk-like bottom portion 42. The fixed hole 42a is formed on the bottom portion 42.

The bottom portion 42 has protrusions 42b formed thereon at a position apart from the fixed hole 42a. In this example, two protrusions 42b are formed on the bottom portion 42. The protrusions 42b are positioned on opposite sides to each other across the fixed hole 42a. On the other hand, as illustrated in FIG. 4, the upper frame 20 has holes 21h formed thereon at positions corresponding to the protrusions 42b. The protrusions 42b fit in the holes 21h. In that structure, the positional deviation in the rotation direction of the cooling fan 40 on the upper frame 20 is suppressed.

As illustrated in FIG. 2, the rotor 41 includes an upper wall 41a, and thus the shape of the rotor 41 is a cylinder in which the top end is closed by the upper wall 41a. The stator is fitted in the rotor 41 from below. In other words, the rotor 41 is arranged such that the upper side thereof is covered by the stator. With that arrangement of the rotor 41 and the stator, the position of the rotor 41 during use of the electronic apparatus is lowered due to the weight of the rotor 41 itself. As a result, the structure for optimizing the positions of the rotor 41 and the stator in the vertical direction can become simple.

As illustrated in FIGS. 4 and 8, the cooling fan 40 includes, on the bottom thereof, a fan plate portion 44 that is parallel to the upper frame 20. The fan plate portion 44 spreads further outwardly in the radiation direction than the outer diameters of the plurality of fins 43. As described above, the upper frame 20 includes the mounted plate portion 21 that serves as the bottom of the air flow paths S1 and S2. The fan plate portion 44 is positioned further outward than the outer edge of the mounted plate portion 21 (the outer edge is a portion illustrated by a broken line B in FIG. 5). The fan plate portion 44 functions as the bottom of the air flow paths together with the mounted plate portion 21. By providing the fan plate portion 44 to the cooling fan 40, it is possible to make the positioning of the cooling fan 40 on the upper frame 20 freer.

As illustrated in FIGS. 4, 5, and 8, the fan plate portion 44 includes a spreading portion 44a on a portion thereof. The spreading portion 44a spreads further outward in the radial direction than the outer circumferences of the plurality of fins 43 and is positioned further outward than an outer edge B of the mounted plate portion 21. The spreading portion 44a has a shape that corresponds to the air flow paths formed on the periphery of the cooling fan 40 (more specifically, the first air flow path S1 described later (refer to FIG. 6)). In this example, a width W1 of the first air flow path S1 gradually increases in the circumferential direction (toward the downstream direction of the air flow path S1) around the rotation axis C. Therefore, as illustrated in FIG. 4, a width Wp of the spreading portion 44a also increases gradually toward the downstream of the air flow paths. By that shape of the spreading portion 44a, an excessive spreading of the spreading portion 44a is suppressed and the first air flow path S1 defined by a wall with a closed cross-sectional shape is formed inside the cover 50.

In this example, the fan plate portion 44 is formed on the same plane as the bottom portion 42 of the stator. Further, as illustrated in FIG. 8, the fan plate portion 44 has an approximate ring shape that surrounds the bottom portion 42. Further, the fan plate portion 44 and the bottom portion 42 are coupled with each other by a plurality of bridges 44b that extend from the bottom portion 42 in the radial direction. The spreading portion 44a spreads from a portion of the outer circumference of the fan plate portion 44. An electric wire 45 for supplying electric power to the cooling fan 40 is arranged on one bridge 44b of the plurality of bridges 44b.

As illustrated in FIG. 5, the cooling fan 40 includes a fixed plate portion 44c projecting further outward from the spreading portion 44a. A hole 44e is formed on the fixed plate portion 44c, and the fixed plate portion 44c is fixed to the upper frame 20 by a screw fitted in the hole 44e. The hole 44e is positioned on the outside of the cover 50. It is therefore possible to suppress the screw fitted in the hole 44e from becoming an obstruction in the air flow.

Furthermore, a hole 44f is formed on the fixed plate portion 44c. A hole 44g is formed on the edge of the spreading portion 44a. Protrusions formed on the lower edges of the side wall 51 of the cover 50 are fitted in the holes 44f and 44g. In that structure, the positional deviation between the cooling fan 40 and the cover 50 is suppressed.

As described above, the upper frame 20 includes a plurality of through holes 21e positioned on the lower side of the cooling fan 40 (refer to FIG. 4). Further, as described above, the upper wall 52 of the cover 50 has, on the upper side of the cooling fan 40, the opening 52a with a size corresponding to the diameter of the cooling fan 40 (refer to FIG. 3). Air is introduced toward the cooling fan 40 through the opening 52a and the through holes 21e when the cooling fan 40 is rotationally driven. The air flows out toward the air flow paths S1 and S2 from the cooling fan 40 in the radial direction.

As illustrated in FIG. 4, the cooling fan 40 includes a plate-like upper ring portion 43a on the outer circumference of the cooling fan 40. The upper ring portion 43a couples the ends of the upper edges of the plurality of fins 43 to each other. The diameter of the upper ring portion 43a corresponds to the diameter of the opening 52a of the upper wall 52, and the upper ring portion 43a is arranged in proximity to the inner edge of the opening 52a. By that configuration, it is possible to prevent wasteful air flows from being caused when the cooling fan 40 is rotationally driven. Specifically, it is possible to prevent the air introduced inside the cover 50 by the cooling fan 40 from flowing out to the outside of the cover 50 through between the inner edge of the opening 52a and the upper edges of the fins 43. In this example, the inner circumference portions of the upper ring portion 43a and the opening 52a face each other in the vertical direction with a minute clearance formed therebetween.

Further, as illustrated in FIG. 4, the cooling fan 40 of this example further includes a plate-like lower ring portion 43b. The lower ring portion 43b couples the ends of the lower edges of the plurality of fins 43 to one another. The diameter of the lower ring portion 43b corresponds to the diameter of the fan plate portion 44. The upper ring portion 43a and the lower ring portion 43b prevent deformations of the fins 43.

The shape of the cover 50 and the air flow paths formed inside the cover 50 will be described with reference to FIG. 6.

As described above, the cover 50 covers the air flow paths S1 and S2 that are formed on the periphery of the cooling fan 40. The side wall 51 of the cover 50 surrounds a portion of the periphery of the cooling fan 40 as described above, and includes the curved wall 51a that defines the first air flow path S1 between the curved wall 51a and the outer circumference of the cooling fan 40. Further, the side wall 51 includes the first side wall 51c extending further from the terminal portion 51b that is one end of the curved wall 51a. The first side wall 51c functions as a side wall of the second air flow path S2 that is a downstream flow path continuous from the first air flow path S1. Furthermore, the side wall 51 includes the second side wall 51e facing the first side wall 51c. The second side wall 51e functions as a side wall on the opposite side to the first side wall 51c of the second air flow path S2.

The curved wall 51a is curved such that the flow path cross-sectional area of the first air flow path S1 becomes gradually larger downstream in the first air flow path S1. That is, the curved wall 51a is curved such that a distance R from the rotation axis C of the cooling fan 40 thereto becomes gradually greater downstream. The distance R between the curved wall 51a and the rotation axis C of the cooling fan 40 is shortest at the start portion 51d of the curved wall 51a, that is, at the upstream end of the curved wall 51a. The start portion 51d is positioned apart the circumference of the cooling fan 40 in the radial direction. The distance R becomes gradually greater toward the terminal portion 51b.

In this example, the curved wall 51a is curved along a logarithmic spiral (equiangular spiral) around the rotation axis C of the cooling fan 40. A function that represents the logarithmic spiral of the curved wall 51a is determined as a curved line that passes both of the position of the start portion 51d and the position of the terminal portion 51b. That is, the logarithmic spiral is represented by Formula 1 below.

$$R = a \times e^{b\theta}$$   Formula 1

"a" is the distance between the start portion 51d and the rotation axis C of the curved wall 51a. "e" is a natural logarithm. "θ" is the angle between a straight line connecting each point on the curved wall 51a with the rotation axis C and a straight line connecting the start portion 51d with the rotation axis C. "b" is a coefficient, and for example, is obtained by the angle between a straight line connecting the terminal portion 51b with the rotation axis C and the straight line connecting the start portion 51d with the rotation axis C, and the distance from the terminal portion 51b to the rotation axis C.

With a structure in which the curved wall 51a is curved, the air that flows along the curved wall 51a faces resistance due to changes in the direction of the tangent of the curved wall 51a. The angle between a tangent at every point on the logarithmic spiral and the straight line connecting the portion with the rotation axis C is fixed. Therefore, the structure in which the curved wall 51a is curved along the logarithmic spiral can reduces a resistance due to changes in the direction of the tangent against the air that flow along the curved wall 51a. Therefore, the air along the curved wall 51a does not easily decelerate, and it is possible to increase the amount of air that flows through the first air flow path S1.

Alternatively, the curved wall 51a may be curved along an involute curve around the rotation axis C of the cooling fan 40 such that the flow path cross-sectional area of the first air flow path S1 becomes gradually larger toward the second air flow path S2. Even in that structure, a function that represents the involute curve of the curved wall 51a is determined as a curved line that passes through both the relative position of the starting portion 51d to the rotation axis C and the relative position of the terminal portion 51b to the rotation axis C. The curved wall 51a curved along the involute curve is similar, in its formation, to the curved wall 51a curved along the logarithmic spiral. Therefore, even in that structure where the curved wall 51a is curved along the involute curve, the air along the curved wall 51a does not easily decelerate, and it is possible to increase the amount of air that flows through the first air flow path S1.

The second air flow path S2 has a wider flow path cross-sectional area than that of the downstream end of the first air flow path S1 (the downstream end of the first air flow path S1 is a position corresponding to the terminal portion 51*b* of the curved wall 51*a*). That is, a width W2 of the second air flow path S2 is greater than a width We of the downstream end of the first air flow path S1. In this example, the width W2 becomes gradually greater downstream in the second air flow path S2 from the downstream end of the first air flow path S1. In this description, the width W2 is the width in a perpendicular direction to the air flow direction D in the second air flow path S2. Further, the air flow direction D in the second air flow path S2 is a comprehensive (macroscopic) air flow direction of air flowing in the second air flow path S2. The air flow direction D is determined by the posture of the heat sinks 61 and 62 and the fins 61*b* and 62*b*, the extending direction of the first side wall 51*c* and the second side wall 51*e*, or the opening direction of the downstream end of the first air flow path S1. In this description, the air flow path direction D is the rearward direction.

The heat sinks 61 and 62 are arranged on the second air flow path S2. In other words, the heat sinks 61 and 62 are arranged further downstream than the downstream end of the first air flow path S1. As described above, the second air flow path S2 has a larger flow path cross-sectional area than that of the downstream end of the first air flow path S1. The heat sinks 61 and 62 therefore do not easily cause a decrease in the speed of the air flow, and good cooling efficiency are obtained.

The first side wall 51*c* in this example includes a straight line portion 51*f*. The straight line portion 51*f* extends in a straight line from the terminal portion 51*b* of the curved wall 51*a* in the tangential direction (in this example, the air flow direction D) at the terminal portion 51*b*. The air that flows along the curved wall 51*a* can therefore flow in a straight line along the first side wall 51*c* without the speed thereof being greatly reduced.

Further, the first side wall 51*c* in this example has a slanted portion 51*g* extending further from the straight line 51*f*. The slanted portion 51*g* is slanted to the outside in the perpendicular direction to the air flow direction D (in this example, the slanted portion 51*g* is slanted in a direction indicated by X2). In that structure, the flow path cross-section area of the downstream portion in the second air flow path S2 is widen by the slanted portion 51*g*. As a result, the air that flows along the straight line portion 51*f* can pass through the second air flow path S2 smoothly.

The upstream portion of the first side wall 51*c*, that is, the portion of the straight line 51*f* close to the curved wall 51*a* overlaps with the rear half portion of the cooling fan 40 in the perpendicular direction to the air flow path direction D. Accordingly, the upstream portion of the second air flow path S2 is formed between the outer circumference of the cooling fan 40 and the first side wall 51*c*. Therefore, the flow path cross-sectional area of the upstream portion of the second air flow path S2 becomes larger downstream by a rate of increase that is defined by the outer circumference of the rear half portion of the cooling fan 40.

The second side wall 51*e* that opposes the first side wall 51*c* is far apart from the first side wall 51*c* in the perpendicular direction to the air flow direction D. Specifically, as described later, the second side wall 51*e* is positioned on the opposite side to the first side wall 51*c* across a straight line L2 that passes through the rotation axis C along the air flow direction D. The downstream portion of the second air flow path S2 is defined between the first side wall 51*c* and the second side wall 51*e*.

The start portion 51*d* of the curved wall 51*a* is connected to the second side wall 51*e*. Air flow generated by the rotational driving of the cooling fan 40 can therefore be used effectively. Further, the start portion 51*d* is positioned apart from the outer circumference of the cooling fan 40 in a radial direction. Air therefore flows into the upstream end (position corresponding to the start portion 51*d*) of the first air flow path S1 smoothly. The entire range between the start portion 51*d* (coupled portion with the second side wall 51*e*) and the terminal portion 51*b* (coupled portion with the first side wall 51*c*) is curved along the logarithmic spiral or the involute curve.

The start portion 51*d* is positioned on the opposite side to the terminal portion 51*b* across the straight line L2 that passes through the rotation axis C of the cooling fan 40 along the air flow direction D. Referring to FIG. 6, the start portion 51*d* is positioned apart from the straight line L2 in the perpendicular direction to the air flow direction D. In this example, the terminal portion 51*b* is apart from the start portion 51*d* by an angle □c that is greater than 180 degrees and less than 270 degrees in a circumferential direction around the rotation axis C. That structure enables the air to flow in the second air flow path S2 efficiently. Specifically, an air flow F1 is formed at a position apart from the rotation axis C in the air flow direction D, in this example, formed at a position positioned directly rearward from the rotation axis C. The air forced out by the rotating fins 43 is ejected from the cooling fan 40 in a diagonal direction to the radial direction of the cooling fan 40. The air flow F1 therefore faces diagonally backward as illustrated in FIG. 6, and has a speed component in the air flow direction D. The air with such speed component can be supplied directly to the second air flow path S2 without going through the first air flow path S1. That is, the speed component in the air flow direction D which the air flow F1 has can be used effectively.

The second side wall 51*e* extends from the start portion 51*d* in a diagonal direction to the air flow direction D. The air flow F1 can therefore flow along the second side wall 51*e* smoothly.

Further, in this example, the first side wall 51*c* is formed along the air flow direction D, and the second side wall 51*e* is slanted with respect to the first side wall 51*c*. Therefore, the air flow cross-sectional area of the second air flow path S2 gradually becomes larger downstream between the first side wall 51*c* and the second side wall 51*e*. The downstream portion of the second side wall 51*e* extends in a direction along the air flow direction D.

The second side wall 51*e* includes a curved portion 51*h* on the end thereof. That is, the second side wall 51*e* is curved from the start portion 51*d* toward the outside in the perpendicular direction to the air flow direction D, and then extends in a direction diagonal to the air flow direction D. The air flow formed on the periphery of the cooling fan 40 can therefore be divided smoothly between an air flow F2 along the second side wall 51*e* and an air flow F3 toward the first air flow path S1.

As described above, the electronic apparatus in this example includes the two heat sinks 61 and 62. In the description below, the heat sink 61 is referred as a first heat sink and the heat sink 62 is referred as a second heat sink. The second heat sink 62 is arranged further downstream than the first heat sink 61.

The first heat sink 61 is arranged along the first side wall 51c. The air that flows along the curved wall 51a can therefore flow into the first heat sink 61 without greatly losing speed.

As described above, the first heat sink 61 includes a plurality of fins 61b. The fins 61b are arranged along the first side wall 51c (more specifically, the straight line portion 51f). That is, the fins 61b are arranged in parallel with the first side wall 51c. Further, the fins 61b are arranged to be parallel with the opening direction of the downstream end of the first air flow path S1 (in this example, the rearward direction). The air that has flowed from the first air flow path S1 can therefore pass through between the fins 61b smoothly.

In this example, the first heat sink 61 includes a downstream portion 61B that is positioned between the first side wall 51c and the second side wall 51e. Further, the first heat sink 61 extends upstream from the downstream portion 61B to thereby include an upstream portion 61A positioned between the first side wall 51c and the outer circumference of the cooling fan 40. Providing the upstream portion 61A to the first heat sink 61 leads to enlarge a portion which receives fast air flowed out of the first air flow path S1. In this example, the upstream end of the first heat sink 61 is positioned at the downstream end of the first air flow path S1.

The first heat sink 61 includes not only a portion positioned rearward from the downstream end of the first air flow path S1 but also a portion positioned rearward from the cooling fan 40, that is, a portion positioned in the air flow direction D from the cooling fan 40. It is therefore possible to cool the first heat sink 61 with both the air that flows directly out from the cooling fan 40 in the air flow direction D and the air that flows out from the first air flow path S1. In this example, the end of the first heat sink 61 (end toward the second side wall 51e) is positioned in the air flow direction D from the rotation axis C of the cooling fan 40.

Further, the first heat sink 61 in this example has a shape of surrounding a portion of the outer circumference of the cooling fan 40. That is, the front edges of the plurality of fins 61b are on a curved line along the cooling fan 40. It is therefore possible to arrange the first heat sink 61 in proximity to the cooling fan 40. As a result, the air that flows out from the cooling fan 40 flows into the first heat sink 61 before the speed drops greatly.

As described above, the second side wall 51e is connected to the start portion 51d of the curved wall 51a. The start portion 51d is positioned apart from the downstream portion 61B of the first heat sink 61 in the circumferential direction of the cooling fan 40. The second side wall 51e is also positioned apart from the downstream portion 61B in the perpendicular direction to the air flow direction D. A space S2a is therefore formed between the downstream portion 61B and the second side wall 51e. As a result, the air flow can be divided smoothly between the air flow F2 toward the space S2a and the air flow F3 toward the first air flow path S1 without being disturbed at the coupling portion between the second side wall 51e and the start portion 51d.

Further, the second side wall 51e is slanted such that the distance between the fins 61b of the first heat sink 61 and the second side wall 51e gradually increases downstream. The flow path cross-sectional area of the space S2a therefore becomes gradually larger downstream. As a result, the air flow F2 becomes even smoother.

The first heat sink 61 is offset toward the first side wall 51c from the second side wall 51e. That is, the distance between the second side wall 51e and the downstream portion 61B of the first heat sink 61 is greater than the distance between the first side wall 51c and the downstream portion 61B. It therefore becomes possible to provide air into the upstream end of the first air flow path S1 smoothly and provide, to the first sink 61, the fast air immediately after flowing out of the first air flow path S1.

As described above, the second heat sink 62 is arranged downstream of the first heat sink 61. The second heat sink 62 is also positioned apart from the second side wall 51e in the perpendicular direction to the air flow direction D. A smooth air flow can therefore be formed between the second heat sink 62 and the second side wall 51e. The air flow path formed between the first heat sink 61 and the second side wall 51e (that is, the space S2a) continues to the downstream end 50a of the cover 50.

The second heat sink 62 is positioned apart from the first side wall 51c in the perpendicular to the air flow direction D. In this example, the first side wall 51c includes the slanted portion 51g. The second heat sink 62 is positioned apart from the slanted portion 51g.

Figure 9:
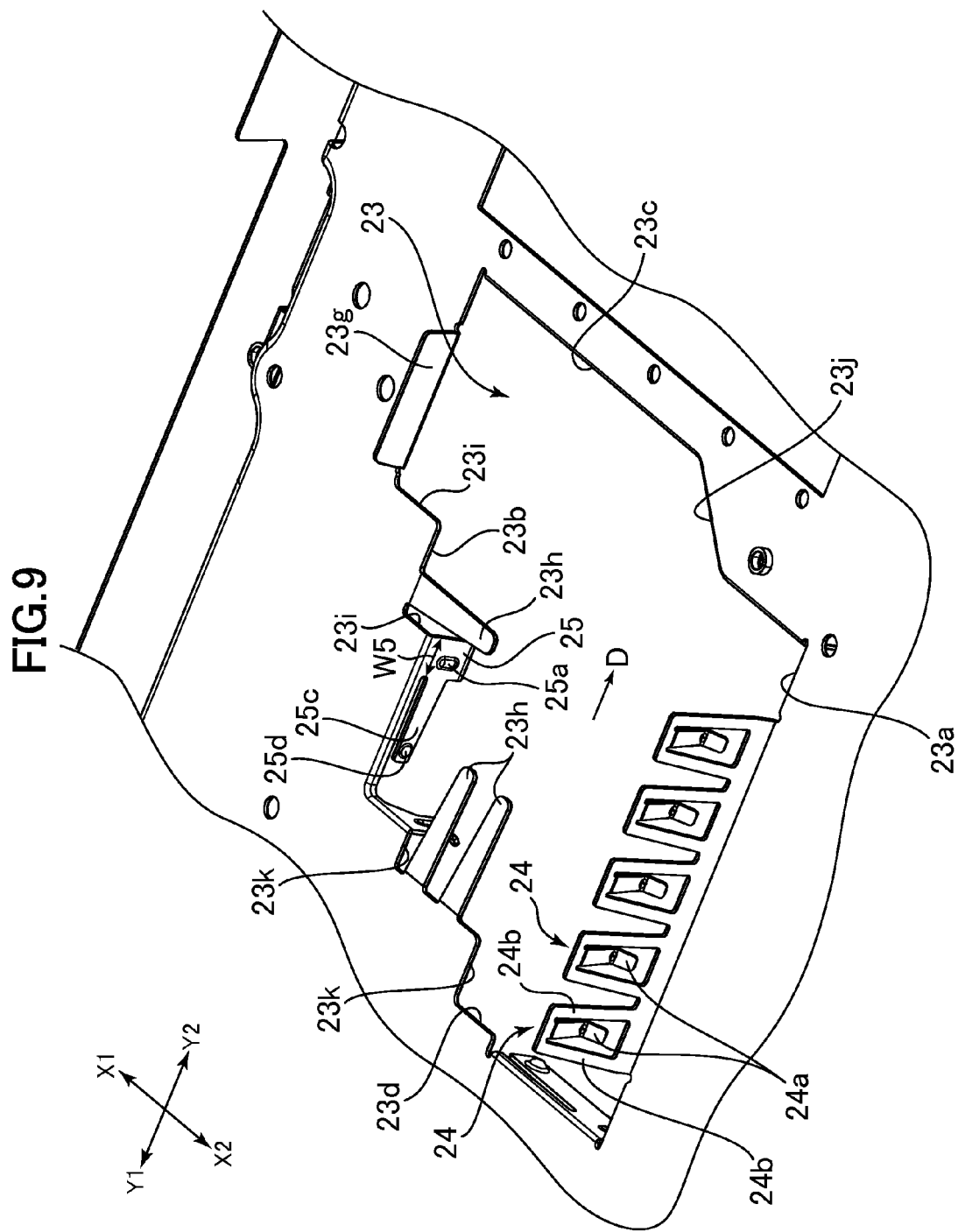
FIG. 9 an enlarged perspective view of the upper frame, wherein a portion where a first heat sink is arranged is illustrated.
Figure 10:
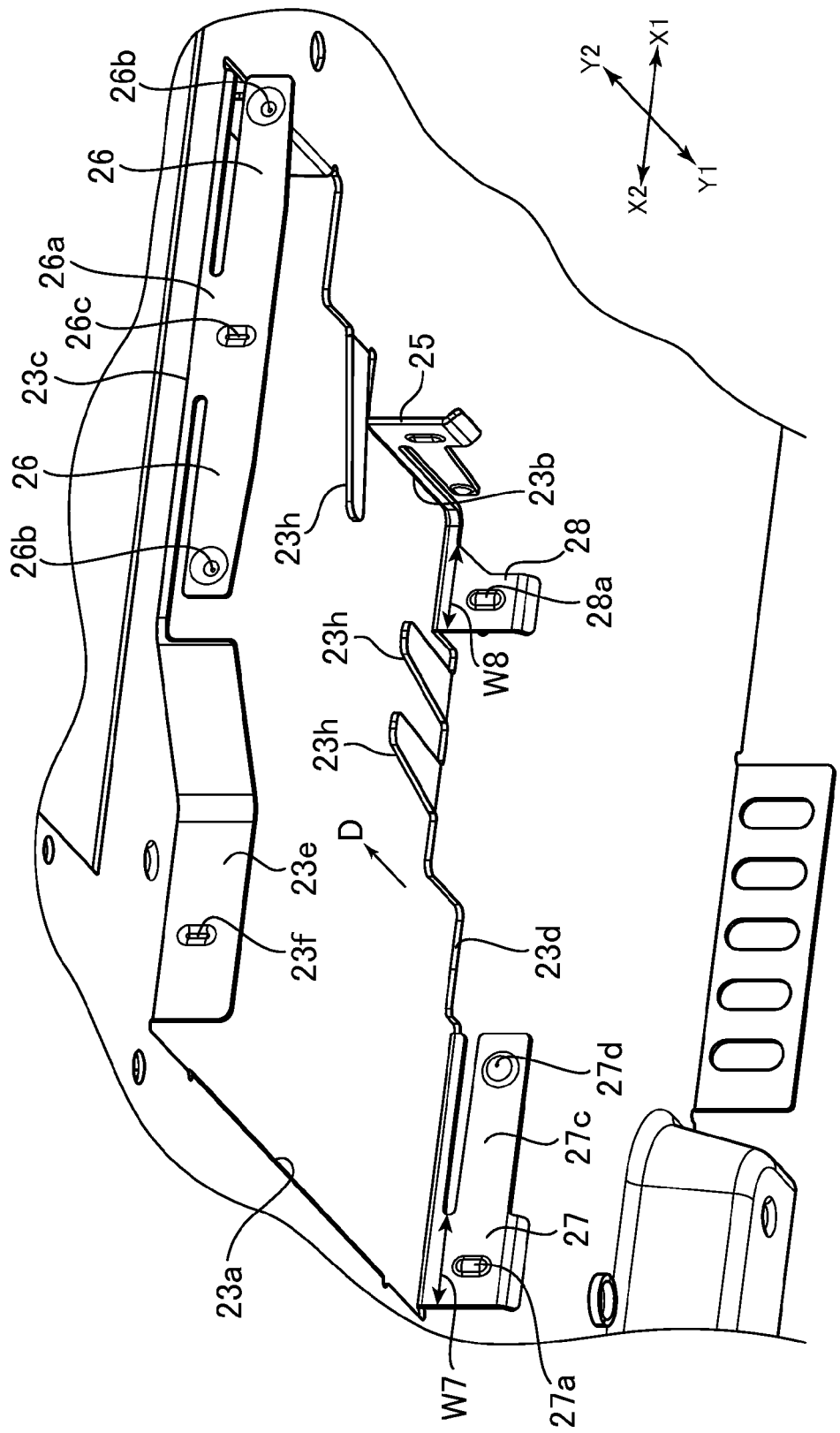
FIG. 10 a perspective view of the lower side of the portion illustrated in FIG. 9.
Figure 11:
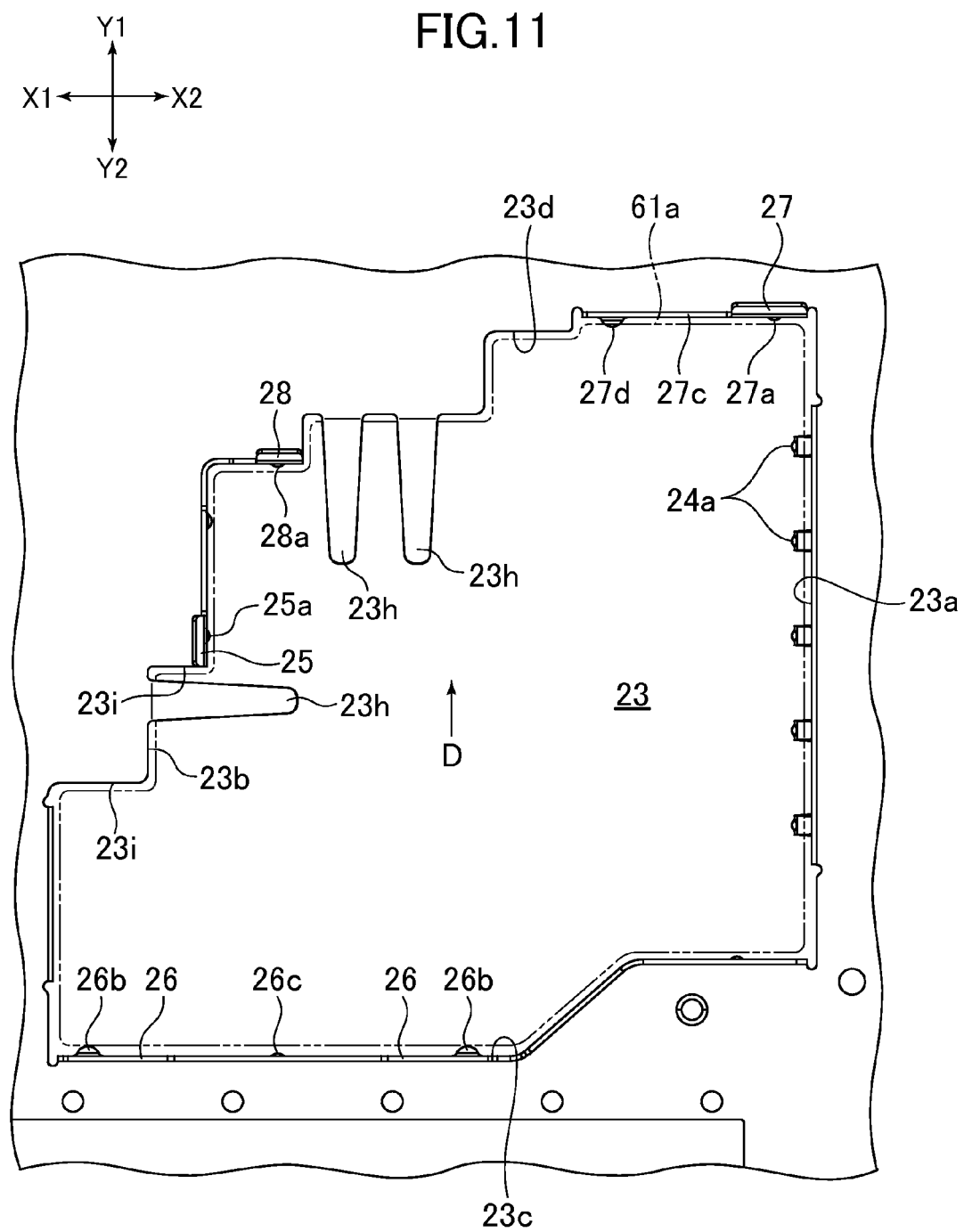
FIG. 11 a bottom view of the upper frame.

As described above, the upper frame 20 covers the circuit board 10, and functions as a shield to block electromagnetic waves that are emitted from the circuit board 10. The position determining structure of the first heat sink 61 by the upper frame 20 and a structure for obtaining electrical contact between the first heat sink 61 and the upper frame 20 for reducing the electromagnetic waves from the first heat sink 61 will be described below. FIG. 9 is an enlarged perspective diagram of the upper frame 20, and in the drawing, the portion where the first heat sink 61 is arranged is illustrated. FIG. 10 is a perspective diagram of the reverse side of the portion illustrated in FIG. 9. FIG. 11 is a bottom diagram of the upper frame 20. Here, in these drawings, the through holes 21e described with reference to FIG. 4 are omitted.

As described above, the first heat sink 61 is arranged on the circuit board 10. More specifically, the first heat sink 61 is arranged on the IC chip 11. The upper frame 20 has a shape that avoids the first heat sink 61. In this example, a hole 23 with a shape corresponding to the first heat sink 61 is formed on the upper frame 20. The first heat sink 61 is arranged inside the hole 23, and thus the upper frame 20 has an edge that surrounds the entire outer circumference of the first heat sink 61 (that is, the inner edge of the hole 23). By arranging the first heat sink 61 inside the hole 23, as will be described later, it is possible to define the position of the first heat sink 61 in both the fore and rear direction and the left and right direction by the upper frame 20.

As illustrated in FIGS. 4 and 9, the upper frame 20 includes a first edge 23a, a second edge 23b, a third edge 23c, and a fourth edge 23d as the edge surrounding the outer circumference of the first heat sink 61 (that is, the inner edge of the hole 23). The first and second edges 23a and 23b are positioned on opposite sides to each other across the first heat sink 61. In this example, the first and second edges 23a and 23b are opposed in the perpendicular to the air flow direction D of the second air flow path S2. The third and fourth edges 23c and 23d are also positioned on opposite sides to each other across the first heat sink 61. The third and fourth edges 23c and 23d are opposed in the air flow direction D of the second air flow path S2.

In this example, the first edge 23a is formed in a straight line to match the shape of the first heat sink 61. On the other hand, steps 23i and 23i are formed on the second edge 23b to match the shape of the first heat sink 61. Further, steps 23j and 23k are respectively formed on the third edge 23c and the fourth edge 23d to match the shape of the first heat sink

61. The shapes of the edges 23a, 23b, 23c, and 23d may be changed as appropriate to match the shape of the first heat sink 61.

As illustrated in FIG. 9, the upper frame 20 includes spring portions 24 on the first edge 23a which push the first heat sink 61 toward the second edge 23b, that is, push the first heat sink 61 in the perpendicular direction to the air flow direction D (direction indicated by X1). Further, the upper frame 20 includes, on the second edge 23b, a position determining portion 25 against which the first heat sink 61 is pressed. In that structure, while the position of the first heat sink 61 is determined in the perpendicular direction to the air flow direction D, the upper frame 20 and the first heat sink 61 come into electric contact. The upper frame 20 is electrically grounded. Electromagnetic radiation from the fins 61b is therefore suppressed. In this example, the upper frame 20 includes a plurality of spring portions 24 (in this example, five spring portions 24). In this example, the position determining portion 25 is a plate-like part. The spring portions 24 and the position determining portion 25 face toward opposite sides to each other in the perpendicular direction to the air flow direction D.

Further, as illustrated in FIG. 10, the upper frame 20 includes, on the third edge 23c, spring portions 26 pushing the first heat sink 61 toward the fourth edges 23d, that is, pushing the first heat sink 61 in the air flow direction D. Further, the upper frame 20 includes position determining portions 27 and 28 against which the first heat sink 61 is pressed on the fourth edge 23d. In that structure, while the position of the first heat sink 61 is determined in the air flow direction D, the upper frame 20 and the first heat sink 61 come into electric contact. In this example, as will be described later, the upper frame 20 includes a plurality of spring portions 26 (in this example, two). The position determining portions 27 and 28 in this example are plate-like parts. The spring portions 26 and the position determining portions 27 and 28 face toward opposite sides to each other in the air flow direction D.

As illustrated in FIGS. 9 and 10, the position determining portions 25, 27, 28, the spring portions 24, 26 and the upper frame 20 are formed integrally. That is, the position determining portions 25, 27, and 28 and the spring portions 24 and 26 are formed by partially bending an original plate material to form the upper frame 20 in bending process. The position determining portions 25, 27, and 28 in this example are plate-like parts bent toward the circuit board 10.

The position determining portion 25 formed on the second edge 23b has high rigidity compared to the spring portions 24 on the opposite side thereof. That is, although the spring portions 24 are elastically deformable, the position determining portion 25 has a shape in which elastic deformation toward the outside of the hole 23 is limited. For example, a width W5 (refer to FIG. 9) of the base portion of the position determining portion 25 ("the base portion" is referred as a coupling portion between the second edge 23b and the position determining portion 25) is designed so that the position determining portion 25 cannot easily be deformed than the spring portions 24. Further, the distance between the base portion of the position determining portion 25 and a portion in which the position determining portion 25 and the first heat sink 61 come into contact (the portion is protrusion 25a described later) is designed so that the position determining portion 25 cannot easily be deformed. The position of the first heat sink 61 is therefore determined in a perpendicular to the air flow direction D by the position determining portion 25.

Similarly, the position determining portions 27 and 28 formed on the fourth edge 23d have high rigidity compared to the spring portions 26 on the opposite thereof. Specifically, although the spring portions 26 are elastically deformable, the position determining portions 27 and 28 have a shape to limit their elastic deformation toward the outside of the hole 23. For example, widths W7 and W8 (refer to FIG. 10) of the base portions of the position determining portions 27 and 28 (the base portion is referred as coupling portion between the fourth edge 23d and the position determining portions 27 and 28) are designed so that the position determining portions 27 and 28 are not easily deformed. Further, the distance between the base portions of the position determining portions 27 and 28 and portions in which the position determining portions 27 and 28 come into contact with the first heat sink 61 (the portions are protrusions 27a and 28a described later) is designed so that the position determining portions 27 and 28 are not easily deformed. The position of the first heat sink 61 in the air flow direction D is therefore determined by the position determining portions 27 and 28.

As illustrated in FIG. 9, the spring portions 24 formed on the first edge 23a protrude upward from the first edge 23a. That is, the spring portions 24 extend in the opposite direction to the direction in which the circuit board 10 is arranged from the upper frame 20. Furthermore, the spring portions 24 push the fin 61b positioned on the end of the plurality of fins 61b of the first heat sink 61. It is therefore easy to secure the lengths (heights) of the spring portions 24.

In this example, each spring portion 24 includes two support portions 24b that extend upward. The two support portions 24b extend upward from two positions distant from each other in a direction along the first edge 23a (in this example, the direction is the air flow direction D). Further, each spring portion 24 includes a plate spring-like contact arm portion 24a positioned between the two support portions 24b. The contact arm portions 24a is pressed against the fins 61b (refer to FIG. 2). In the structure, the contact arm portion 24a can be protected by the support portions 24b. For example, external force can be suppressed from acting on the contact arm portion 24a by the manufacturing process of the electronic apparatus.

In this example, the upper ends of the two support portions 24b are coupled with each other. The contact arm portion 24a extends downward from the upper end of the support portions 24b and is slanted toward the fins 61b. The contact arm portion 24a has a lower portion in contact with the fins 61b. The contact arm portion 24a is elastically deformable using the base portion (upper end) thereof as the origin of the deformation. In that structure, the contact arm portion 24a is surrounded by the two support portions 24b and the contact arm portion 24a can be effectively protected by the two support portions 24b.

As will be described later, the position determining portion 25 projects from the second edge 23b of the upper frame 20 toward the circuit board 10. On the other hand, the support portions 24b extend upward from the first edge 23a of the upper frame 20, and as described above, the contact arm portion 24a extends downward from the upper ends of the support portions 24b, that is, extends toward the upper frame 20. Furthermore, the lower portion of the contact arm portion 24a, that is, the portion close to the upper frame 20, is in contact with the fins 61b. Therefore, compared to a structure in which the contact arm portion 24a extends upward and its upper portion contacts the fins 61b, the difference in height between the position where the contact arm portion 24a contacts the fins 61b and the position where the position determining portion 25 contacts the first heat sink 61 is reduced, and thus the momentum generated on the first heat sink 61 can be suppressed.

As described above, a plurality of spring portions 24 are formed on the first edge 23a. The force to press the first heat sink 61 against the position determining portion 25 is therefore increased. The first edge 23a in this example is parallel to the air flow path direction D. The plurality of spring portions 24 are lined up in a direction parallel to the fins 61b, that is, a direction parallel to the air flow direction D. It is therefore possible to suppress the spring portions 24 from causing air resistance. Here, as described above, the first side wall 51c of the cover 50 is formed along the fins 61b. The plurality of spring portions 24 are therefore also lined up along the first side walls 51c.

As illustrated in FIG. 9, the position determining portion 25 projects from the second edge 23b toward the circuit board 10. Specifically, the position determining portion 25 is bent toward the circuit board 10. It is therefore possible to suppress the position determining portion 25 from becoming an obstruction to the air flow. In particular, in this example, it is possible to suppress the position determining portion 25 from becoming an obstruction against the air that flows through the space S2a (refer to FIG. 6) between the first heat sink 61 and the second side wall 51e. The height of the position determining portion 25 in the up and down direction corresponds to the distance between the upper frame 20 (in this example, the mounted plate portion 21) and the circuit board 10.

As illustrated in FIG. 10, the spring portions 26 protrude from the third edge 23c toward the circuit board 10. Further, the position determining portions 27 and 28 project from the fourth edge 23d toward the circuit board 10. That is, the spring portions 26 and the position determining portions 27 and 28 are bent toward the circuit board 10. Since both the spring portions 26 and the position determining portions 27 and 28 are folded on the same side with respect to the upper frame 20, it is possible to suppress the momentum generated on the first heat sink 61. Further, since the spring portions 26 and the position determining portions 27 and 28 are bent to opposite sides to the air flow paths, it is possible to prevent the spring portions 26 and the position determining portions 27 and 28 from obstructing the air flow. Here, the heights of the spring portions 26 and the position determining portions 27 and 28 in the up and down direction correspond to the distance between the upper frame 20 (in this example, the mounted plate portion 21) and the circuit board 10.

The heat receiving block 61a of the first heat sink 61 is positioned toward the circuit board 10 from the upper frame 20. A side surface of the heat receiving block 61a is pressed against the position determining portion 25. Since the heat receiving block 61a is a block of metal, the heat receiving block 61a has high rigidity compared to the fins 61b. Therefore, compared to a structure where the position determining portion 25 is in contact with the fins 61b, the precision of the positioning of the first heat sink 61 can be improved. Similarly, a side surface of the heat receiving block 61a is also pressed against the position determining portions 27 and 28. In the manufacturing process of the first heat sink 61, there may be a case where mechanical processes such as cutting are applied to the outer circumference of the heat receiving block 61a. It is possible to obtain generally high processing precision in mechanical processing. Pressing the side surfaces of the heat receiving block 61a against the position determining portions 25, 27, and 28 enables the first heat sink 61 to obtain even higher precision of positioning thereof.

As illustrated in FIG. 10, the spring portions 26 include a base portion 26a bent toward the circuit board 10. The spring portions 26 are plate springs extending from the base portion 26a in a direction parallel to the circuit board 10. The spring portions 26 extend from the base portion 26a thereof along a side surface of the heat receiving block 61a. The spring portions 26 are elastically deformable using the base portion 26a thereof as the origin of the deformation. The upper frame 20 in this example includes two spring portions 26 that extend in opposite directions to each other from a shared base portion 26a. Ends of the two spring portions 26 have are in contact with a side surface of the heat receiving block 61a. Since it is therefore possible to increase the force to push the heat receiving block 61a and push the wide range of the side surface of the heat receiving block 61a, it is possible to suppress the rotation of the first heat sink 61 inside the hole 23. The two spring portions 26 are connected to the third edge 23c via the shared base portion 26a thereof.

In this example, the third edge 23c is an edge that is positioned more downstream in the air flow paths than the fourth edge 23d. Therefore, the spring portions 26 push the first heat sink 61 upstream. Therefore, compared to a structure in which the spring portions 26 push the first heat sink 61 downstream, it is possible to decrease the gap between the heat receiving block 61a of the first heat sink 61 and the fourth edge 23d positioned upstream. As a result, the air to flow into the second air flow path S2 and then hit the fins 61b can be suppressed from flowing to the back side of the upper frame 20 through such a gap.

The spring portion 26 includes, its distal end, protrusion 26b protruding to a side surface of the heat receiving block 61a so as to be in contact with the side surface of the heat receiving block 61a. According to that structure, since the heat receiving block 61a and the spring portions 26 are stable in their contact positions, compared to a structure in which there are no such protrusions 26b. And thus, the stability of the electrical connection between the first heat sink 61 and the upper frame 20 can be secured.

As illustrated in FIG. 9, the position determining portion 25 includes a protrusion 25a protruding to the first heat sink 61, that is, protruding to a side surface of the heat receiving block 61a. The side surface of the heat receiving block 61a is in contact with the protrusion 25a. As illustrated in FIG. 10, protrusions 27a and 28a protruding toward a side surface of the heat receiving block 61a are also formed on the position determining portions 27 and 28 formed on the fourth edge 23d. The side surface of the heat receiving block 61a is in contact with the protrusions 27a and 28a. According to that structure, since the heat receiving block 61a and the position determining portions 25, 27, and 28 are stable in their contact positions, compared to a structure where the entirety of each of the plate-like position determining portions 25, 27, and 28 is in contact with a side surface of the heat receiving block 61a. And thus, the precision of the positioning of the first heat sink 61 and the stability of the electrical connection between the first heat sink 61 and the upper frame 20 can be improved.

As illustrated in FIG. 9, the upper frame 20 includes a plate spring-like spring portion 25c extending from the position determining portion 25 in a direction parallel to the circuit board 10, in other words, that extending along a side surface of the heat receiving block 61a. The spring portion 25c includes, on the end of the spring portion 25c, a protrusion 25d that is pressed against a side surface of the heat receiving block 61a. Further, as illustrated in FIG. 10, the upper frame 20 includes a plate spring-like spring portion 27c extending from the position determining portion 27 in a direction parallel to the circuit board 10, in other words, extending along a side surface of the heat receiving block 61a. The spring portion 27c includes, on the end thereof, a protrusion 27d pressed against a side surface of the heat receiving block 61a. Rattling of the first heat sink 61 or the rotation of the first heat sink 61 inside the hole 23 is suppressed by the spring portions 25c and 27c. The elasticity of the spring portion 25c is less than the elasticity of the contact arm portions 24a of the plurality of spring portions 24 formed on the opposite side thereof. The first heat sink 61 is therefore pressed against the protrusion 25a of the position determining portion 25 by the contact arm portions 24a. Further, the elasticity of the spring portion 27c is less than the elasticity of the spring portion 26 formed on the opposite side thereof. The first heat sink 61 is therefore pressed against the protrusions 27a and 28a of the position determining portions 27 and 28 by the spring portions 26.

As described above, a plurality of spring portions 24 are formed on the first edge 23a. As illustrated in FIGS. 9 and 11, the protrusion 25a of the position determining portion 25 is positioned to the opposite of a position between two spring portions 24 positioned on both ends out of the plurality of spring portions 24. In that structure, it is possible to suppress momentum from being generated on the first heat sink 61 by the elasticity of the plurality of spring portions 24. In particular, the protrusion 25a is positioned at an opposite position to the intermediate position of the plurality of spring portions 24. That is, the intermediate position of the plurality of spring portions 24 and the protrusion 25a are positioned on a common straight line perpendicular to the air flow direction D.

As illustrated in FIGS. 10 and 11, the protrusion 28a of the position determining portion 28 is positioned opposite to a position between the two spring portions 26. In that structure, momentum can be suppressed from being generated on the first heat sink 61 by the elasticity of the spring portions 26. In particular, the protrusion 28a is positioned opposite to the intermediate position of the protrusions 26b of the two spring portions 26. In other words, the intermediate position of the protrusions 26b of the spring portions 26 and the protrusion 28a are positioned on a common straight line along the air flow direction D.

As described above, the two position determining portions 27 and 28 are formed on the fourth edge 23d. As illustrated in FIGS. 10 and 11, the position determining portions 27 and 28 are apart from each other in the perpendicular direction to the air flow direction D. According to that structure, the positioning of the first heat sink 61 inside the hole 23 is stabilized. In this example, the position determining portion 28 is formed on one end of the fourth edge 23d, and the position determining portion 27 is formed on the other end. The position determining portion 27 is shifted in the perpendicular direction to the air flow direction D with respected to the two spring portions 26 formed on the third edge 23c.

As illustrated in FIG. 10, in addition to the two spring portion 26, an auxiliary wall 23e is formed on the third edge 23c. The auxiliary wall 23e has a protrusion 23f protruding to a side surface of the heat receiving block 61a. Further, a protrusion 26c is also formed on the common base portion 26a of the two spring portions 26 formed on the third edge 23c. According to that structure, even in a case where the first heat sink 61 is arranged toward the third edge 23c by a manufacturing fault, the contact position between a side surface of the heat receiving block 61a and the upper frame 20 is stabilized. As a result, the stability of the electrical connection between the first heat sink 61 and the upper frame 20 can be improved.

As illustrated in FIG. 9, the second edge 23b includes a wall 23g bent to the upper side, that is, bent to the opposite side to the circuit board 10. The wall 23g can increase the strength of portions of the upper frame 20 which are close to the wall 23g Further, The wall 23g facilitates the manufacture process of fitting the first heat sink 61 into the hole 23 from the lower side of the upper frame 20.

As illustrated in FIG. 9, a long thin plate 23h extending inwardly inside the hole 23 and arranged to be approximately parallel to the upper frame 20. When fitting the first heat sink 61 inside the hole 23 from the lower side of the upper frame 20, the first heat sink 61 can be prevented from popping out upward from the hole 23.

Figure 12:
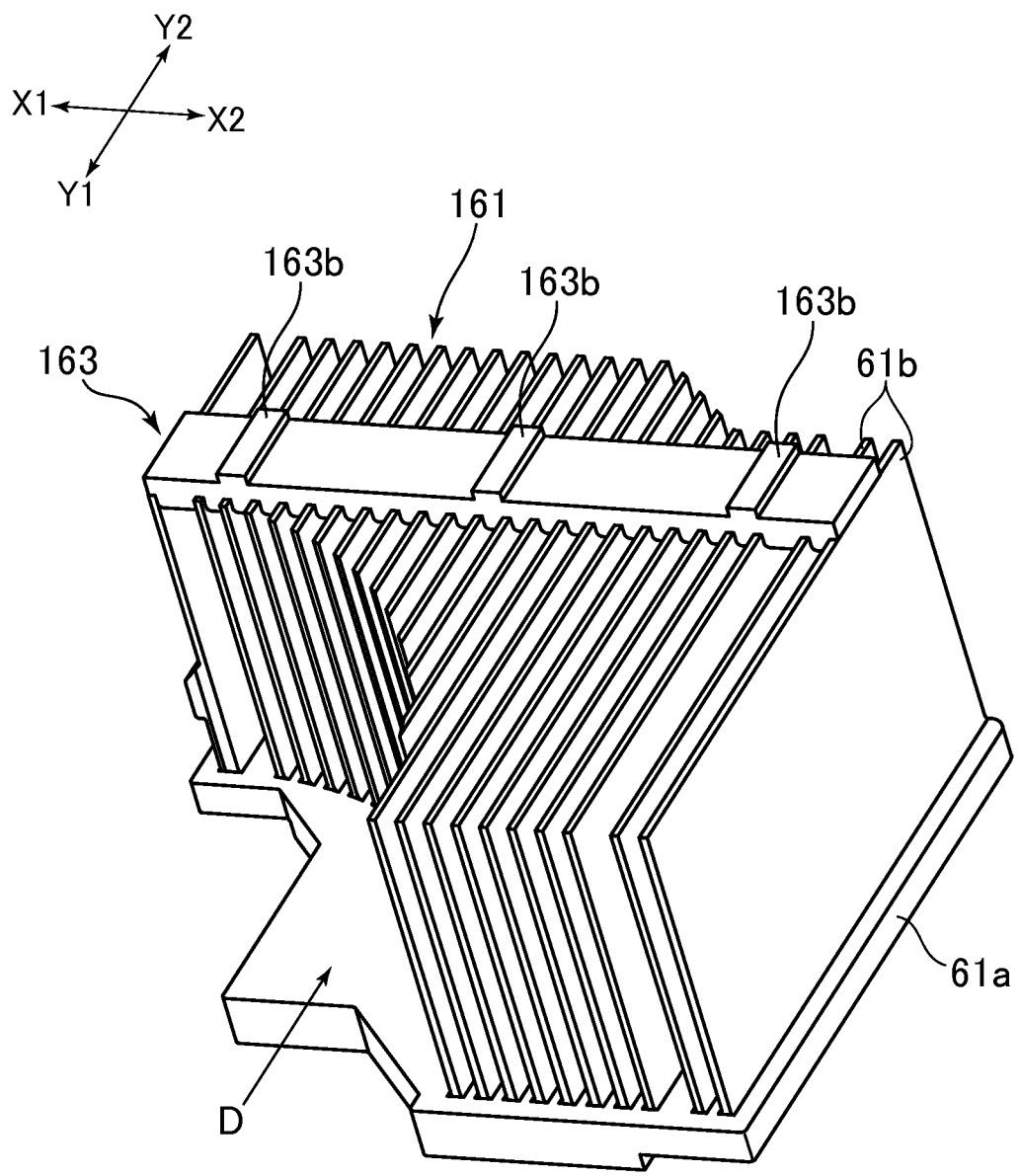
FIG. 12 a perspective view illustrating a modification of the first heat sink.
Figure 13:
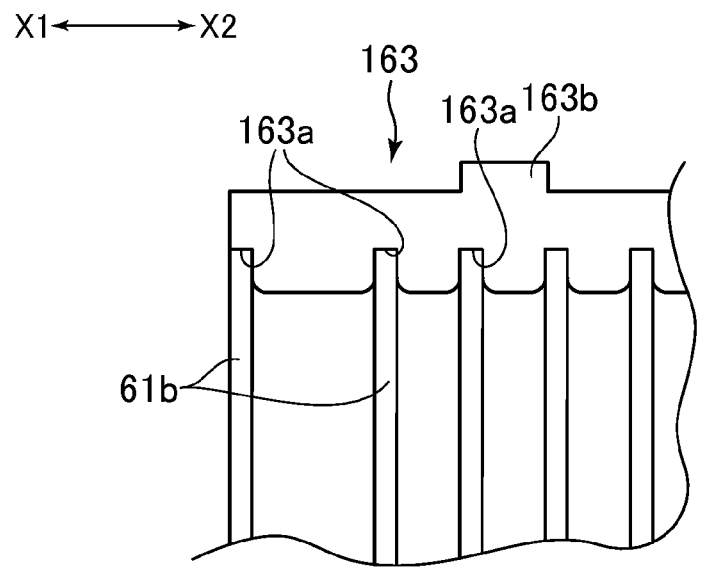
FIG. 13 an enlarged front view of the first heat sink illustrated in FIG. 12.

A structure for reducing the vibrations of the fins 61b of the first heat sink 61 will be described. FIG. 12 is a perspective diagram of a first heat sink 161 that is a modification of the first heat sink 61. FIG. 13 is an enlarged front view of the first heat sink 161. In the description below, the same references are given to parts that are the same as parts described thus far, and detailed description thereof will be omitted. The arrangement of the first heat sink 161 within the electronic apparatus is the same as that of the first heat sink 61 described above.

As illustrated in FIG. 12, similarly to the first heat sink 61 described above, the first heat sink 161 includes a plate-like heat receiving block (base) 61a and a plurality of fins 61b extending upward from the heat receiving block 61a. The plurality of fins 61b are lined up in a direction along the heat receiving block 61a, that is, in the perpendicular direction to the air flow direction D, leaving gaps therebetween.

Further, the first heat sink 161 includes a coupling member 163 that is separately manufactured member from the heat receiving block 61a or the fins 61b. The coupling member 163 is attached to the edges of the plurality of fins 61b. In other words, the coupling member 163 is attached to the edges of the fins 61b. In this example, the coupling member 163 is positioned apart upward from the heat receiving block 61a, and is attached to the upper edges of the plurality of fins 61b, that is, the opposite edges to the heat receiving block 61a. The air flow in the air flow paths S1 and S2 is formed by each fin 43, and thus the air flow pulsates microscopically due to the rotation speed of the cooling fan 40. Attaching the coupling member 163 on the fins 61b can deduce the vibrations of the fins 61b due to the air flow from the cooling fan 40. Further, since the coupling member 163 is attached to the upper edges of the fins 61b, the coupling member 163 can be suppressed from obstructing the air flow.

As described with reference to FIGS. 9 to 11, the heat receiving block 61b and the fins 61a are in contact with the upper frame 20. Specifically, the heat receiving block 61b and the fins 61a are in contact with the spring portions 24 and 26 and the position determining portions 25, 27, and 28. Reducing the vibrations of the fins 61b leads to reduce vibrations transmitted via the upper frame 20 to other devices that are arranged on the upper frame 20, for example, a reading reproduction device of storage media or an external storage device that is arranged in the region A illustrated in FIG. 1.

Depending on the rotation speed of the cooling fan 40, the plurality of fins 61b of the first heat sink 161 cause sympathetic vibrations by the pulsations of the air flow, between the fins 61b and other members arranged in the electronic apparatus, or between the fins 61b. Specifically, under pulsations of the air flow is caused by the cooling fan 40 driven at a certain rotation speed, the thicknesses, sizes, and shapes of the fins 61*b* designed for meeting a demand in the cooling efficiency for the first heat sink 161 causes sympathetic vibrations between the pulsations of the air flow and the fins 61*b*, between two fins 61*b*, between the fins 61*b* and the upper frame 20, or between other devices that mounted on the upper frame 20 and the fins 61*b*. The coupling member 161 attached to the fins 61*b* can reduce the generation of the sympathetic vibrations.

The coupling member 161 is formed by a material with a buffering function that can reduce the vibrations of the fins 61*b*. In other words, the coupling member 161 is formed by a material that is able to change the natural frequency of the fins 61*b*. For example, the coupling member 161 is formed by a material with elasticity, stretchability, and flexibility, for example, by a resin such as elastomer or a resin tape. Further, the coupling member 161 may be formed by a resin with rigidity such as a plastic. Furthermore, the coupling member 161 may be polystyrene foam or a paper material such as cardboard. Here, the coupling member 161 may be an insulating material or a conductive material that can reduce unnecessary radiation (conductive rubber).

The coupling member 163 has a shape into which edges of the plurality of fins 61*b* fit. In this example, the coupling member 163 is a long thin member in the direction in which the fins 61*b* are lined up (left and right direction). As illustrated in FIG. 13, a plurality of grooves 163*a* are formed on the lower face thereof. The plurality of grooves 163*a* are lined up in the lining direction of the fins 61*b*, and the positions of the grooves 163*a* respectively correspond to the positions of the fins 61*b*. Furthermore, the upper edges of the fins 61*b* are fitted into the grooves 163*a*. With that structure, the upper edges of the fins 61*b* are coupled with one another. In this example, the widths of the grooves 163*a* equate to the thicknesses of the fins 61*b*. With that structure, the vibrations of the fins 61*b* can be prevented more effectively. The shape of coupling the fins 61*b* is not limited thereto.

For example, protrusions may be formed on the edges of the fins 61*b*, and the coupling member 163 may have holes thereon into which the protrusions fit respectively. Further, an adhesive may be applied to the inner faces of the grooves 163*a* or the entire lower face of the coupling member 163. By that structure, the generation of vibrations of the fins 61*b* can be suppressed more reliably.

The plurality of fins 61*b* include a plurality of fins 61*b* having different lengths from one another in a direction along the plurality of fins 61*b*, that is, different lengths in the air flow direction D. The coupling member 163 is attached to the fins 61*a* with different lengths. In this example, similarly to the first heat sink 61 described above, the first heat sink 161 is arranged in the vicinity of the cooling fan 40. The plurality of fins 61*b* includes, in its portion on the rear side of the cooling fan 40, front edges lined up on a curved line curved to match the outer circumference of the cooling fan 40 (refer to FIG. 6). The lengths of the plurality of fins 61*b* positioned to the rear of the cooling fan 40 therefore become gradually shorter toward the fins 61*b* at the end, that is, toward the straight line L2 passing through the rotation axis C of the cooling fan 40 (refer to FIG. 6). The coupling member 163 is attached to the plurality of such fins 61*b* with different lengths. The fins 61*b* have natural frequencies corresponding to the lengths thereof. By coupling a plurality of fins 61*b* having different natural frequencies from one another by the coupling member 163, vibrations of the coupling member 163 itself are less prone to be generated, and it is possible to reduce the vibrations of the fins 61*b* more effectively. Further, since the coupling member 163 is attached to all of the plurality of fins 61*b* with different lengths, even in a case where it is not clear which fin 61*b* having natural frequency vibrate violently, the vibrations of the fins 61*b* can be reliably reduced. In this example, as illustrated in FIG. 12, the coupling member 163 extends from the upper edge of the fin 61*b* positioned at one end to the fin 61*b* positioned at the other end, and the coupling member 163 is attached to all of the fins 61*b*.

The width of the coupling member 163 (width in the air flow direction D) is narrower than the width of any of the fins 61*b* (length in a direction along the fin 61*b*). It is therefore possible to restrain the coupling member 163 obstructing the diffusion of heat.

As illustrated in FIG. 12, the coupling member 163 includes a plurality of (in this example, three) protrusions 163*b* on the upper face thereof. By forming such protrusions 163*b*, even in a case where there are vibrations that the coupling member 163 cannot resolve, such vibrations are not easily transmitted via the coupling member 163 to the other members.

Further, similarly to the first heat sink 61 described above, the first heat sink 161 is arranged inside the cover 50. The protrusions 163*b* may be pressed against the lower face of the upper wall 52 of the cover 50 (refer to FIG. 3). In that structure, the adhesion strength between the coupling member 163 and the fins 61*b* increases, and vibrations can be reduced more effectively. Further, due to the presence of the protrusions 163*b*, a clearance can be reliably left between the coupling member 163 and the upper wall 52. As a result, an air flow can be formed on the upper side of the coupling member 163, and a rise in the temperature of the coupling member 163 can be suppressed. Alternatively, the protrusions 163*b* do not necessarily have to be provided.

Figure 14:
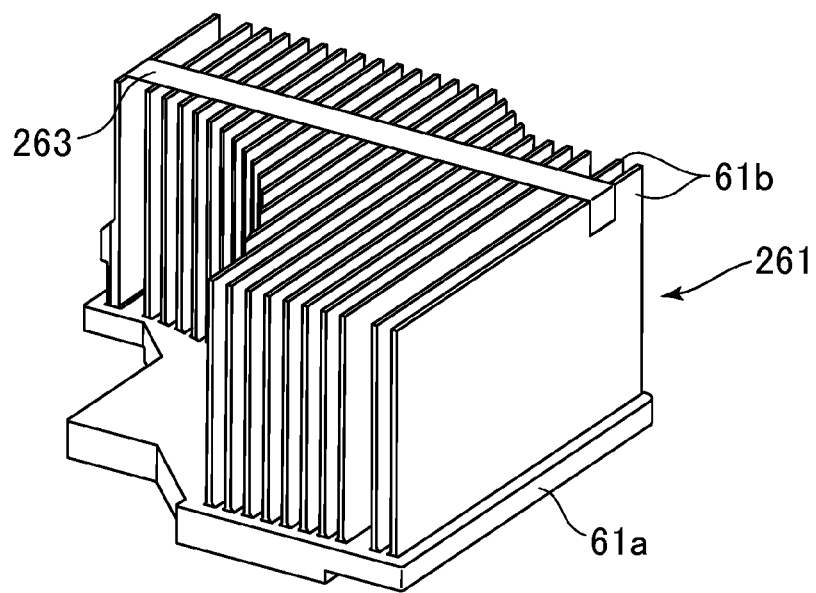
FIG. 14 a perspective view illustrating still another modification of the first heat sink.

FIG. 14 is a diagram that illustrated still another example of the first heat sink 61, and in the drawing, a first heat sink 261 is illustrated. Here, points that differ from the first heat sink 161 will be described, while other points are the same as the first heat sinks 61 and 161 described above.

The first heat sink 261 in this example includes a strip-shaped coupling member 263. The coupling member 263 includes a surface in contact with the edges of the plurality of fins 61*b*, specifically, the upper edges thereof. That is, an adhesive is applied to the lower surface of the coupling member 263. By that structure, the vibrations of the fins 61*b* are reduced. Further, similarly to the coupling member 163, the coupling member 263 extends from the fin 61*b* at one end to the fin 61*b* at the other end. The ends of the coupling member 263 are pasted onto the side faces of the fins 61*b* at each end.

A cushioning material may be provided on the upper face of the coupling member 263. By that structure, it is possible to reduce the vibrations of the fins 61*b* more effectively.

As explained above, in the electronic apparatus according to the above embodiment, the cooling fan 40 is arranged on the opposite side of the circuit board 10 across the upper frame 20 and attached to the upper frame 20. The cover 50 has the shape for covering the air flow paths S1 and S2 and defines the walls of the air flow paths S1 and S2 together with the upper frame 20. The heat sinks 61 and 62 are arranged inside the cover 50. With such an electronic apparatus, the heat transferred from the heat sinks 61 and 62 to the upper frame 20 is transferred to the outer side of the cover 50 as well through the upper frame 20. Therefore, it is possible to effectively use the upper frame 20 as a member for heat radiation.

The cooling fan 40 has the rotation axis C perpendicular to the circuit board 10. The air flow paths S1 and S2 are formed in the outer circumference of the cooling fan 40. With this structure, it is possible to form the large air flow paths S1 and S2 that surround the cooling fan 40 compared with structure in which the cooling fan 40 is arranged to be erected on the upper frame 20. As a result, it is possible to increase, in the upper frame 20, a region cooled by the air flow flowing through the air flow paths S1 and S2.

The cooling fan 40 includes the plurality of fins 43 arranged in the circumferential direction around the rotation axis C of the cooling fan 40 and the fixed portion (in the above explanation, the fixed hole 42a) attached to the upper frame 20. The fixed hole 42a is located toward the rotation axis C from the plurality of fins 43. With this structure, it is possible to reduce the number of the fixed portions (e.g., in the above explanation, the fixed hole 44e and the attachment plate portion 44c) provided in the outer circumferential portion of the cooling fan 40 and attached to the upper frame 20. It is easy to secure, in the upper frame 20, a region with which the air flow comes into contact.

The fixed hole 42a is located on the rotation axis C of the cooling fan 40. With this structure, it is possible to improve stability of attachment of the cooling fan 40 to the upper frame 20.

The cooling fan 40 includes the fan plate portion 44. The fan plate portion 44 spreads further outward in the radial direction than the outer circumference of the fins 43 of the cooling fan 40 and is located on the outer side of the outer edge (the portion indicated by B in FIG. 5) of the mounted plate portion 21 of the upper frame 20. The fan plate portion 44 configures the bottom surfaces of the air flow paths S1 and S2 together with the mounted plate portion 21 of the upper frame 20. With this structure, even in the structure in which the cooling fan 40 is arranged in the position close to the edge of the upper frame 20, it is possible to form, with the fan plate portion 44, the upper frame 20, and the cover 50, the air flow paths S1 and S2 defined by the walls having the closed sectional shape.

The heat sinks 61 and 62 including the plurality of fins 61b and 62b located in the air flow paths S1 and S2 are arranged inside the cover 50. The upper frame 20 has a shape that avoids the plurality of fins 61b and 62b. With this structure, the heat receiving blocks 61a and 62a and the fins 61b and 62b of the heat sinks 61 and 62 can be integrally formed, and thus the structure of the electronic apparatus can be simplified.

The holes 23 and 29 are formed in the upper frame 20. The heat sinks 61 and 62 are located inside the holes 23 and 29. With this structure, it is possible to increase the strength of the upper frame 20 compared with structure in which portions of the outer edge of the upper frame 20 are cut out and the heat sinks 61 and 62 are arranged in the cut-out portions.

The positions of the heat sinks 61 and 62 are defined by the upper frame 20. The circuit board 10 and the upper frame 20 are fixed to each other. Therefore, it is possible to improve the accuracy of the relative positions of the heat sinks 61 and 62 and the electronic parts (in the above explanation, the IC chips 11 and 12) on the circuit board 10.

Note that various changes may be made concerning the electronic apparatus explained above.

For example, in the electronic apparatus explained above, the two heat sinks 61 and 62 are arranged inside the cover 50. However, only one heat sink may be arranged inside the cover 50.

The cooling fan 40 is arranged such that the rotation axis C thereof is perpendicular to the circuit board 10. However, the present invention may be applied to an electronic apparatus in which the cooling fan 40 is arranged such that the rotation axis C is parallel to the circuit board 10.

The first air flow path S1 formed by the curved wall portion 51a and the positioning structure for the first heat sink 61 are also explained above. However, the present invention may be applied to an electronic apparatus not including the positioning structure for the first heat sink 61 and the curved wall portion 51a explained above.

Figure 15A:
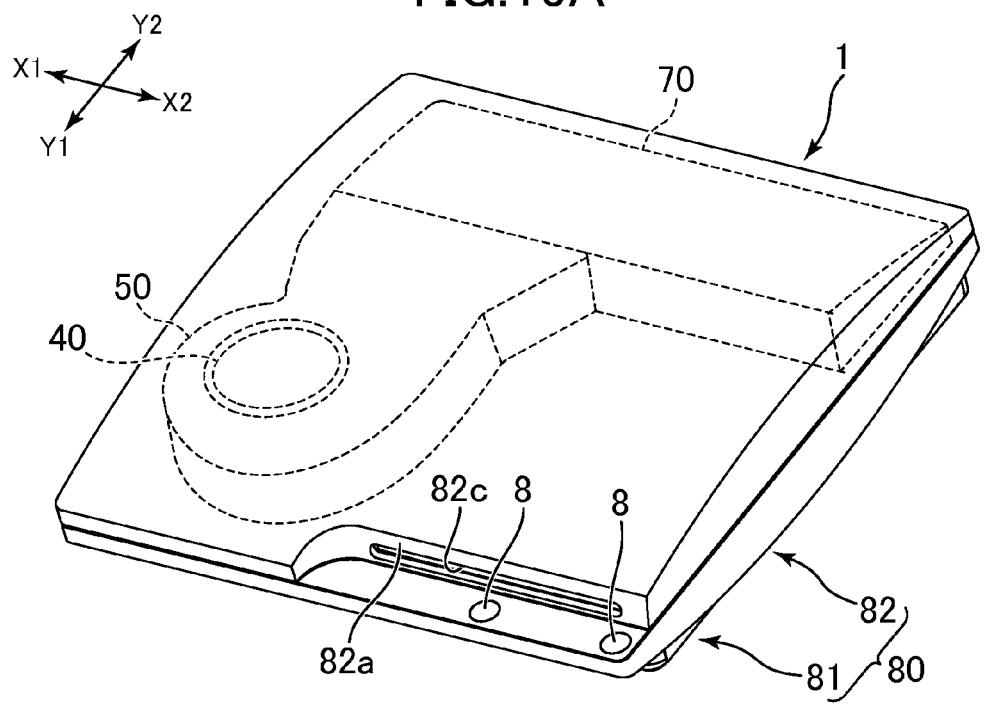
FIG. 15A a perspective view of an electronic apparatus according to an embodiment of the present invention.
Figure 15B:
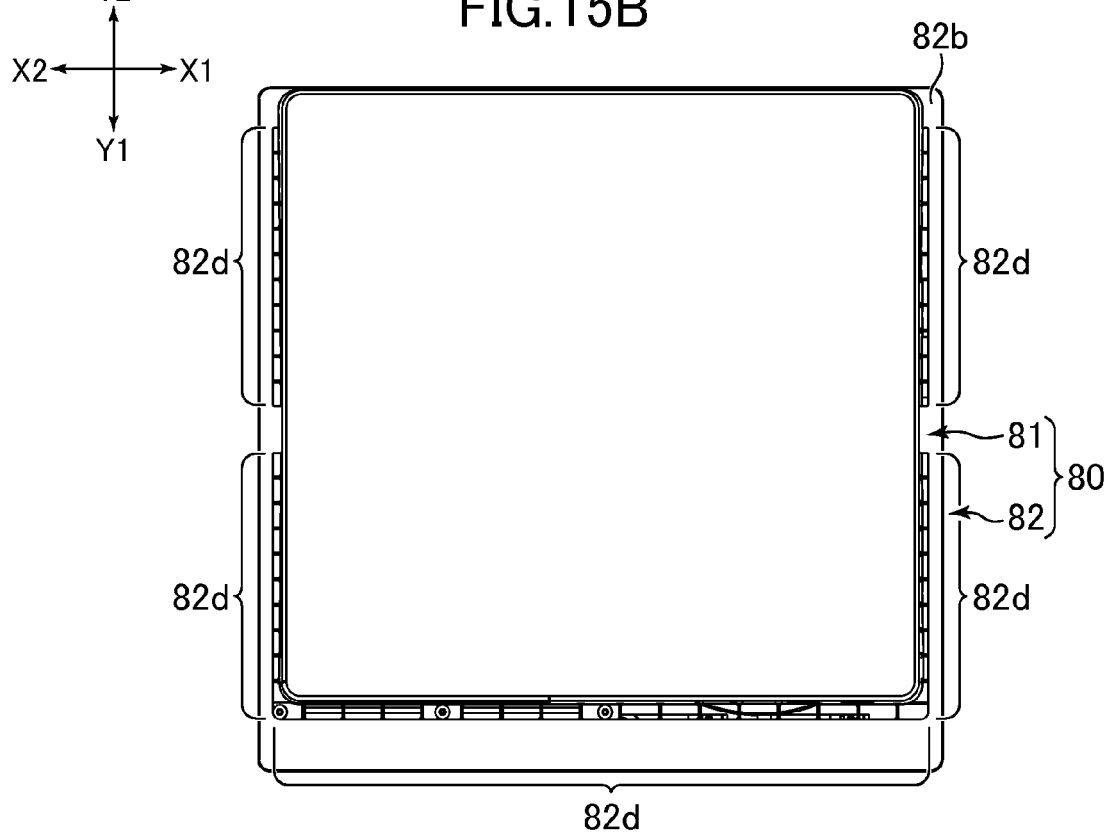
FIG. 15B a bottom view of the electronic apparatus illustrated in FIG. 15A.
Figure 16:
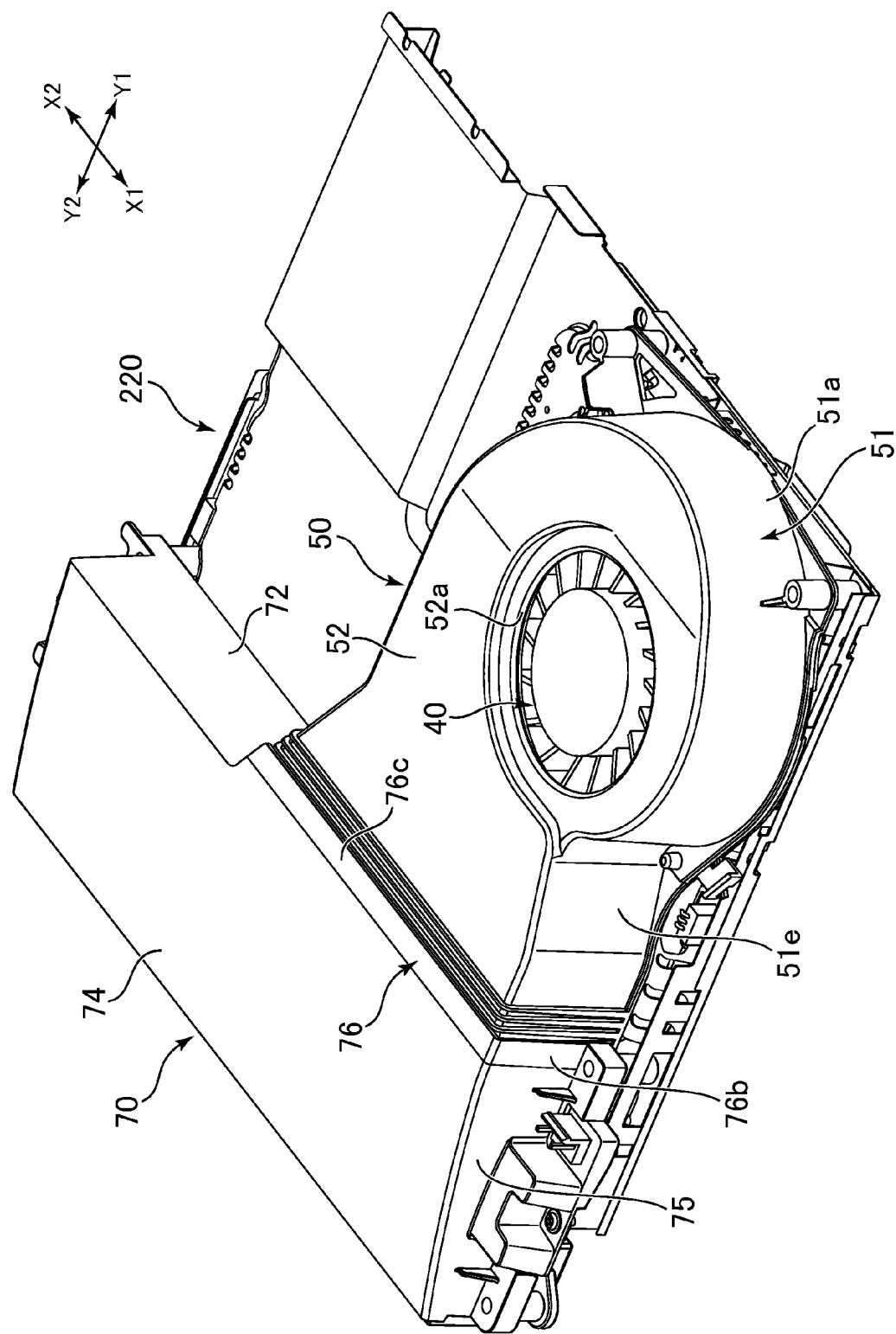
FIG. 16 a perspective view illustrating a modification of an upper frame included in the electronic apparatus.
Figure 17:
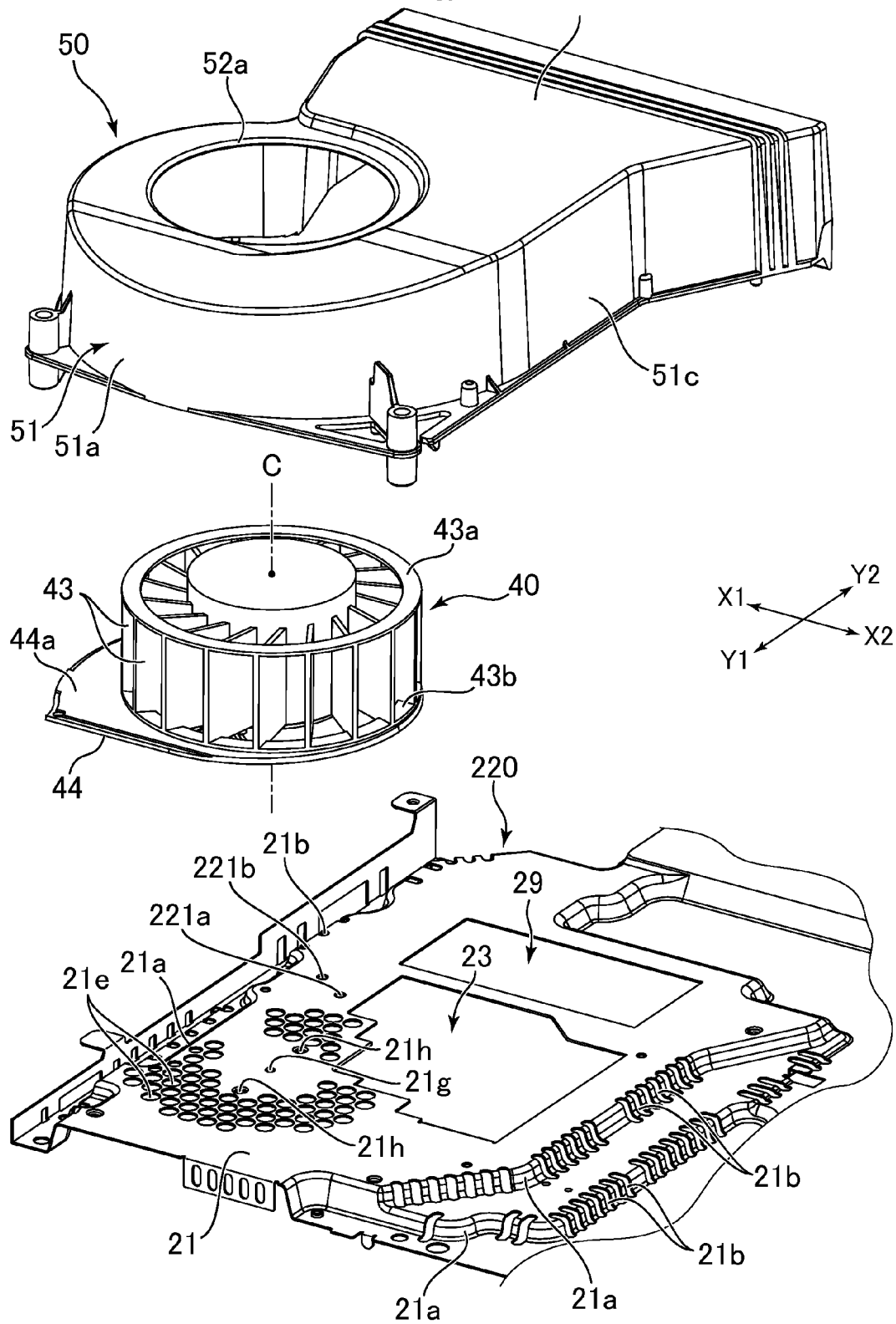
FIG. 17 an exploded perspective view of a cover, a cooling fan, and the upper frame for explaining the modification of the upper frame included in the electronic apparatus.
Figure 18:
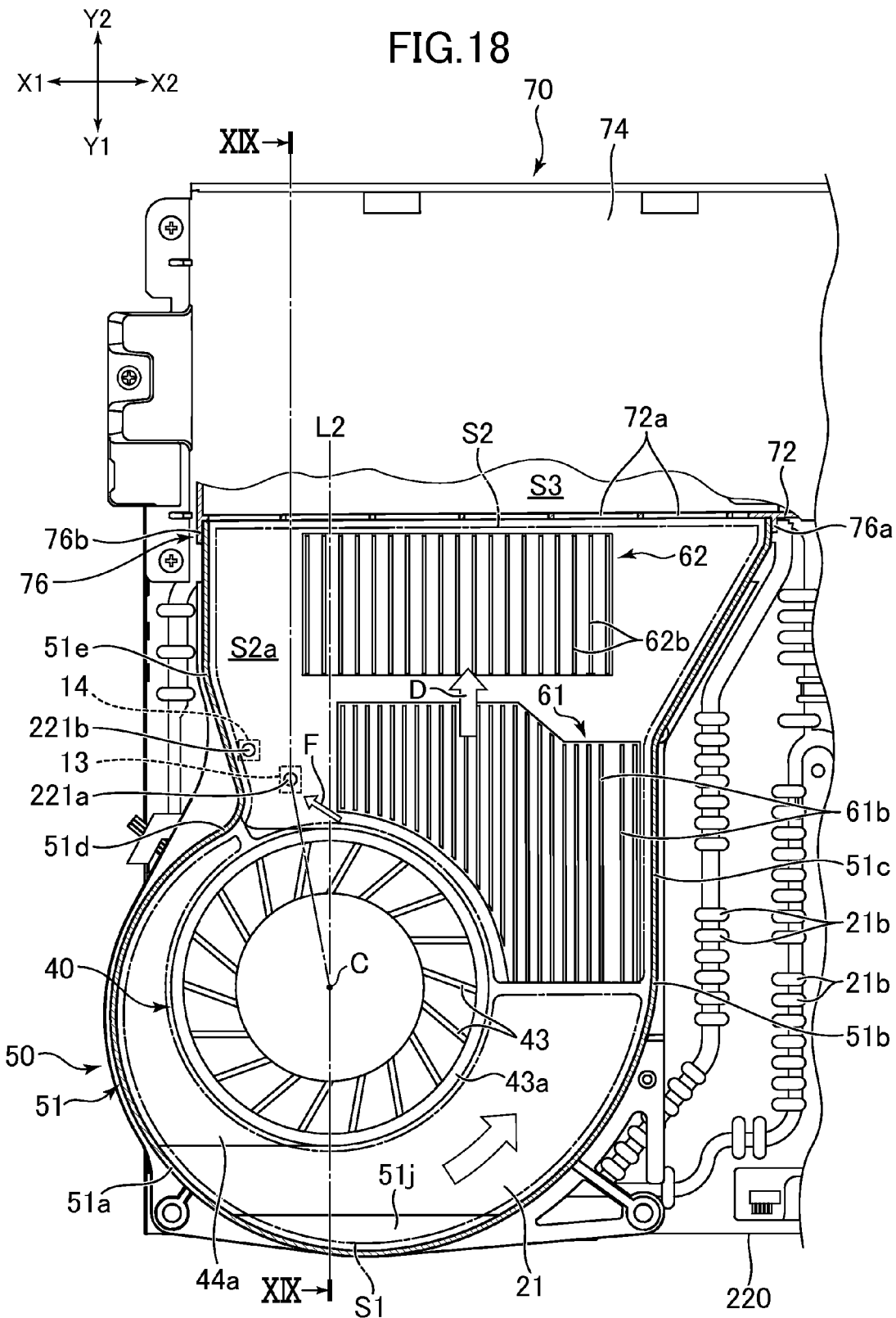
FIG. 18 a plan view of devices illustrated in FIG. 16, wherein the inside of the cover is illustrated.
Figure 19:
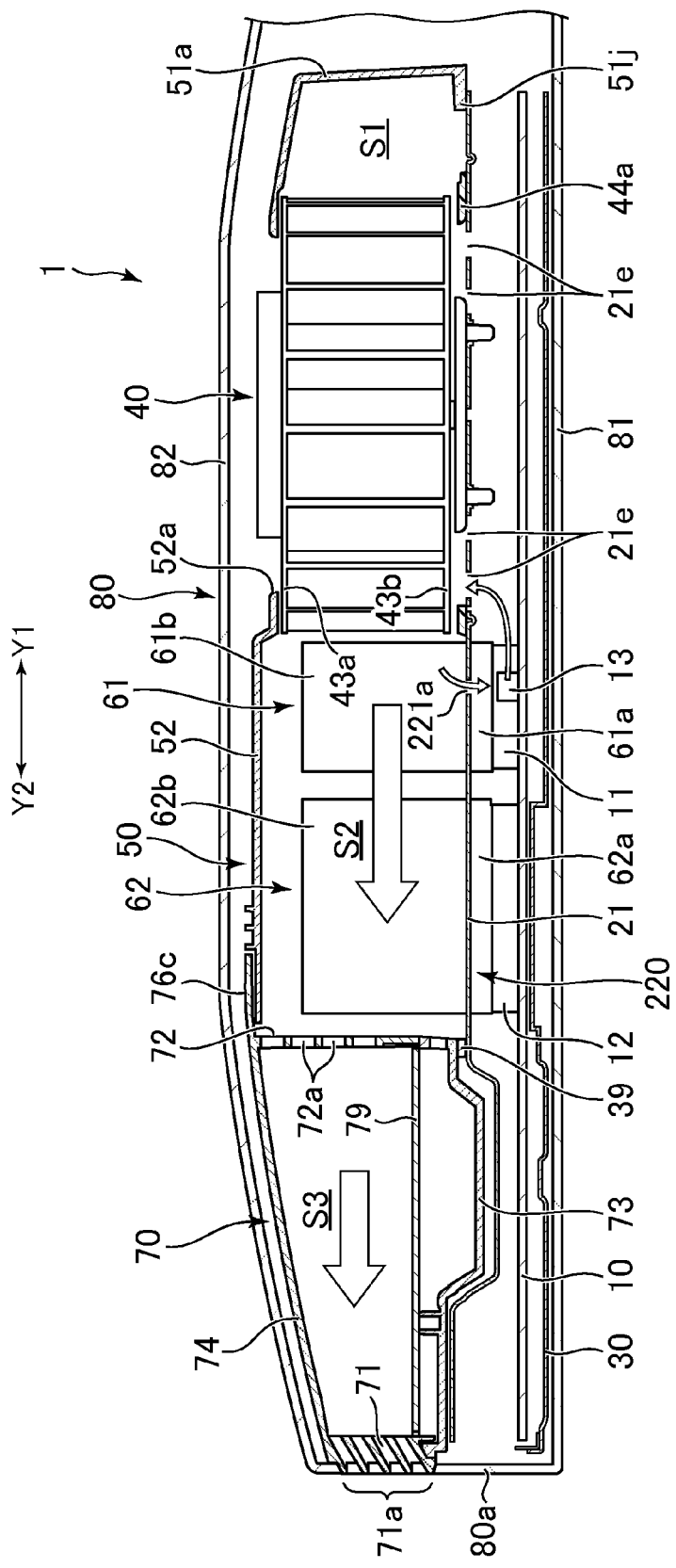
FIG. 19 a sectional view taken along a XIX-XIX line illustrated in FIG. 18.

FIGS. 15A and 15B are diagrams illustrating the external appearance of an electronic apparatus according to an embodiment of the present invention. FIG. 15A is a perspective view and FIG. 15B is a bottom view. FIGS. 16 to 19 are diagrams for explaining a modification of an upper frame included in the electronic apparatus. FIG. 16 is a perspective view of devices incorporated in the electronic apparatus. FIG. 17 is an exploded perspective view of the cover 50, the cooling fan 40, and an upper frame 220 illustrated in FIG. 16. FIG. 18 is a plan view of the devices illustrated in FIG. 16, wherein the inside of the cover 50 is illustrated. FIG. 19 is a sectional view of the electronic apparatus taken along XIX-XIX line illustrated in FIG. 18.

In the following explanation, in FIGS. 15A to 19, a direction indicated by X1 is the left direction and a direction indicated by X2 is the right direction. A direction indicated by Y1 is the front direction and a direction indicated by Y2 is the rear direction.

An electronic apparatus 1 illustrated in FIGS. 15A and 15B includes a housing 80. The housing 80 in this example includes a housing lower portion 81 in a lower part thereof and includes a housing upper portion 82 in an upper part thereof. The electronic apparatus 1 is an electronic apparatus functioning as a game apparatus or a reproducing apparatus for a moving image. As illustrated in FIG. 15A, an insertion port 82c for inserting a recording medium such as an optical disc is formed in a front wall 82a of the housing upper portion 82. Buttons 8 functioning as a power button for the electronic apparatus 1 and an eject button for the recording medium are arranged on the front side of the insertion port 82c.

As illustrated in FIG. 15B, air intake openings 82d for leading the external air into the housing 80 are formed in the housing 80. In this example, the housing upper portion 82 has a size larger than the size of the housing lower portion 81. An outer peripheral portion 82b of the housing upper portion 82 is located on the outer side of the upper edge of the housing lower portion 81. The air intake openings 82d are formed in the outer peripheral portion 82b of the housing upper portion 82. In particular, the air intake openings 82d are formed in the lower surface of the outer peripheral portion 82b. The air is led into the housing 80 through the air intake openings 82d by the driving of the cooling fan 40.

As illustrated in FIGS. 18 and 19, the circuit board 10 is housed in the housing 80. A plurality of electronic parts are mounted on the circuit board 10. On the circuit board 10 in this example, electronic parts 13 and 14 are mounted in addition to the IC chips 11 and 12 explained above. The electronic parts 13 and 14 are parts that emit heat during the operation thereof such as a transistor and a coil.

As illustrated in FIGS. 16 and 19, the electronic apparatus 1 includes the plate-like upper frame 220 covering one surface (in this example, the upper surface) of the circuit board 10. The upper frame 220 has a size substantially equal to the size of the circuit board 10. The circuit board 10 and the upper frame 220 are fixed by fastening members such as screws or bolts. Similarly to the upper frame 20, the upper frame 220 is a member formed of a metal plate member. As illustrated in FIG. 19, the electronic apparatus 1 includes the plate-like lower frame 30 covering the lower surface of the circuit board 10.

The electronic apparatus 1 includes the cooling fan 40 arranged on the upper side of the circuit board 10. As in the example explained above, the cooling fan 40 in this example is arranged on the upper frame 220 in a posture in which the rotation axis C thereof is perpendicular to the circuit board 10. The cooling fan 40 includes the plurality of fins 43 arranged in the circumferential direction spaced apart from one another. As illustrated in FIG. 17, the cooling fan 40 includes an upper ring portion 43a that couples upper edges of the outer circumferential portions of the fins 43. With this structure, it is possible to suppress the air from passing through a gap between the edge of the opening 52a (see FIG. 16, hereinafter referred to as air intake opening) of the cover 50 and the fins 43. The cooling fan 40 in this example includes the lower ring portion 43b that couples lower edges of the outer circumferential portions of the fins 43. With this structure, it is possible to suppress the air from passing through a gap between the fan plate portion 44 (hereinafter referred to as bottom plate portion) and the fins 43.

As illustrated in FIG. 16, the electronic apparatus 1 includes a case 70. The case 70 in this example houses a power supply circuit 79 (see FIG. 19). As explained below, the case 70 functions as a wall member of a third air flow path S3 through which an air flow formed by the cooling fan 40 flows. The case 70 in this example is formed in a substantially rectangular parallelepiped shape elongated in the left-right direction.

As illustrated in FIG. 19, the electronic apparatus 1 includes an exhaust opening (a ventilation opening in claims) 71a opened toward the outer side of the housing 80. An opening is formed in a rear wall 80a of the housing 80. The case 70 is arranged in a rear portion of the housing 80. A rear wall 71 of the case 70 is fit in the opening of the rear wall 80a of the housing 80. An exhaust opening 71a is formed in the rear wall 71 of the case 70. A louver for shielding the inside of the case 70 from the outside is formed in the exhaust opening 71a. The structure of the exhaust opening 71a is not limited to the structure explained above. For example, an exhaust opening may be formed in the rear wall 80a itself of the housing 80.

As illustrated in FIGS. 18 and 19, an air flow path (flow paths indicated by S1, S2, and S3 in the figures) through which the air flow formed by the cooling fan 40 flows is defined in the housing 80. The air flow path extends from the cooling fan 40 to the exhaust opening 71a. In other words, the air led into the housing 80 through the air intake openings 82d flows into the cooling fan 40 and thereafter flows out to the air flow path indicated by S1, S2, and S3. The exhaust opening 71a is located at a downstream end of the air flow path. The air passing through the air flow path is emitted to the outside from the exhaust opening 71a.

The cover 50, the case 70, and the upper frame 220 function as outer walls of the air flow path. The air flow path is separated from the other spaces in the housing 80 by the upper frame 220, the cover 50, and the case 70. In other words, the upper frame 220, the cover 50, and the case 70 are formed to prevent the air in the air flow path from flowing out from the air flow path before reaching the exhaust opening 71a except flow-out from vent holes 221a and 221b explained below. In the air flow path, the heat sinks 61 and 62 and the power supply circuit 79 are arranged. Since the air flow path is separated from the other spaces in the housing 80, it is possible to efficiently cool the heat sinks 61 and 62 and the power supply circuit 79.

As explained above, the air flow path includes the first air flow path S1 and the second air flow path S2 that continue to the first air flow path S1. The air flow paths S1 and S2 are formed on the upper frame 220. The air in the air flow paths S1 and S2 flows in a direction extending along the upper frame 220. The cover 50 has a shape for covering the cooling fan 40 and the air flow paths S1 and S2. The cover 50 separates the air flow paths S1 and S2 from the other spaces in the housing 80 together with the upper frame 220. The circuit board 10 is located on the outer side of a wall member that defines the air flow paths S1 and S2. In this example, the circuit board 10 is located on the lower side of the upper frame 220 and arranged along the upper frame 220.

As explained above, the upper frame 220 includes the mounted plate portion 21 on which the cooling fan 40 and the cover 50 are arranged (see FIG. 17). As illustrated in FIGS. 18 and 19, the air flow paths S1 and S2 are defined by the mounted plate portion 21 and the cover 50. The mounted plate portion 21 is located higher than the other portions of the upper frame 220. The mounted plate portion 21 has a clearance between the mounted plate portion 21 and the circuit board 10. The electronic parts 13 and 14 and the IC chips 11 and 12 are covered by the mounted plate portion 21.

The cover 50 includes the upper wall portion 52 opposed to the mounted plate portion 21. In the upper wall portion 52, the air intake opening 52a located above the cooling fan 40 is formed. The air intake opening 52a has an inner diameter corresponding to the diameter of the cooling fan 40.

As illustrated in FIGS. 17 and 18, the cover 50 includes the side wall portion 51 descending from the outer edge of the upper wall portion 52 toward the mounted plate portion 21. The lower edge of the side wall portion 51 is located on the mounted plate portion 21. The side wall portion 51 in this example includes the curved wall portion 51a curved along the outer circumference of the cooling fan 40. The first air flow path S1 is formed between the curved wall portion 51a and the cooling fan 40 and is formed along the outer circumference of the cooling fan 40. As illustrated in FIG. 18, the curved wall portion 51a is curved such that a flow path cross-sectional area of the first air flow path S1 gradually increases toward downstream. In other words, a distance from the rotation axis C of the cooling fan 40 to the curved wall portion 51a gradually increases in the circumferential direction of the cooling fan 40. Therefore, a distance from the rotation axis C to the terminal portion 51b, which is one end of the curved wall portion 51a, is larger than a distance to the start portion 51d, which is the other end of the curved wall portion 51a.

As explained above, the lower edge of the curved wall portion 51a is partially located on the outer side of the outer edge of the mounted plate portion 21. A gap between the lower edge of the curved wall portion 51a and the mounted plate portion 21 is closed by a member different from the upper frame 220. In this example, as illustrated in FIGS. 17 and 18, the bottom plate portion 44 includes the spreading portion 44a. A gap between the lower edge of the left portion of the curved wall portion 51a and the mounted plate portion 21 is closed by the spreading portion 44a. As illustrated in FIGS. 18 and 19, a bottom plate portion 51j spreading toward the inside of the curved wall portion 51a is formed at the lower edge of the curved wall portion 51a. A gap between the lower edge of the front side portion of the curved wall portion 51a and the mounted plate portion 21 is closed by the bottom plate portion 51j. Therefore, the bottom surface of the first air flow path S1 is closed by the mounted plate portion 21 and the bottom plate portions 44 and 51j.

As illustrated in FIG. 18, the side wall portion 51 includes the first side wall portion 51c extending from the terminal portion 51b. The side wall portion 51 includes a second side wall portion 51e opposed to the first side wall portion 51c. The second air flow path S2 is formed between the first side wall portion 51c and the second side wall portion 51e. The first side wall portion 51c extends from the terminal portion 51b in a flowing direction of the air (hereinafter, air flow direction D) in the second air flow path S2. The air flow direction D is a direction of the flow of the air in the second air flow path S2 in a broad view. In this example, the air flow direction D is a direction (in this example, the rear direction) from the downstream end of the first air flow path S1 toward the case 70. A downstream portion of the first side wall portion 51c inclines in a direction orthogonal to the air flow direction D such that a flow path cross-sectional area of the second air flow path S2 gradually increases toward downstream. As illustrated in FIG. 18, the second side wall portion 51e is located on the opposite side of the first side wall portion 51c across a straight line L2 extending along the air flow direction D through the rotation axis C of the cooling fan 40. Therefore, the flow path cross-sectional area of the second air flow path S2 is larger than a flow path cross-sectional area at the downstream end of the first air flow path S1. The second side wall portion 51e in this example is connected to the start portion 51d of the curved wall portion 51a.

As illustrated in FIG. 17, the upper frame 220 includes the steps 21a that surround the mounted plate portion 21. The steps 21a are located on the outer side of the lower edge of the side wall portion 51 of the cover 50. The plurality of through holes 21b are formed in the steps 21a. The plurality of through holes (air intake holes) 21e located on the lower side of the cooling fan 40 are formed in the mounted plate portion 21. All the plurality of through holes 21e are located on the inner side of the outer circumferential portion of the cooling fan 40.

The air flows in the housing 80 as explained below. The air led into the housing 80 through the air intake openings 82d (see FIG. 15B) flows into the cooling fan 40 from both the upper side and the lower side of the cooling fan 40. In other words, a part of the air flows into the cooling fan 40 through the intake opening 52a formed in the upper wall portion 52 of the cover 50 (see FIG. 17). Another part of the led-in air flows to between the circuit board 10 and the mounted plate portion 21 through the through holes 21b formed in the steps 21a. The air flows into the cooling fan 40 through the through holes 21e on the lower side of the cooling fan 40 (see FIGS. 17 and 19). The air which flows into the cooling fan 40 is blown out in the radial direction of the cooling fan 40. The air flowing out from the cooling fan 40 toward the curved wall portion 51a, i.e., an air flowing toward the front side reaches the second air flow path S2 through the first air flow path S1 (see FIG. 18). The other air flowing out from the cooling fan 40, i.e., the air flowing out from the cooling fan 40 to the rear side directly flows to the second air flow path S2. Since the air is forcibly discharged by the driving of the cooling fan 40, the air pressure in the air flow paths S1 and S2 is high compared with the air pressure in the other spaces in the housing 80. Therefore, it is possible to smoothly send the air to the circuit board 10 side through the vent holes 221a and 221b explained below. Since the flow path cross-sectional area of the first air flow path S1 is smaller than the flow path cross-sectional area of the second air flow path S2, the air pressure in the first air flow path S1 is particularly high. The third air flow path S3 defined by the case 70 continues to the second air flow path S2. The air reaching the third air flow path S3 from the second air flow path S2 is discharged to the outside of the housing 80 from the exhaust opening 71a of the case 70 described above.

As illustrated in FIG. 18, the plurality of (in this example, two) heat sinks 61 and 62 are arranged in the second air flow path S2. The second heat sink 62 is located downstream of the first heat sink 61. That is, the second heat sink 62 is located in the air flow direction D from the first heat sink 61. The heat sinks 61 and 62 respectively include pluralities of fins 61b and 62b erected on the heat receiving blocks 61a and 62b and arranged spaced apart from one another. The fins 61b and 62b are located in the second air flow path S2 and cooled by the air flowing through the second air flow path S2. The fins 61b and 62b are arranged in parallel to the air flow direction D. A portion (in this example, the right portion) of the first heat sink 61 is located in the air flow direction D from the downstream end of the first air flow path S1. The other portion (in this example, the left portion) of the first heat sink 61 is located in the air flow direction D from the cooling fan 40. The plurality of fins 61b in the other portion is arranged along the outer circumference of the cooling fan 40.

In the mounted plate portion 21, as illustrated in FIG. 17, the openings 23 and 29 having sizes corresponding to the heat sinks 61 and 62 are formed. The heat sinks 61 and 62 are fit in the openings 23 and 29 to close the openings 23 and 29. The openings 23 and 29 in this example have shapes corresponding to the heat receiving blocks 61a and 62a. The openings 23 and 29 are closed by the heat receiving blocks 61a and 61a. Therefore, the outflow of the air from the openings 23 and 29 is suppressed.

The circuit board 10 is located on the outer side of the air flow path defined by the upper frame 220, the cover 50, and the case 70. In this example, as explained above, the circuit board 10 is located on the lower side of the upper frame 220 and arranged along the upper frame 220. As illustrated in FIGS. 18 and 19, the vent holes 221a and 221b opened toward the electronic parts 13 and 14 on the circuit board 10 are formed in the mounted plate portion 21 provided in the upper frame 220. A part of the air flowing through the air flow path flows out toward the circuit board 10 through the vent holes 221a and 221b. The electronic parts 13 and 14 can be cooled by the air. An air flow to the through holes 21e formed on the lower side of the cooling fan 40 is formed between the mounted plate portion 21 and the circuit board 10. The air flowing out to the circuit board 10 side through the vent holes 221a and 221b returns to the cooling fan 40 through the through holes 21e after cooling the electronic parts 13 and 14.

In this example, a plurality of (specifically, two) vent holes 221a and 221b are formed in the mounted plate portion 21. The vent holes 221a and 221b are located in the second air flow path S2. The positions of the two vent holes 221a and 221b deviate from each other in the direction orthogonal to the air flow direction D in the second air flow path S2 as illustrated in FIG. 18. Specifically, one vent hole 221b is located away from a straight line in the air flow direction D passing through the other vent hole 221a. With this layout of the two vent holes 221a and 221b, the air flowing out from the vent hole on the upstream (in this example, the vent hole 221a) is less likely to affect an amount of the air supplied to the electronic part 14 through the vent hole on the downstream (in this example, the vent hole 221b). It is possible to suppress a decrease in the amount of the air supplied to the electronic part 14.

As illustrated in FIGS. 18 and 19, the vent holes 221a and 221b overlap the electronic parts 13 and 14 in a direction in which the mounted plate portion 21 and the circuit board 10 face each other (in this example, the vertical direction). Specifically, the position of the vent hole 221a is defined such that a vertical line passing any portion of the electronic part 13 (a straight line perpendicular to the circuit board 10) passes the inner side of the vent hole 221a. Similarly, the position of the vent hole 221b is defined such that a vertical line passing any portion of the electronic part 14 passes the inner side of the vent hole 221b. With this layout, it is possible to efficiently send the air respectively to the electronic parts 13 and 14 through the vent holes 221a and 221b. In this example, the vent holes 221a and 221b are respectively located right above the electronic parts 13 and 14. In other words, the centers of the vent holes 221a and 221b are located on vertical lines passing the centers of the electronic parts 13 and 14. As explained above, the upper frame 220 and the circuit board 10 are fixed to each other by screws or the like. Therefore, positional deviation between the electronic parts 13 and 14 and the vent holes 221a and 221b is suppressed.

The temperature of the air rises when the air passes through the heat sinks 61 and 62. Therefore, as illustrated in FIG. 18, the vent holes 221a and 221b in this example are formed in positions avoiding regions on the downstream of the heat sinks 61 and 62 in the air flow path. Consequently, it is possible to sent the air having low temperature to the electronic parts 13 and 14.

In this example, the positions of the vent holes 221a and 221b deviate from the positions of the heat sinks 61 and 62 in the direction orthogonal to the air flow direction D. With this arrangement of the vent holes 221a and 221b, it is possible to suppress a decrease in an amount of the air passing through the heat sinks 61 and 62 compared with, for example, structure in which the vent holes 221a and 221b are located in the first air flow path S1. The vent holes 221a and 221b are located in the air flow direction D from the cooling fan 40. In this example, the vent holes 221a and 221b are located on the rear side of the cooling fan 40. Therefore, the air directly flowing from the cooling fan 40 to the second air flow path S2 is sent to the electronic parts 13 and 14 through the vent holes 221a and 221b.

As explained above, the second air flow path S2 has a flow path cross-sectional area larger than the flow path cross-sectional area of the first air flow path S1. The second air flow path S2 in this example has a flow path cross-sectional area larger than the flow path cross-sectional area at the downstream end of the first air flow path S1 having the largest flow path cross-sectional area in the first air flow path S1. The heat sinks 61 and 62 and the vent holes 221a and 221b are located in the second air flow path S2 having such a large flow path cross-sectional area. Therefore, it is easy to lay out the heat sinks 61 and 62 and the vent holes 221a and 221b.

As illustrated in FIG. 18, the first heat sink 61 is arranged away from the second side wall portion 51e and close to the first side wall portion 51c. In this example, the first heat sink 61 is arranged along the first side wall portion 51c. The space S2a is formed between the second side wall portion 51e and the fins 61b of the first heat sink 61. The vent holes 221a and 221b are located in the space S2a. With such arrangement of the heat sink 61 and the vent holes 221a and 221b, it is possible to send a sufficient amount of the air to the electronic parts 13 and 14 through the vent holes 221a and 221b while sending the air having high speed, which flows out from the first air flow paths S1, to the heat sink 61.

The distance between the second side wall portion 51e and the fins 61b of the heat sink 61, i.e., the width of the space S2a is larger than the gap between the first side wall portion 51c and the fins 61b of the heat sink 61.

As illustrated in FIG. 18, since the fins 62b of the heat sink 62 are also located away from the second side wall portion 51e, the space S2a continues to the downstream end of the cover 50, in other words, the downstream end of the second air flow path S2. Therefore, a smoother air flow can be formed in the space S2a. In this example, the second side wall portion 51e is located on one side (in this example, the left side) from the straight line L2 passing the rotation axis C. On the other hand, the heat sinks 61 and 62 are offset to the other side (in this example, the right side) from the straight line L2. With this layout, it is easy to secure the width of the space S2a.

The cooling fan 40 in this example rotates in the left direction when driven. Therefore, as illustrated in FIG. 18, an air flow F oriented obliquely rearward and leftward is formed in a position right behind the cooling fan 40, i.e., in a position in the air flow direction D from the cooling fan 40. The second side wall portion 51e is formed to extend obliquely rearward and leftward. Therefore, the air flow F smoothly flows in the space S2a along the second side wall portion 51e even after hitting the second side wall portion 51e. The vent holes 221a and 221b are located in the space S2a. Thus, a smooth air flow flowing to the electronic parts 13 and 14 is easily formed.

The air flow path in the housing 80 further includes the third air flow path S3 following the second air flow path S2. The third air flow path S3 is a flow path defined by the case 70 connected to the cover 50. As illustrated in FIGS. 18 and 19, the case 70 in this example includes a front wall 72 located toward the cover 50. A plurality of vent holes 72a opened toward the second air flow path S2 are formed in the front wall 72. As explained above, the exhaust opening 71a is formed in the rear wall 71 of the case 70. The case 70 communicates with the outside through the vent holes 72a and the exhaust opening 71a. Thus, communication with the outside through portions other than the vent holes 72a and the exhaust opening 71a is restricted. The case 70 has a box shape and has a bottom wall 73, an upper wall 74, and a side wall 75 besides the front wall 72 and the rear wall 71.

The case 70 is connected to the cover 50 to prevent the air from leaking from between the cover 50 and the case 70. In this example, a flange 76 projecting toward the cover 50 is formed on the front wall 72. The flange 76 is formed along the downstream end of the cover 50. Specifically, the flange 76 includes a first side portion 76a formed along the downstream end of the first side wall portion 51c, a second side portion 76b formed along the downstream end of the second side wall portion 51e, and an eaves portion 76c that covers the downstream end of the upper wall portion 52. A seal member (not shown in the figure) is arranged between the eaves portion 76c and the upper wall portion 52. The lower edge of the front wall 72 is located on the mounted plate portion 21. A seal member 39 is arranged between the lower edge of the front wall 72 and the mounted plate portion 21 as well. The vent holes 72a are formed on the inner side of the flange 76. In this example, the air in the second air flow path S2 is suppressed from flowing out to portions other than the third air flow path S3 by such connection structure of the cover 50 and the case 70.

As explained above, the heat sinks 61 and 62 are arranged in the air flow path formed in the housing 80. The electronic parts 13 and 14 are arranged on the circuit board 10 located on the outside of the air flow path. The vent holes 221a and 221b opened toward the electronic parts 13 and 14 are formed in the upper frame 220 functioning as the wall member of the air flow path. With such an electronic apparatus 1, it is possible to not only cool the heat sinks 61 and 62 but also cool the electronic parts 13 and 14 with simple structure.

The upper frame 220 includes the mounted plate portion 21 facing the circuit board 10. The vent holes 221a and 221b respectively overlap the electronic parts 13 and 14 in the direction in which the mounted plate portion 21 and the circuit board 10 face each other. With this structure, it is possible to efficiently send the air respectively to the electronic parts 13 and 14 through the vent holes 221a and 221b.

In particular, in the electronic apparatus 1, the vent holes 221a and 221b are located right above the electronic parts 13 and 14. Consequently, it is possible to more efficiently send the air to the electronic parts 13 and 14.

The upper frame 220 and the circuit board 10 are fixed to each other. With this structure, it is possible to suppress positional deviation between the vent holes 221a and 221b and the electronic parts 13 and 14.

The vent holes 221a and 221b are formed in positions avoiding regions on the downstream side of the heat sinks 61 and 62 in the air flow path. With such a layout, it is possible to supply the air having low temperature to the electronic parts 13 and 14.

The positions of the vent holes 221a and 221b deviate from the heat sinks 61 and 62 in a direction orthogonal to the air flow direction in the air flow path. With this arrangement, it is possible to suppress an amount of the air flowing through the heat sinks 61 and 62 from decreasing.

The cooling fan 40 is arranged such that the rotation axis C thereof is perpendicular to the circuit board 10. The air flow path includes the first air flow path S1 formed in the outer circumference of the cooling fan 40 and the second air flow path S2 following the first air flow path S1 and having a flow path cross-sectional area larger than the flow path cross-sectional area of the first air flow path S1. The heat sinks 61 and 62 and the vent holes 221a and 221b are located in the second air flow path S2. With this structure, the heat sinks 61 and 62 and the vent holes 221a and 221b are arranged in the second air flow path S2 having a large flow path cross-sectional area. Therefore, it is easy to lay out the heat sinks 61 and 62 and the vent holes 221a and 221b.

The positions of the vent holes 221a and 221b deviate from the heat sinks 61 and 62 in the direction orthogonal to the air flow direction D in the second air flow path S2. With this arrangement, it is possible to suppress an amount of the air flowing through the heat sinks 61 and 62 from decreasing.

Pluralities of vent holes 221a and 221b are formed in the upper frame 220. With this structure, it is possible to increase cooling performance for the electronic parts 13 and 14.

The positions of the vent holes 221a and 221b deviate from each other in the direction orthogonal to the air flow direction D in the second air flow path S2. With this layout, the air flowing out from the vent hole on the upstream (in this example, the vent hole 221a) is less likely to affect an amount of the air supplied to the electronic part 14 through the vent hole on the downstream (in this example, the vent hole 221b). It is possible to suppress a decrease in the amount of the air supplied to the electronic part 14.

In the example explained above, the heat sinks 61 and 62 are arranged in the air flow path. However, devices different from the heat sinks may be arranged in the air flow path as devices for cooling the electric parts with the air flowing through the air flow path.

The electronic apparatus 1 includes the upper frame 220, the cover 50, and the case 70 as the wall members that define the air flow path. However, the wall members are not limited to the upper frame 220, the cover 50, and the case 70. For example, the case 70 does not always have to be provided in the electronic apparatus. In this case, the downstream end of the cover 50 is connected to the exhaust opening 71a opened toward the outer side of the housing 80.

The air flow path indicated by S1, S2, and S3 functions as the exhaust flow path which is on the downstream from the cooling fan 40. However, an air intake flow path separated from the other spaces in the housing by wall members may be provided as a flow path on the upstream of the cooling fan.

The electronic apparatus 1 includes the two vent holes 221a and 221b as the vent holes for sending the air to the two electronic parts 13 and 14. However, the electronic apparatus 1 may include one vent hole for sending the air to the two electronic parts 13 and 14. In this case, the one vent hole may be formed in a position in the middle between the electronic parts 13 and 14.

Flanges extending toward the electronic parts 13 and 14 may be formed at the edges of the vent holes 221a and 221b. With this structure, the air flow from the vent holes 221a and 221b to the electronic parts 13 and 14 can be guided by the flanges.

Figure 20:
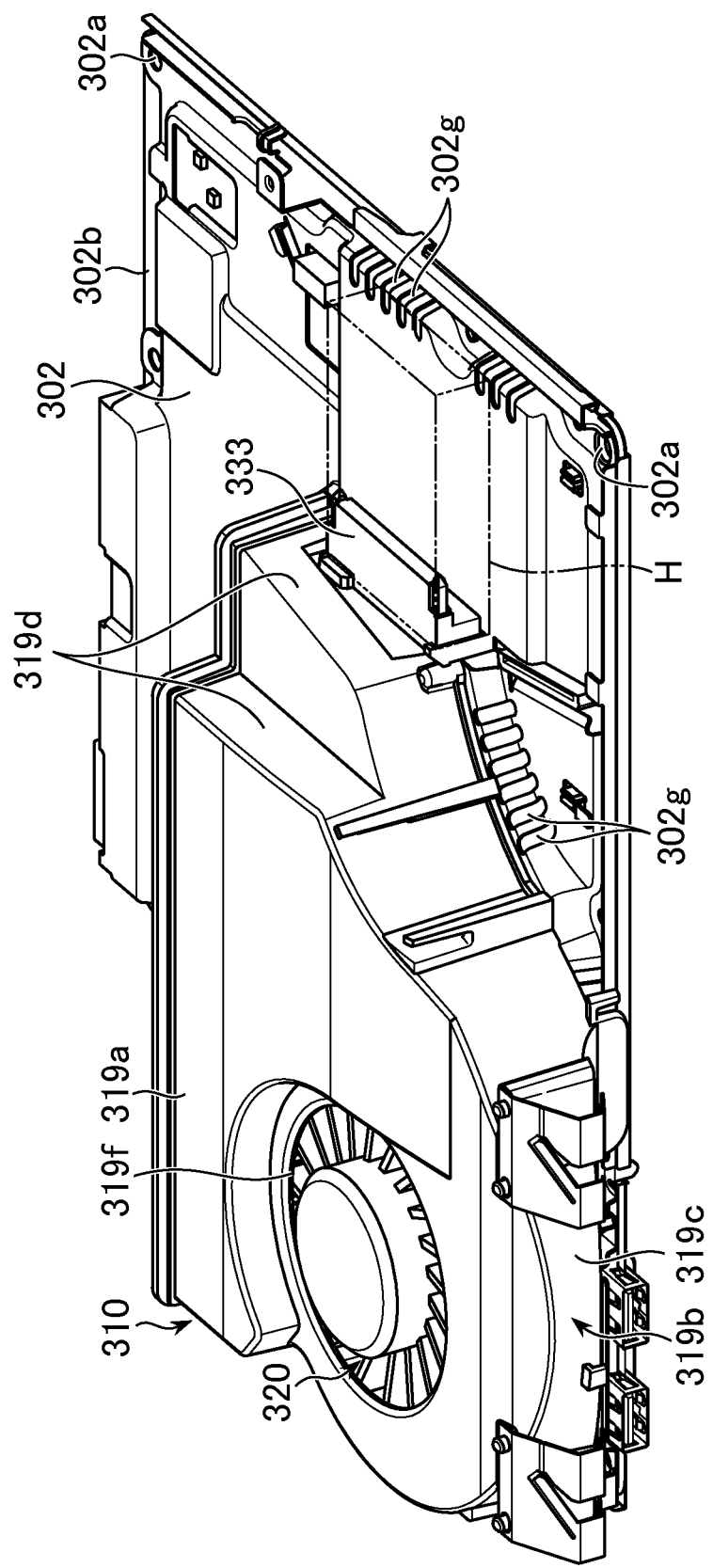
FIG. 20 a perspective view of another example of the devices included in the electronic apparatus according to the embodiment of the present invention.
Figure 21:
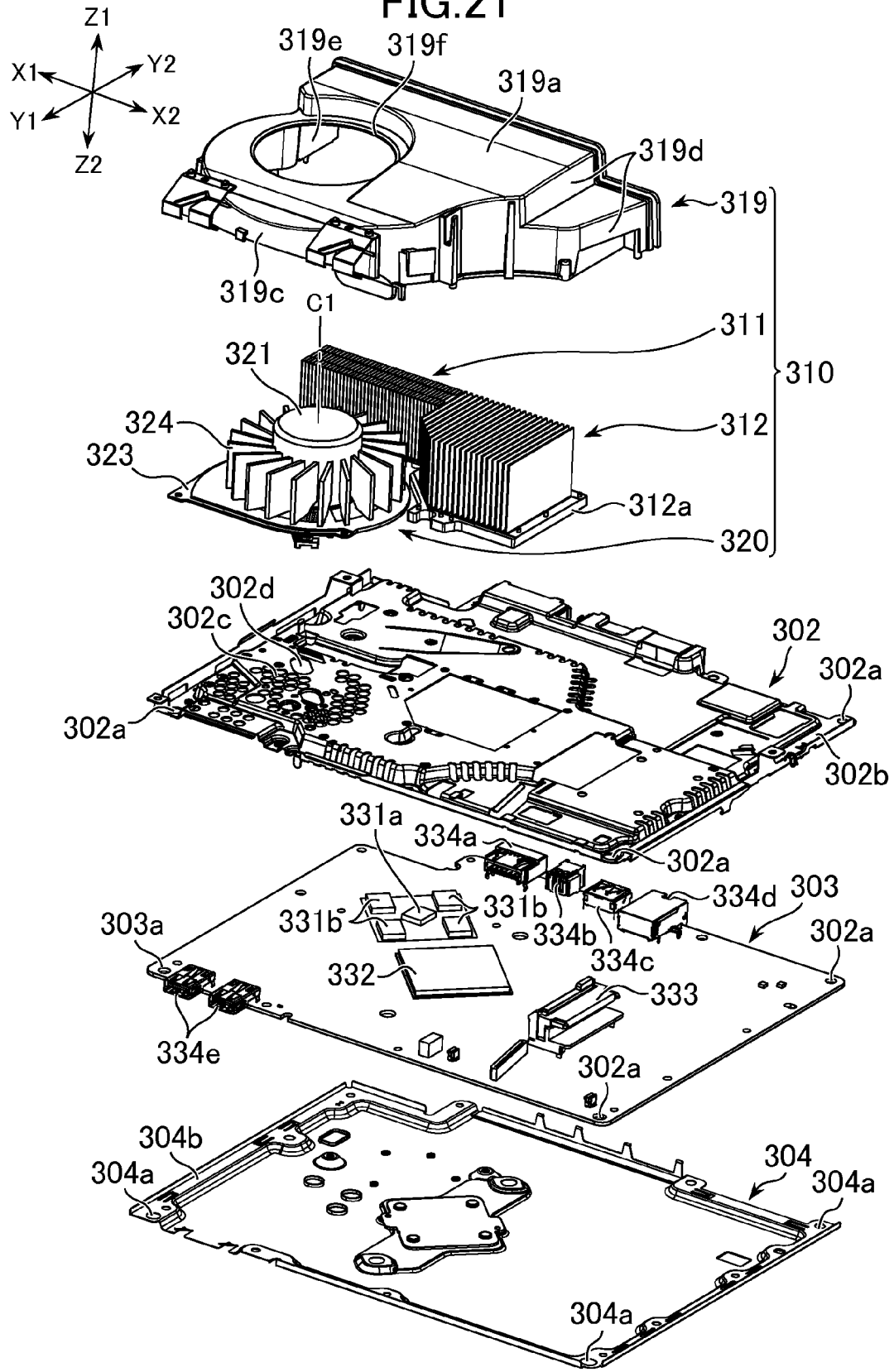
FIG. 21 an exploded perspective view of the devices and parts illustrated in FIG. 20.
Figure 22:
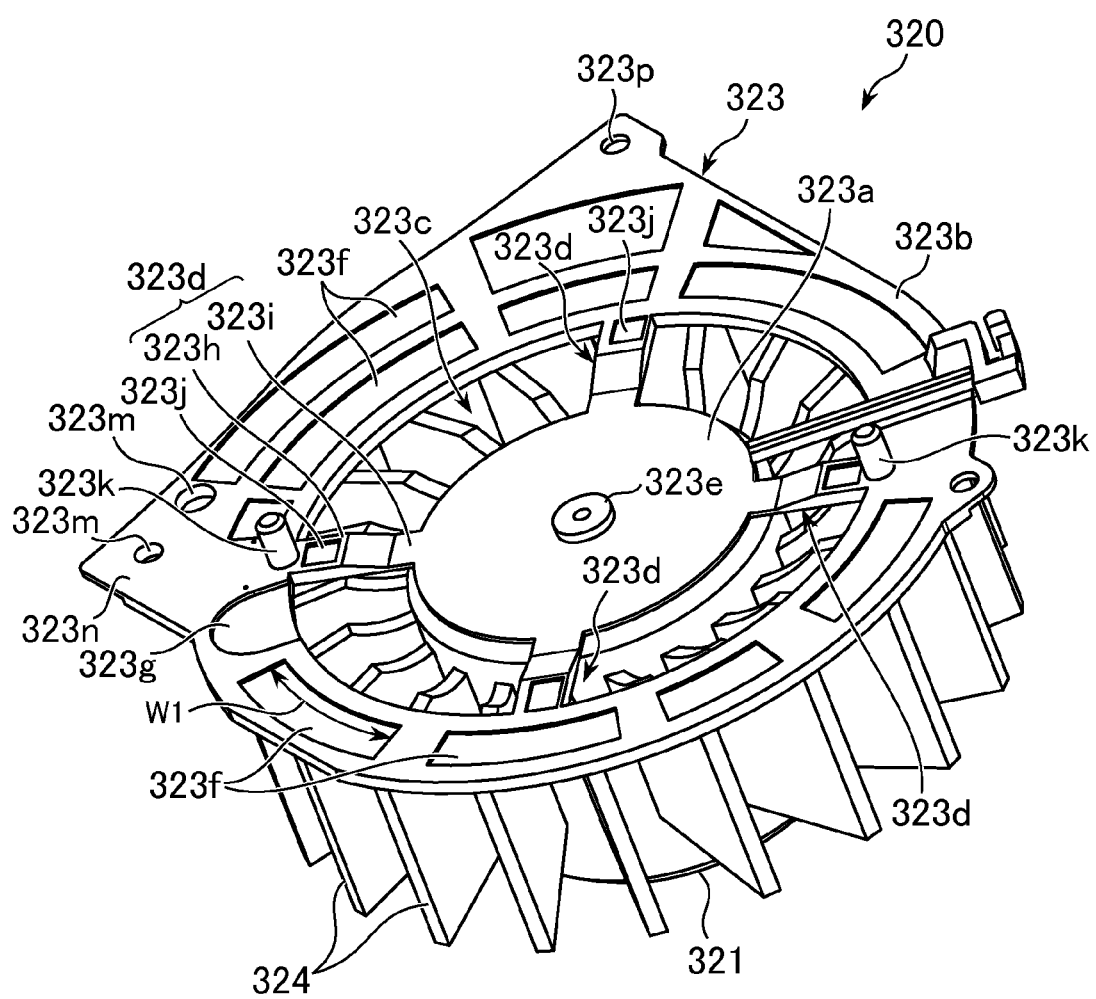
FIG. 22 a perspective view of a cooling fan included in a cooling unit illustrated in FIG. 21, wherein the bottom surface of the cooling fan is illustrated.
Figure 23:
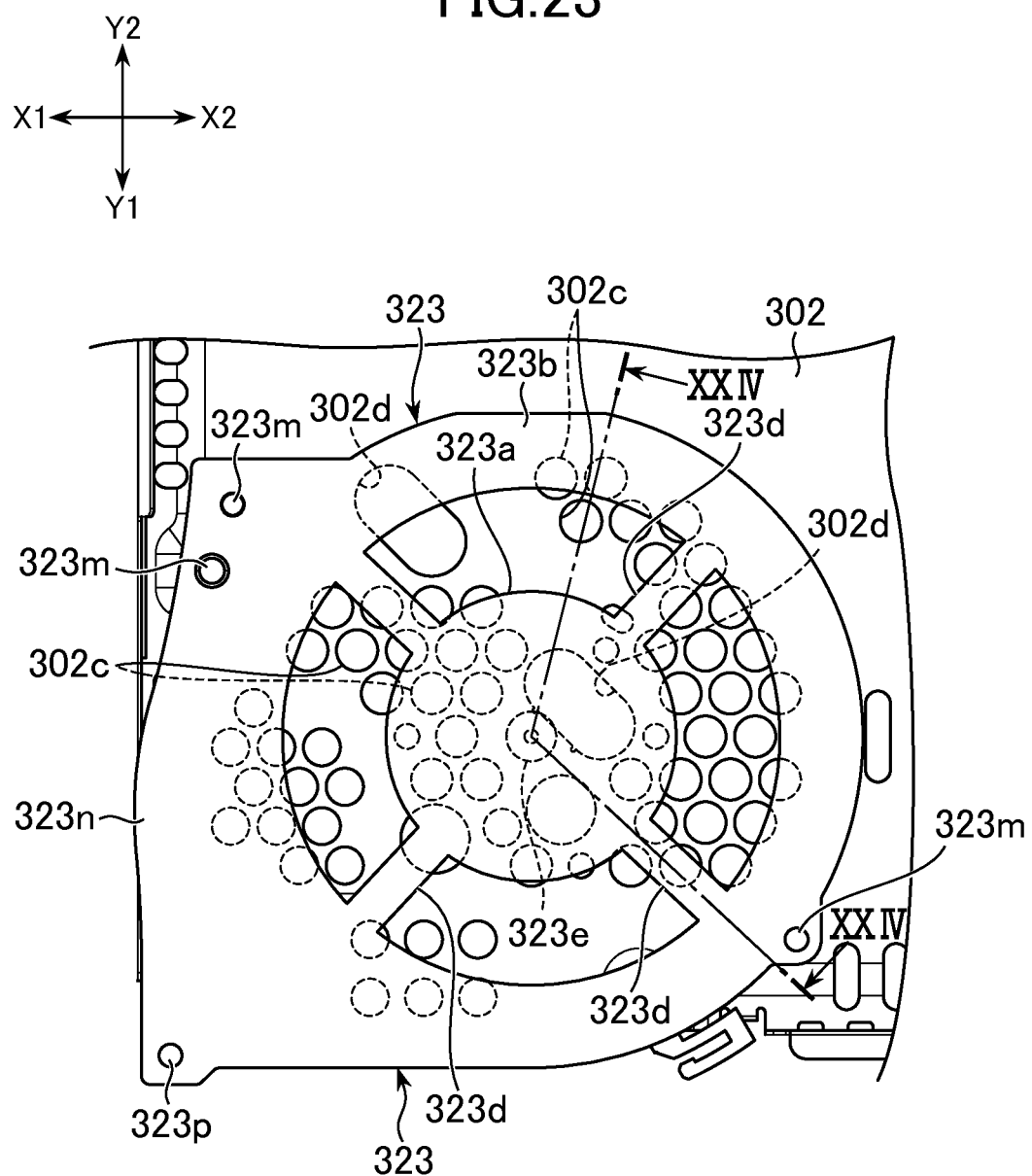
FIG. 23 a plan view illustrating a positional relation between a base plate and an upper frame included in the cooling fan illustrated in FIG. 22.
Figure 24:
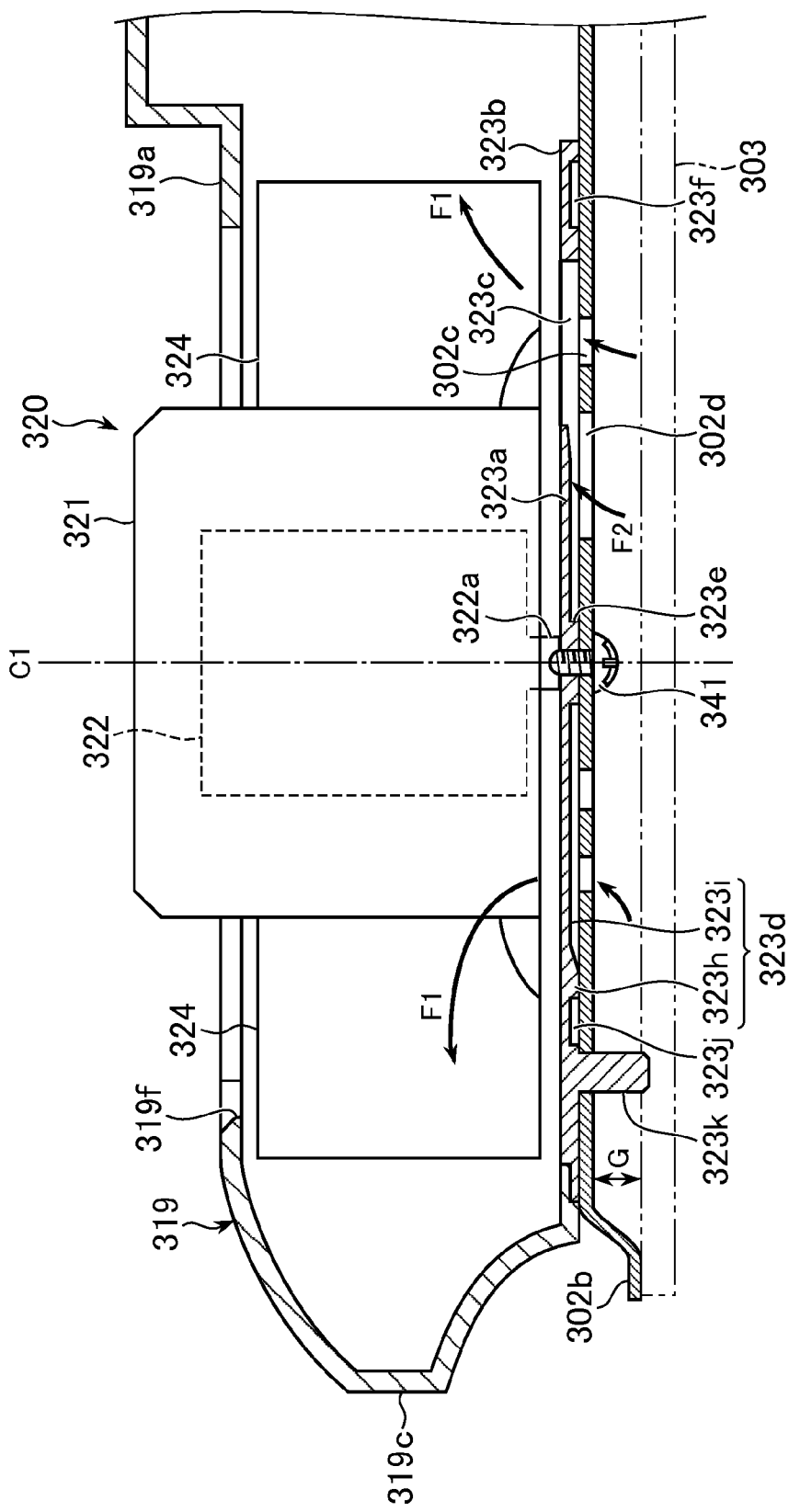
FIG. 24 a sectional view of the cooling unit taken along a XXIV-XXIV line illustrated in FIG. 23.

FIG. 20 is a perspective view of a modification of the devices included the electronic apparatus according to an embodiment of the present invention. In FIG. 20, a cooling unit 310 arranged on an upper frame 302 is illustrated. FIG. 21 is an exploded perspective view of the devices and parts illustrated in FIG. 20. FIG. 22 is a perspective view of a cooling fan 320 included in the cooling unit 310. In the figure, the bottom surface of the cooling fan 320 is illustrated. FIG. 23 is a plan view illustrating a positional relation between a base plate 323 included in the cooling fan 320 and the upper frame 302. FIG. 24 is a sectional view of the cooling unit 310 taken along a XXIV-XXIV line illustrated in FIG. 23. In the following explanation, X1 and X2 illustrated in the figures are respectively set as the left direction and the right direction, Y1 and Y2 illustrated in the figures are respectively set as the front direction and the rear direction, and Z1 and Z2 illustrated in the figures are respectively set as the upward direction and the downward direction. A structure illustrated in FIGS. 20 to 24 is substantially the same as the structure explained above. One of characteristics of the structure illustrated in the figures is the base plate 323 provided in the bottom portion of the cooling fan 320.

As illustrated in FIG. 21, the electronic apparatus in this example includes the cooling unit 310, the upper frame 302, a circuit board 303, and a lower frame 304. The cooling unit 310, the upper frame 302, the circuit board 303, and the lower frame 304 are combined and housed in a housing (e.g., the housing 80 explained above) as illustrated in FIG. 20. The electronic apparatus in this example is an entertainment apparatus that executes a computer program stored in an optical disk (not shown in the figure) or a hard disc drive H (see FIG. 20) set in the electronic apparatus and reproduces moving image data stored in the optical disc or the hard disc drive H.

An integrated circuit is mounted on one surface of the circuit board 303. In this example, as illustrated in FIG. 21, a plurality of integrated circuits 331a, 331b, and 332 are mounted on the upper surface of the circuit board 303. The integrated circuit 332 is, for example, a CPU (Central Processing Unit) that controls the entire electronic apparatus. The integrated circuit 331a is, for example, a GPU (Graphics Processing Unit). The integrated circuit 331b is, for example, a RAM (Random Access Memory) connected to the integrated circuit 331a. The electronic apparatus in this example includes a plurality of integrated circuits 331b. The integrated circuits 331b are arranged to surround the integrated circuit 331a and each connected to the integrated circuit 331a. In this example, connectors 334a to 334e are attached to the upper surface of the circuit board 303.

The upper frame 302 covers the upper surface of the circuit board 303. The upper frame 302 in this example has a size corresponding to the circuit board 303 and covers the entire upper surface of the circuit board 303. The size of the upper frame 302 is not always limited to this size and may be, for example, larger than the size of the circuit board 303. The lower frame 304 covers the lower surface of the circuit board 303. The lower frame 304 also has a size corresponding to the circuit board 303 and covers the entire lower surface of the circuit board 303. The frames 302 and 304 are plates made of metal.

The frames 302 and 304 are attached to the circuit board 3. In this example, as illustrated in FIG. 21, the upper frame 302, the lower frame 304, and the circuit board 303 respectively include fixed holes 302a, 304a, and 303a in positions corresponding thereto. The frames 302 and 304 and the circuit board 303 are fixed to the housing of the electronic apparatus by screws fit in the fixed holes 302a, 304a, and 303a. Consequently, the frames 302 and 304 are respectively attached to the upper surface and the lower surface of the circuit board 303. The fixed holes 302a, 304a, and 303a are formed in an outer peripheral portion 302b of the upper frame 302, an outer peripheral portion 304b of the lower frame 304, and the outer peripheral portion of the circuit board 303.

Like the electronic apparatus explained with reference to FIGS. 1 to 19, various devices and parts incorporated in the electronic apparatus such as the cooling unit 310 and a power supply unit (not shown in the figures) are arranged on the upper side of the upper frame 302. The devices and the parts are attached to the upper frame 302. As illustrated in FIG. 20, the electronic apparatus in this example includes the hard disc drive H. The hard disc drive H is arranged on the upper frame 302 and fixed to the upper frame 302. A connector 333 is mounted on the circuit board 303. The hard disc drive H is connected to the circuit board 303 through the connector 333. The cooling unit 310 includes the cooling fan 320 (see FIG. 21). As explained in detail below, the cooling fan 320 includes structure for suppressing vibration due to rotation driving of the cooling fan 320 from being transmitted to the hard disc drive H through the upper frame 302.

As illustrated in FIG. 24, the outer peripheral portion 302b of the upper frame 302 is in contact with the outer peripheral portion of the circuit board 303. A portion of the upper frame 302b on the inner side of the outer peripheral portion 302 is located away from the upper surface of the circuit board 303. A gap G is formed between the portion and the upper surface. As illustrated in FIG. 20, a plurality of vent holes 302g are formed in the upper frame 302. The vent holes 302g are formed in a portion on the inner side of the outer peripheral portion 302b and located on the outer side of a cover 319 of the cooling unit 310 explained below. When the cooling fan 320 is driven to rotate, the air is sucked into between the circuit board 303 and the upper frame 302 through the vent holes 302g. The air is taken into the inner side of the cover 319 from vent holes 302c and 302d (see FIG. 24) formed in the upper frame 302 and located below the cooling fan 320, and is sent to heat sinks 311 and 312.

As illustrated in FIG. 21, the cooling fan 320 is arranged such that a rotation axis C1 thereof extends along the thickness direction of the circuit board 303. In other words, the rotation axis C1 is perpendicular to the circuit board 303. The cooling fan 320 is located on the opposite side of the circuit board 303 across the upper frame 302 and arranged on the upper frame 302. The cooling fan 320 in this example is arranged on the upper side of the upper frame 302.

As illustrated in FIGS. 22 and 24, the cooling fan 320 includes a rotor 321 and a plurality of fins 324 extending from the outer circumferential surface of the rotor 321 in the radial direction. The cooling fan 320 includes a stator 322. The rotor 321 rotates around the stator 322. The rotor 321 in this example has a cylindrical shape opened downward. The stator 322 is fit in the inner side of the rotor 321 from the lower side of the rotor 321.

As illustrated in FIGS. 22 and 24, the cooling fan 320 includes, in the bottom portion thereof, the base plate 323 supporting the stator 322. The stator 322 in this example includes a projection 322a in the center portion thereof. The projection 322a is attached to the base plate 323 (see FIG. 24). The base plate 323 in this example includes a disc-like center plate portion 323a in the center portion thereof. The center plate portion 323a is located below the rotor 321 and the stator 322. The outer diameter of the center plate portion 323a generally corresponds to the outer diameter of the rotor 321 and the stator 322. The projection 322a of the stator 322 is attached to the center plate portion 323a.

The base plate 323 includes a substantially ring-shaped outer plate portion 323b that surrounds the outer circumference of the center plate portion 323a. The outer plate portion 323b is a portion corresponding to the fan plate portion 44 of the cooling fan 40 explained above. The inner diameter of the outer plate portion 323b is larger than the outer diameter of the center plate portion 323a. Openings 323c are formed between the inner circumferential edge of the outer plate portion 323b and the outer circumferential edge of the center plate portion 323a (see FIG. 22). The openings 323c are located below the fins 324 and function as vents. When the rotor 321 rotates, the air is sucked through the openings 323c and sent outward in the radial direction of the cooling fan 320. The inner diameter of the outer plate portion 323b in this example is slightly smaller than the outer diameter of the cooling fan 320 (the diameter of a circle that connects the ends of the plurality of fins 324). Therefore, the inner circumferential edge of the outer plate portion 323b are located closer to the rotation axis C1 of the cooling fan 320 than the end edge of the fins 324 is.

The base plate 323 includes an arm portion 323d extending between the outer circumferential edge of the center plate portion 323a and the inner circumferential edge of the outer plate portion 323b. The base plate 323 in this example includes a plurality of (in this example, four) arm portions 323d, which are arranged spaced apart from one another in the circumferential direction. The arm portions 323d extend from the outer circumferential edge of the center plate portion 323a in the radial direction of the cooling fan 320.

In one of the base plate 323 and the upper frame 302, a projection is formed that projects toward the other of the base plate 323 and the upper frame 302 and secures a clearance between the base plate 323 and the upper frame 302. In this example, as illustrated in FIGS. 22 and 24, a cylindrical fixed projection 323e is formed in the center plate portion 323a of the base plate 323. The fixed projection 323e projects from the center plate portion 323a toward the upper frame 302. The fixed projection 323e in this example is attached to the upper frame 302. In this example, the fixed projection 323e is attached to the upper frame 302 by a screw 341 fit in from the lower side of the upper frame 302. A clearance is secured between the center plate portion 323a and the upper frame 302 by the fixed projection 323e. As a result, it is possible to suppress vibration of the cooling fan 320 from being transmitted to the upper frame 302. As illustrated in FIG. 22, the fixed projection 323e is located on the rotation axis C1 of the rotor 321. Consequently, it is possible to stably fix the cooling fan 320 to the upper frame 302 using the fixed projection 323e.

As illustrated in FIGS. 23 and 24, the upper frame 302 includes a plurality of vent holes 302c and 302d in a position corresponding to the cooling fan 320. In other words, the plurality of vent holes 302c and 302d are located below the cooling fan 320. As explained above, the gap G is provided between the upper frame 302 and the circuit board 303. When the cooling fan 320 is driven to rotate, the air is sucked into the gap G (see FIG. 24) between the upper frame 302 and the circuit board 303 from the through holes 302g (see FIG. 20) formed in the upper frame 302. The air is sucked in toward the cooling fan 320 through the through holes 302c and 302d and blown out in the radial direction by the cooling fan 320. In other words, an air flow F1 illustrated in FIG. 24 is formed.

As explained above, the clearance is formed between the center plate 323a and the upper frame 302 by the fixed projection 323e. As illustrated in FIG. 23, a part of the plurality of vent holes 302c and 302d are located below the center plate 323a. Therefore, an air flow F2 passing through the clearance between the center plate portion 323a and the upper frame 302 can be formed by the air sucked from the part of the vent holes 302c and 302d (see FIG. 24). Consequently, it is possible to improve air intake efficiency by the cooling fan 320.

As illustrated in FIG. 24, the outer plate portion 323b is in contact with the upper frame 302. As illustrated in FIG. 22, a plurality of recesses 323f are formed in the outer plate portion 323b. Consequently, a contact area between the outer plate portion 323b and the upper frame 302 decreases. It is possible to suppress the vibration of the cooling fan 320 from being transmitted to the upper frame 32. In this example, the plurality of recesses 323b are formed spaced apart from one another in the circumferential direction of the cooling fan 320 and formed to surround the rotation axis C1 as a whole. The recesses 323f have width W1 in the circumferential direction larger than the width in the radial direction of the cooling fan 320 (see FIG. 22). A contact portion between the outer plate portion 323b and the upper frame 302 is provided without being cut in the circumferential direction of the cooling fan 320. In other words, the recesses 323f are formed such that the contact portion between the outer plate portion 323b and the upper frame 302 is continuously provided over the entire circumference of the cooling fan 320. The outer plate portion 323b in this example includes an extending portion 323n that extends further outward than a portion on the inner side of the outer circumferential portion 302b in the upper frame 302 (i.e., a portion located away from the surface of the circuit board 303) (see FIG. 23). In the extending portion 323n, as illustrated in FIG. 22, two recesses 323f arranged in the radial direction are formed.

As explained above, the inner diameter of the outer plate portion 323b is slightly smaller than the outer diameter of the cooling fan 320 (the diameter of the circle that connects the ends of the fins 324). Therefore, as illustrated in FIG. 24, the inner circumferential edge of the outer plate portion 323b is located slightly closer to the rotation axis C1 than the ends of the fins 324 is. The outer plate portion 323b is in contact with the upper frame 302. Therefore, the air flow F1 passing through the through holes 302c and 302d formed in the upper frame 302 can be smoothed. Specifically, the air sucked in toward the cooling fan 320 from the through holes 302c and 302d is blown out in the radial direction from the cooling fan 320 without leaking between the upper frame 302 and the outer plate portion 323b. As illustrated in FIG. 22, the edges of the recesses 323f formed in the outer plate portion 323b are apart from the inner circumferential edge of the outer plate portion 323b (see FIG. 22). The inner circumferential edge of the outer plate portion 323b is in contact with the upper frame 302. Therefore, it is possible to suppress the air from entering between the upper frame 302 and the outer plate portion 323b. It is possible to further smooth the air flow F1.

As illustrated in FIG. 23, the vent holes 302d larger than the vent holes 302c are formed in the upper frame 302. A part of the vent holes 302d are located below the outer plate portion 323b. The other part of the vent holes 302d are located below the openings 323c between the outer plate portion 323b and the center plate portion 323a. As illustrated in FIG. 22, a recess 323g is formed in the outer plate portion 323b. The recess 323g is formed in a position corresponding to the vent hole 302d of the upper frame 302. Unlike the recesses 323f, the recess 323g is connected to the inner circumferential edge of the outer plate portion 323b. Therefore, it is possible to form an air flow flowing from the vent holes 302d to the cooling fan 320 through the recess 323g. It is possible to further improve the air intake efficiency of the cooling unit 310.

As illustrated in FIGS. 22 and 24, portions 323h of the arm portions 323d closer to the outer plate portion 323b are formed thick compared with portions 323i of the arm portions 323d closer to the center plate portion 323a. The portions 323h are in contact with the upper frame 2. In other words, the thickness of the arm portions 323d is gradually increased in the radial direction from the center plate portion 323a to the outer plate portion 323b, whereby the clearance formed by the fixed projection 323e is eliminated. Recesses 323j are formed in the portions 323h that are in contact with the upper frame 302. Consequently, it is possible to further reduce the contact area between the base plate 323 and the upper frame 302. As a result, it is possible to suppress the vibration of the cooling fan 320 from being transmitted to the upper frame 302.

As illustrated in FIGS. 22 and 24, protrusions 323k are formed in the outer plate portion 323b of the base plate 323. The outer plate portion 323b in this example includes two protrusions 323k located on the opposite sides each other across the fixed projection 323e. The upper frame 302 includes holes in positions corresponding to the protrusions 323k. The protrusions 323k are fit in the holes formed in the upper frame 302. The position of the cooling fan 320 in the upper frame 302 is defined by the protrusions 323k.

As illustrated in FIG. 23, a plurality of fixed holes 323m are formed in the outer plate portion 323b as in the fan plate portion 44. The fixed holes 323m are attached to the upper frame 302 by, for example, screws. As explained above, the cooling fan 320 includes the fixed projection 323e on the rotation axis C1 thereof. Therefore, the number of the fixed holes 323m formed in the outer plate portion 323b can be reduced. Similarly to the fan plate portion 44, the outer plate portion 323*b* in this example includes the spreading portion 323*n* in a left side portion thereof. The lower edge of a curved wall portion 319*c* of the cover 319 is connected to the spreading portion 323*n*. The spreading portion 323*n* configures a bottom wall of an air flow path formed on the inner side of the curved wall portion 319*c*. The fixed holes 323*m* are formed in the spreading portion 323*n*. An fixed hole 323*p* is formed in the forefront portion of the spreading portion 323*n*. The lower edge of the curved wall portion 319*c* of the cover 319 is attached to the fixed hole 323*p*.

As illustrated in FIG. 21, the cooling unit 310 includes a first heat sink 311 and a second heat sink 312. The heat sinks 311 and 312 are located in the radial direction of the cooling fan 320 from cooling fan 320. In this example, the first heat sink 311 is located on the rear side of the cooling fan 320. The first heat sink 311 is used for cooling the integrated circuit 331*a*. The first heat sink 311 in this example is connected to the integrated circuit 331*a* through a heat pipe (not shown in the figure) attached to the bottom surface of the first heat sink 311. The second heat sink 312 is adjacent to the first heat sink 311. The second heat sink 312 in this example is arranged on the right of the first heat sink 311 and located behind and in the right direction of the cooling fan 320. The second heat sink 312 is used for cooling the integrated circuit 332. The second heat sink 312 includes a heat receiving block 312*a* in the bottom portion thereof. The heat receiving block 312*a* is arranged on the integrated circuit 332.

The cover 319 covers the cooling fan 320 and the heat sinks 311 and 312. The structure of the cover 319 is the same as the cover 50 explained above. Specifically, as illustrated in FIG. 20, the cover 319 includes an upper wall portion 319*a* located on the upper side of the heat sinks 311 and 312 and the cooling fan 320 and a peripheral wall portion 319*b* that surrounds the cooling fan 320 and the heat sinks 311 and 312. The peripheral wall portion 319*b* descends from the edge of the upper wall portion 319*a* toward the upper frame 302. The lower edge of the peripheral wall portion 319*b* is attached to the upper frame 302.

The peripheral wall portion 319*b* is a portion corresponding to the side wall portion 51 explained above. Therefore, similarly to the side wall portion 51, the peripheral wall portion 319*b* includes, in the front portion thereof, a curved wall portion 319*c* curved along the outer circumference of the cooling fan 320. An air flow path extending along the outer circumference of the cooling fan 320 is formed between the curved wall portion 319*c* and the cooling fan 320. As illustrated in FIG. 21, the peripheral wall portion 319*b* includes side wall portions 319*d* that continues to one end of the curved wall portion 319*c* and a side wall portion 319*e* that continues to the other end of the curved wall portion 319*c*. The first heat sink 311 and the second heat sink 312 are located between the side wall portions 319*d* and 319*e*.

The upper wall portion 319*a* includes an opening 319*f* located on the upper side of the cooling fan 320. The opening 319*f* has an inner diameter corresponding to the outer diameter of the cooling fan 320. In this example, the inner diameter of the opening 319*f* is slightly smaller than the outer diameter of the cooling fan 320. The inner circumferential edge of the opening 319*f* is located closer to the rotation axis C1 than the ends of the fins 324 of the cooling fan 320 is. When the cooling fan 320 rotates, the air is taken into the cover 319 through the opening 319*f* and the vent holes 302*c* and 302*d* formed in the upper frame 302. The air is pushed out in the radial direction of the cooling fan 320. The air flowing out from the cooling fan 320 toward the curved wall portion 319*c* is sent to the second heat sink 312 through an air flow path formed on the inner side of the curved wall portion 319*c* along the outer circumference of the cooling fan 320. The air flowing out from the cooling fan 320 to the rear side, more specifically, the air flowing out from the cooling fan 320 to between the side wall portions 319*d* and 319*e* is directly sent to the heat sinks 311 and 312.

The electronic apparatus explained above includes the circuit board 303, the upper frame 302 configured to cover the circuit board 303 and attached to the circuit board 303, and the cooling fan 320 arranged on the upper frame 302, including the bottom portion (the base plate 323) attached to the upper frame 302, and having the rotation axis C1 extending along the thickness direction of the circuit board 303. On the base plate 303, the fixed projection 323*e* projects toward the upper frame 302 to secure the clearance between the base plate 323 and the upper frame 302. Therefore, it is possible to suppress the vibration of the cooling fan 320 from being transmitted through the upper frame 302 to the devices such as the hard disc drive H supported by the upper frame 302.

The fixed projection 323*e* is attached to the upper frame 302. Consequently, it is possible to simplify the structure of the cooling fan 320 compared with structure in which an exclusive projection for securing a clearance between the base plate 323 and the upper frame 302 is provided.

The fixed projection 323*e* is located on the rotation axis C1 of the cooling fan 320. Consequently, it is possible to reduce the number of attachment places of the cooling fan 320 to the upper frame 302.

The cooling fan 320 includes, in the bottom portion thereof, the center plate portion 323*a* and the outer plate portion 323*b* that surrounds the outer circumference of the center plate portion 323*a*. The fixed projection 323*e* is formed on the center plate portion 323*a*. The outer plate portion 323*b* is in contact with the upper frame 302. Consequently, it is possible to smooth the air flow F1.

The lower surface of the outer plate portion 323*b* is in contact with the upper frame 302. The recesses 323*f* and 323*g* are formed on the lower surface of the outer plate portion 323*b*. Consequently, it is possible to reduce the contact area between the outer plate portion 323*b* and the upper frame 302. Thus, it is possible to suppress the vibration of the cooling fan 320 from being transmitted through the upper frame 302 to the devices such as the hard disc drive H fixed to the upper frame 302.

Various changes may be made concerning the electronic apparatus explained above.

For example, a projection projecting toward the base plate 323 of the cooling fan 320 may be formed on the upper frame 302. And thus, a clearance may be formed between the upper frame 302 and the base plate 323 by the projection.

The fixed projection 323*e* is not always provided on the rotation axis C1 of the cooling fan 320. In this case, a plurality of fixed projections 323*e* may be provided in the center plate portion 323*a* of the base plate 323.

A projection for securing a clearance between the outer plate portion 323*b* and the upper frame 302 may be formed in the outer plate portion 323*b* as well.

A positional relation between the cooling fan 320 and the heat sinks 311 and 312 is not limited to the positional relation explained above. Various changes may be made concerning the positional relation.

The projection for securing the clearance between the center plate portion 323*a* of the base plate 323 and the upper frame 302 is not always formed in a columnar shape. For example, a ring-shaped projection may be formed in the outer circumferential portion of the center plate portion 323*a*. The clearance may be secured between the center plate portion 323*a* and the upper frame 302 by the projection.

The invention claimed is:

1. An electronic apparatus comprising:
a circuit board;
a frame formed by a plate having a size corresponding to the circuit board or a size larger than the size corresponding the circuit board and covering the circuit board, the circuit board being fixed to the frame;
a cooling fan located on an opposite side of the circuit board across the frame and attached to the frame, the cooling fan configured to rotate around a column-like stator that is directly attached to the plate of the frame with a rotation axis that overlaps a point at which the cooling fan is attached to the frame;
an air flow path on the frame through which air discharged from the cooling fan passes; a cover having a shape for covering the air flow path and define a wall of the air flow path together with the frame; and
a heat sink disposed inside the cover,
wherein the rotation axis is perpendicular to the circuit board,
wherein the air flow path is formed in an outer circumference of the cooling fan,
wherein the cooling fan includes a plurality of fins arranged in a circumferential direction around the column-like stator,
wherein the column-like stator includes a disk-like bottom portion having a fixed hole for attaching the column-like stator to the frame, and the
disk-like portion is located on an interior of the plurality of fins near the rotation axis.

2. The electronic apparatus according to claim 1, wherein the fixed hole is located on the rotation axis.

3. The electronic apparatus according to claim 1, wherein the frame includes, in a part thereof, a plate portion that configures a bottom surface of the air flow path,
the cooling fan includes a fan plate portion that increases in width in an airflow direction away from an outer circumference of fins of the cooling fan, and
the fan plate portion is located on an outer side of an outer edge of the plate portion of the frame and configures the bottom surface of the air flow path together with the plate portion of the frame.

4. The electronic apparatus according to claim 1, wherein a heat sink including a plurality of fins located in the air flow path is arranged on the inner side of the cover, and the frame has a shape that avoids the plurality of fins.

5. The electronic apparatus according to claim 4, wherein a hole is formed in the frame, and
the heat sink is located inside the hole.

6. The electronic apparatus according to claim 5, wherein the frame defines the position of the heat sink.

7. The electronic apparatus according to claim 1, further comprising:
a housing which houses the cooling fan; and
a ventilation opening opened toward an outside of the housing, wherein
the air flow path continues from the cooling fan to the ventilation opening,
an electronic part is mounted on the circuit board, and
a vent hole located in the air flow path and opened toward the electronic part is formed in the frame.

8. The electronic apparatus according to claim 7, wherein the vent hole overlaps the electronic part in a direction in which the frame and the circuit board face each other.

9. The electronic apparatus according to claim 8, wherein the vent hole is located right above the electronic part.

10. The electronic apparatus according to claim 7, wherein the vent hole is formed in a position avoiding a region on a downstream of the heat sink.

11. The electronic apparatus according to claim 10, wherein a position of the vent hole deviates from the heat sink in a direction orthogonal to an air flow direction in the air flow path.

12. The electronic apparatus according to claim 7, wherein
the cooling fan is arranged such that a rotation axis thereof is perpendicular to the circuit board,
the air flow path includes a first air flow path formed in an outer circumference of the cooling fan and a second air flow path following the first air flow path, where the second air flow path has a flow path cross-sectional area larger than a flow path cross-sectional area of the first air flow path, and
the heat sink and the vent hole are located in the second air flow path.

13. The electronic apparatus according to claim 7, wherein a plurality of vent holes each defined as the vent hole are formed in the frame.

14. The electronic apparatus according to claim 13, wherein positions of the plurality of vent holes deviate from one another in a direction orthogonal to an air flow direction in the air flow path.

15. An electronic apparatus comprising:
a circuit board;
a frame formed by a plate and covering the circuit board and attached to the circuit board;
a cooling fan arranged on the frame, the cooling fan including a column-like stator arranged at a center of the cooling fan,
wherein the column-like stator includes a disk-like bottom portion having a fixed hole for attaching the column-like stator directly to the plate of the frame, and
the disk-like portion is located on an interior of the plurality of fins near a rotation axis of the cooling fan,
wherein the rotation axis of the cooling fan is along a thickness direction of the circuit board, the rotation axis overlapping the fixed hole point at which the column-like stator is attached to the frame; and
a projection projecting from the disk-like portion toward a top surface of the frame to secure a clearance between cooling fan and the frame.

16. The electronic apparatus according to claim 15, wherein the projection on the rotation axis of the cooling fan.

17. The electronic apparatus according to claim 15, wherein
the cooling fan includes, in the bottom portion thereof, a center plate portion and an outer plate portion that surrounds an outer circumference of the center plate portion,
the projection is formed in the center plate portion, and
the outer plate portion is in contact with the frame.

* * * * *